(12) United States Patent
Gielis

(10) Patent No.: US 8,775,134 B2
(45) Date of Patent: *Jul. 8, 2014

(54) METHOD AND APPARATUS FOR SYNTHESIZING AND ANALYZING PATTERNS

(76) Inventor: Johan Leo Alfons Gielis, Antwerp (BE)

( * ) Notice: Subject to any disclaimer, the term of this patent is extended or adjusted under 35 U.S.C. 154(b) by 0 days.

This patent is subject to a terminal disclaimer.

(21) Appl. No.: 12/582,528

(22) Filed: Oct. 20, 2009

(65) Prior Publication Data

US 2010/0292968 A1 Nov. 18, 2010

Related U.S. Application Data

(62) Division of application No. 09/566,986, filed on May 9, 2000, now Pat. No. 7,620,527.

(60) Provisional application No. 60/133,279, filed on May 10, 1999.

(51) Int. Cl.
*G06F 17/10* (2006.01)

(52) U.S. Cl.
USPC .................................. 703/2; 703/1

(58) Field of Classification Search
USPC ............. 703/2; 415/208.3; 700/29; 708/270, 708/276; 345/13, 440, 441; 704/220
See application file for complete search history.

(56) References Cited

U.S. PATENT DOCUMENTS

| | | | |
|---|---|---|---|
| 3,720,816 A | 3/1973 | Keller et al. | |
| 4,086,723 A * | 5/1978 | Strawick | 446/47 |
| 4,712,701 A * | 12/1987 | Durkan, Jr. | 220/649 |
| 4,829,295 A | 5/1989 | Hiroyuki | |
| 4,844,144 A | 7/1989 | Murphy et al. | |
| 4,864,520 A | 9/1989 | Setoguchi et al. | |
| 4,885,790 A | 12/1989 | McAulay et al. | |
| 4,894,038 A * | 1/1990 | Giese | 446/46 |
| 4,937,868 A | 6/1990 | Taguchi | |
| 4,942,001 A | 7/1990 | Murphy et al. | |
| 5,054,072 A | 10/1991 | McAulay et al. | |
| 5,059,021 A | 10/1991 | Spence et al. | |
| 5,109,862 A | 5/1992 | Kelen et al. | |
| 5,123,734 A | 6/1992 | Spence et al. | |
| 5,130,064 A | 7/1992 | Smalley et al. | |
| 5,143,663 A | 9/1992 | Leyden et al. | |
| 5,159,512 A | 10/1992 | Evans et al. | |
| 5,161,201 A | 11/1992 | Kaga et al. | |
| 5,167,882 A | 12/1992 | Jacobine et al. | |
| 5,182,055 A | 1/1993 | Allison et al. | |
| 5,182,056 A | 1/1993 | Spence et al. | |

(Continued)

OTHER PUBLICATIONS

Hill, "Gentle Diversions", IEEE Communications Magazine, Sep. 1979, pp. 34-40.*

(Continued)

*Primary Examiner* — Omar Fernandez Rivas
*Assistant Examiner* — Herng-Der Day
(74) *Attorney, Agent, or Firm* — Westerman, Hattori, Daniels & Adrian, LLP

(57) ABSTRACT

Patterns (e.g., such as images, waveforms such as sounds, electromagnetic waves, or other signals, etc.) are synthesized, modulated and/or analyzed through the use of a computer programmed with a novel mathematical formula. The formula acts as a linear operator and can be used to create a variety of shapes, waveforms, and other representations. The formula greatly enhances ability in computer operations and provides a great savings in computer memory and a substantial increase in computing power.

20 Claims, 48 Drawing Sheets

(56) References Cited

U.S. PATENT DOCUMENTS

| | | |
|---|---|---|
| 5,182,715 A | 1/1993 | Vorgitch et al. |
| 5,184,307 A | 2/1993 | Hull et al. |
| 5,217,653 A | 6/1993 | Mashinsky et al. |
| 5,236,637 A | 8/1993 | Hull |
| 5,247,180 A | 9/1993 | Mitcham et al. |
| 5,256,340 A | 10/1993 | Allison et al. |
| 5,296,335 A | 3/1994 | Thomas et al. |
| 5,398,193 A | 3/1995 | de Angelis |
| 5,416,588 A | 5/1995 | Ducharme et al. |
| 5,425,373 A | 6/1995 | Causey, III |
| 5,458,825 A | 10/1995 | Grolman et al. |
| 5,491,643 A | 2/1996 | Batchelder |
| 5,506,947 A | 4/1996 | Taubin |
| 5,546,476 A | 8/1996 | Mitaka et al. |
| 5,547,305 A | 8/1996 | Treche |
| 5,559,941 A | 9/1996 | Brechner |
| 5,578,227 A | 11/1996 | Rabinovich |
| 5,587,912 A | 12/1996 | Andersson et al. |
| 5,587,913 A | 12/1996 | Abrams et al. |
| 5,609,812 A | 3/1997 | Childers et al. |
| 5,609,813 A | 3/1997 | Allison et al. |
| 5,616,293 A | 4/1997 | Ashtiani-Zarandi et al. |
| 5,622,577 A | 4/1997 | O'Connor |
| 5,639,413 A | 6/1997 | Crivello |
| 5,657,126 A | 8/1997 | Ducharme et al. |
| 5,663,883 A | 9/1997 | Thomas et al. |
| 5,666,441 A | 9/1997 | Rao et al. |
| 5,711,911 A | 1/1998 | Hull |
| 5,728,345 A | 3/1998 | Hlavaty et al. |
| 5,749,073 A | 5/1998 | Slaney |
| 5,760,778 A | 6/1998 | Friedman |
| 5,768,438 A | 6/1998 | Etoh |
| 5,769,081 A | 6/1998 | Alfano et al. |
| 5,796,620 A | 8/1998 | Laskowski et al. |
| 5,796,986 A | 8/1998 | Fuller |
| 5,818,718 A | 10/1998 | Thomas et al. |
| 5,846,370 A | 12/1998 | O'Connor |
| 5,880,962 A | 3/1999 | Andersson et al. |
| 5,926,568 A | 7/1999 | Chaney et al. |
| 5,952,993 A | 9/1999 | Matsuda et al. |
| 5,966,469 A | 10/1999 | Moon et al. |
| 5,969,725 A | 10/1999 | Fujiki et al. |
| 5,974,169 A | 10/1999 | Bachelder |
| 5,991,461 A | 11/1999 | Schmucker et al. |
| 6,023,530 A | 2/2000 | Wilson |
| 6,026,186 A | 2/2000 | Fan |
| 6,029,090 A * | 2/2000 | Herbst .......................... 607/66 |
| 6,108,011 A | 8/2000 | Fowler |
| 7,620,527 B1 * | 11/2009 | Gielis .............................. 703/2 |

OTHER PUBLICATIONS

Rosin et al., "Curve Segmentation and Representation by Superellipses", IEE Proceedings on Vision, Image and Signal Processing, Oct. 1995, pp. 280-288.*

Bourke, "Superellipse and Superellipsoid", http://local.wasp.uwa.edu.au/—pbourke/geometry/superellipse/, Jan. 1990.*

Bourke, "The Tours and Supertoroid", http://astronomy.swin.edu.au/~pbourke/surfaces/tours/, May 1990.*

Bourke, Paul; "Superellipse and Superllipsoid"; http://astronomy.swin.edu.au/~pbourke/surfaces/superellipse/. Jan. 1990.

Bourke, Paul; "The Torus and Supertoroid", http://astronomy.swin.edu.au/~pbourke/surfaces/tours/, May 1990.

Hill, Sandy; "Gentle Diversions", IEEE Communications Magazine, Sep. 1979, pp. 34-40.

Kolundzija, Branko M. et al.; "Spiral Super-Quadric Generatrix and Bodies of Two Generatrices in Automated Parameterization of 3-D Geometries."; IEEE Transaction on Microwave Theory and Techniques, vol. 45, No. 6, Jun. 1997 XP-000951693.

Perez-Munuzuri, V. et al.; "A geometrical-kinematical approach to spiral wave formation: super-spiral waves."; Physica D, vol. 64, 1993, pp. 420-430 XP-000952064.

Rosin, P. L. et al.; "Curve Segmentation and Representation by Superellipses", IEEE Proceeding on Vision, Image and Signal Processing, vol. 142, No. 5, Oct. 1995, pp. 280-288.

* cited by examiner n = 0.1 n = 0.2 n = 0.4 n = 0.6 n = 0.8 n = 1 n = 1.2 n = 1.4 n = 1.6 n = 1.8 n = 2 n = 3 n = 5 n = 5 n = 8 n = 50 n = 2.1 n = 2.2 n = 2.4 n = 2.6 m = 0
n = 1 m = 1
n = 1 m = 2
n = 1 m = 3
n = 1 m = 4
n = 1 m = 5
n = 1 m = 6
n = 1 m = 7
n = 1

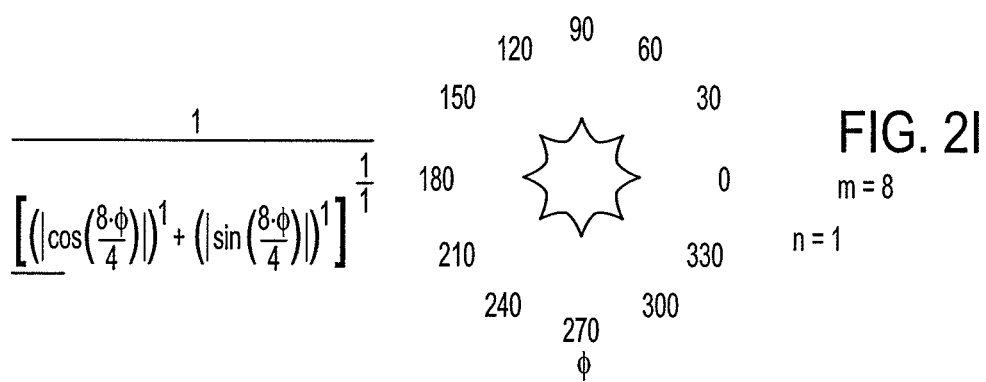

m = 3 m = 4 m = 5 m = 6

$$\frac{1}{[(|\cos(1.75 \cdot \phi)|)^{320} + (|\sin(1.75 \cdot \phi)|)^{320}]^{\frac{1}{1000}}}$$

m = 7

$$\frac{1}{[(|\cos(2 \cdot \phi)|)^{250} + (|\sin(2 \cdot \phi)|)^{250}]^{\frac{1}{1000}}}$$

m = 8

$$\frac{1}{\left[\left(\left|\cos\left(\frac{0\cdot\phi}{4}\right)\right|\right)^{0.5} + \left(\left|\sin\left(\frac{0\cdot\phi}{4}\right)\right|\right)^{0.5}\right]^{\frac{1}{0.5}}}$$

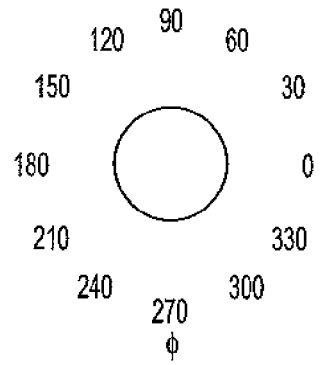

FIG. 4A m = 0
n = .5

$$\frac{1}{\left[\left(\left|\cos\left(\frac{1\cdot\phi}{4}\right)\right|\right)^{0.5} + \left(\left|\sin\left(\frac{1\cdot\phi}{4}\right)\right|\right)^{0.5}\right]^{\frac{1}{0.5}}}$$

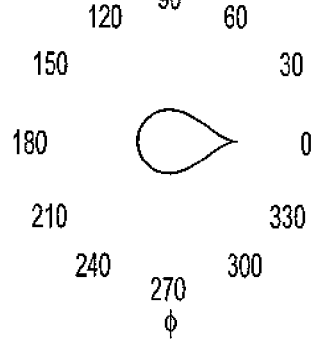

FIG. 4B m = 1
n = .5

$$\frac{1}{\left[\left(\left|\cos\left(\frac{2\cdot\phi}{4}\right)\right|\right)^{0.5} + \left(\left|\sin\left(\frac{2\cdot\phi}{4}\right)\right|\right)^{0.5}\right]^{\frac{1}{0.5}}}$$

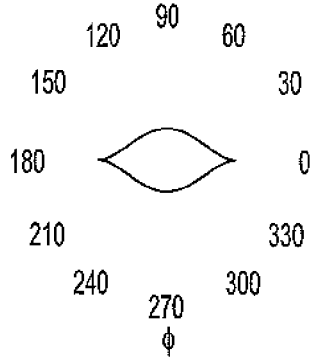

FIG. 4C m = 2
n = .5

$$\frac{1}{\left[\left(\left|\cos\left(\frac{3\cdot\phi}{4}\right)\right|\right)^{0.5} + \left(\left|\sin\left(\frac{3\cdot\phi}{4}\right)\right|\right)^{0.5}\right]^{\frac{1}{0.5}}}$$

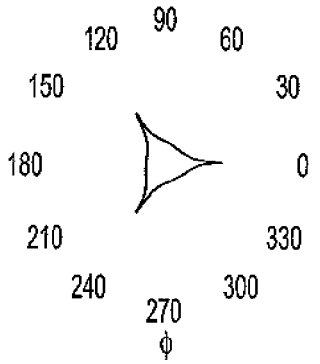

FIG. 4D m = 3
n = .5 m = 4
n = .5 m = 5
n = .5 m = 6
n = .5 m = 7
n = .5 m = 8
n = .5 m = 0 m = 1 m = 2 m = 3 m = 4 m = 5 m = 6 m = 7 m = 8 m = 0

ALL n VALUES DIFFERENT m = 1

ALL n VALUES DIFFERENT m = 2

ALL n VALUES DIFFERENT m = 3

ALL n VALUES DIFFERENT

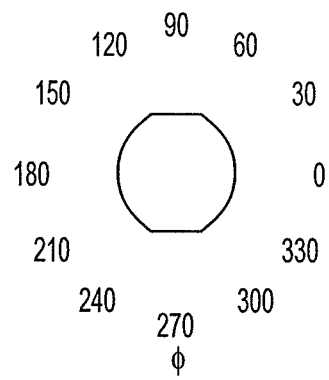

$$\frac{1}{\left[\left(\left|\cos\left(\frac{4\cdot\phi}{4}\right)\right|\right)^{8}+\left(\left|\sin\left(\frac{4\cdot\phi}{4}\right)\right|\right)^{100}\right]^{\frac{1}{80}}}$$

FIG. 6E
m = 4
ALL n VALUES DIFFERENT

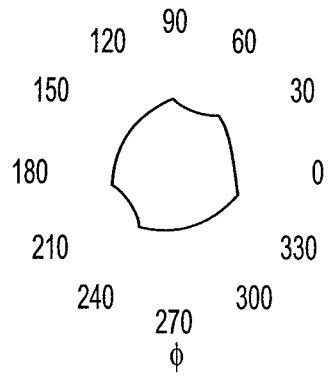

$$\frac{1}{\left[\left(\left|\cos\left(\frac{5\cdot\phi}{4}\right)\right|\right)^{15}+\left(\left|\sin\left(\frac{5\cdot\phi}{4}\right)\right|\right)^{100}\right]^{\frac{1}{80}}}$$

FIG. 6F
m = 5
ALL n VALUES DIFFERENT

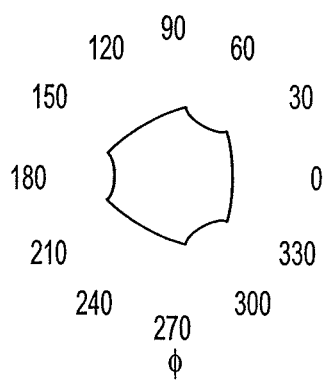

$$\frac{1}{\left[\left(\left|\cos\left(\frac{6\cdot\phi}{4}\right)\right|\right)^{15}+\left(\left|\sin\left(\frac{6\cdot\phi}{4}\right)\right|\right)^{100}\right]^{\frac{1}{80}}}$$

FIG. 6G
m = 6
ALL n VALUES DIFFERENT

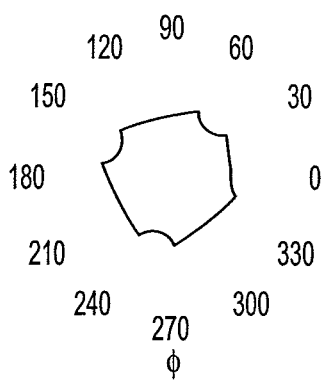

$$\frac{1}{\left[\left(\left|\cos\left(\frac{7\cdot\phi}{4}\right)\right|\right)^{15}+\left(\left|\sin\left(\frac{7\cdot\phi}{4}\right)\right|\right)^{100}\right]^{\frac{1}{80}}}$$

FIG. 6H
m = 7
ALL n VALUES DIFFERENT m = 8
ALL n VALUES DIFFERENT $$\frac{1}{\left[(2\cdot|\cos(0.5\cdot\phi)|)^{602}+(|\sin(0.5\cdot\phi)|)^{602}\right]^{\frac{1}{313}}}$$

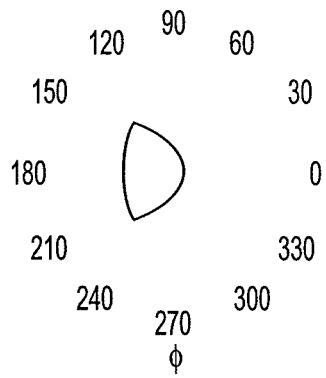

FIG. 7A m = 2 a AND b ARE DIFFERENT $$\frac{1}{\left[(2\cdot|\cos(0.75\cdot\phi)|)^{602}+(|\sin(0.75\cdot\phi)|)^{602}\right]^{\frac{1}{313}}}$$

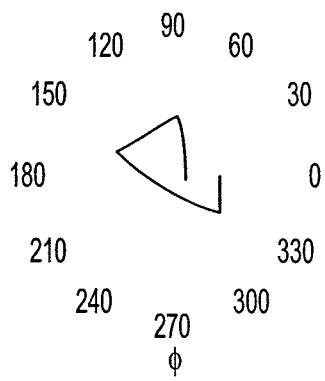

FIG. 7B m = 3 a AND b ARE DIFFERENT $$\frac{1}{\left[(|\cos(1\cdot\phi)\cdot 2|)^{100}+(|\sin(\phi)|)^{100}\right]^{\frac{1}{100}}}$$

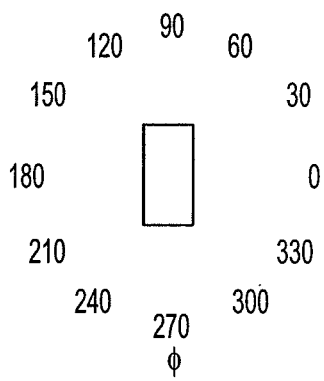

FIG. 7C m = 4 a AND b ARE DIFFERENT $$\frac{1}{\left[(|\cos(1.25\cdot\phi)\cdot 2|)^{620}+(|\sin(1.25\cdot\phi)|)^{620}\right]^{\frac{1}{1000}}}$$

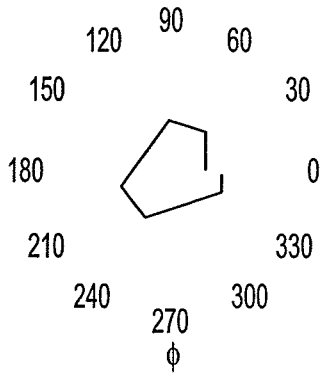

FIG. 7D m = 5 a AND b ARE DIFFERENT $$\frac{1}{\left[ (|\cos(1.5\cdot\phi)|\cdot 2)^{390} + (|\sin(1.5\cdot\phi)|)^{390} \right]^{\frac{1}{1000}}}$$

m = 6 a AND b ARE DIFFERENT $$\frac{1}{\left[ (|\cos(1.75\cdot\phi)\cdot 2|)^{320} + (|\sin(1.75\cdot\phi)|)^{320} \right]^{\frac{1}{1000}}}$$

m = 7 a AND b ARE DIFFERENT $$\frac{1}{\left[ ((|\cos(2\cdot\phi)|)\cdot 2)^{180} + (|\sin(2\cdot\phi)|)^{180} \right]^{\frac{1}{1000}}}$$

m = 8 a AND b ARE DIFFERENT m = 4

SYMMETRY FROM 4 TO 5 m = 4.2

SYMMETRY FROM 4 TO 5 m = 4.4

SYMMETRY FROM 4 TO 5 m = 4.6

SYMMETRY FROM 4 TO 5 m = 4.8

SYMMETRY FROM 4 TO 5 m = 5

SYMMETRY FROM 4 TO 5 m = 4
SYMMETRY FROM 4 TO 3 m = 3.8
SYMMETRY FROM 4 TO 3 m = 3.6
SYMMETRY FROM 4 TO 3 m = 3.4
SYMMETRY FROM 4 TO 3

$$\frac{1}{\left[\left(|\cos(0.80\cdot\phi)|\right)^{100} + \left(|\sin(0.80\cdot\phi)|\right)^{100}\right]^{\frac{1}{100}}}$$

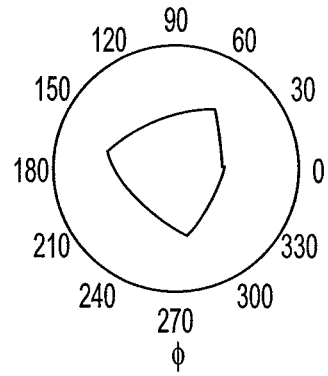

FIG. 9E m = 3.2

SYMMETRY FROM 4 TO 3

$$\frac{1}{\left[\left(|\cos(0.75\cdot\phi)|\right)^{100} + \left(|\sin(0.75\cdot\phi)|\right)^{100}\right]^{\frac{1}{100}}}$$

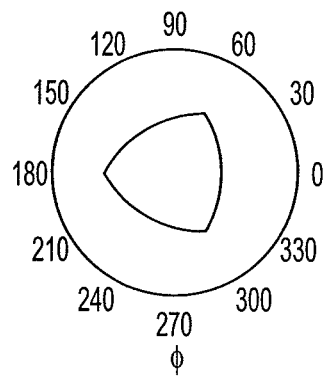

FIG. 9F m = 3

SYMMETRY FROM 4 TO 3

$$\frac{1}{\left[\left(\left|\cos\left(\frac{\pi\cdot\phi}{4}\right)\right|\right)^{100} + \left(\left|\sin\left(\frac{\pi\cdot\phi}{4}\right)\right|\right)^{100}\right]^{\frac{1}{100}}}$$

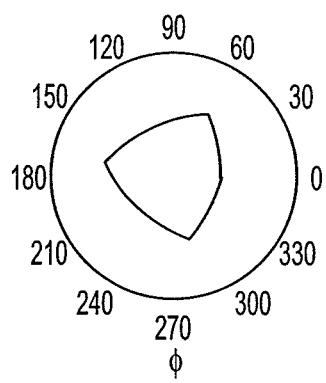

FIG. 9G m = π

SYMMETRY FROM 4 TO 3

$$\frac{1}{\left[(|\cos(\phi\cdot 1.25)|)^7 + (|\sin(\phi\cdot 1.25)|)^7\right]^{\frac{1}{2}}}$$

φ

SEASTAR $$\frac{1}{\left[(|\cos(\phi\cdot 1.25)|)^{13} + (|\sin(\phi\cdot 1.25)|)^{13}\right]^{\frac{1}{2}}}$$

φ

SEASTAR $$\frac{1}{\left[(|\cos(\phi\cdot 1.25)|)^4 + (|\sin(\phi\cdot 1.25)|)^4\right]^{\frac{1}{4}}}$$

φ

STEM OF RASPBERRY $$\frac{1}{\left[(|\cos(\phi\cdot 1.75)|)^6 + (|\sin(\phi\cdot 1.75)|)^6\right]^{\frac{1}{10}}}$$

φ

STEM OF HORSETAILS $$\frac{1}{\left[(|\cos(\phi \cdot 1)|)^{15} + (|\sin(\phi \cdot 1)|)^{15}\right]^{\frac{1}{12}}}$$

STEM OF
SCROPHULARIA
NODOSA $\phi$ $$\frac{1}{\left[(|\cos(\phi \cdot 0.75)|)^{10} + (|\sin(\phi \cdot 0.75)|)^{10}\right]^{\frac{1}{4.5}}}$$

PETIOLE OF
NUPHAR LUTEUM $\phi$ $$\frac{1}{\left[\left(|\cos(\phi \cdot 1.25)|\right)^1 + \left(|\sin(\phi \cdot 1.25)|\right)^1\right]^{\frac{1}{5}}}$$

$$\frac{1}{\left[\left(|\cos(\phi \cdot 1.25)|\right)^1 + \left(|\sin(\phi \cdot 1.25)|\right)^1\right]^{\frac{1}{1}}}$$

$$\frac{1}{\left[\left(|\cos(\phi \cdot 1.25)|\right)^1 + \left(|\sin(\phi \cdot 1.25)|\right)^1\right]^{\frac{1}{1}}}$$

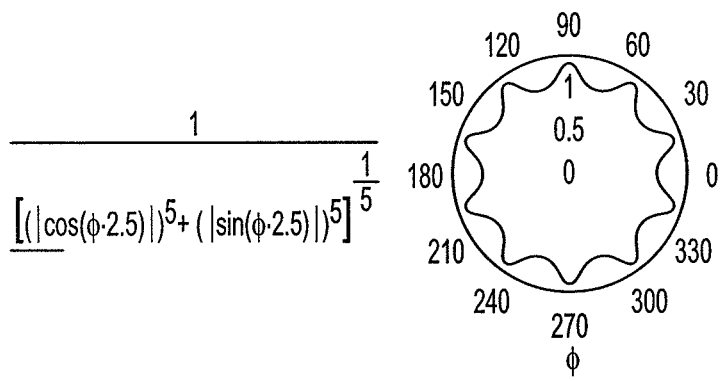
FIG. 13A
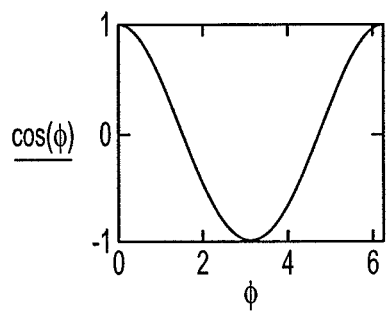
FIG. 13B
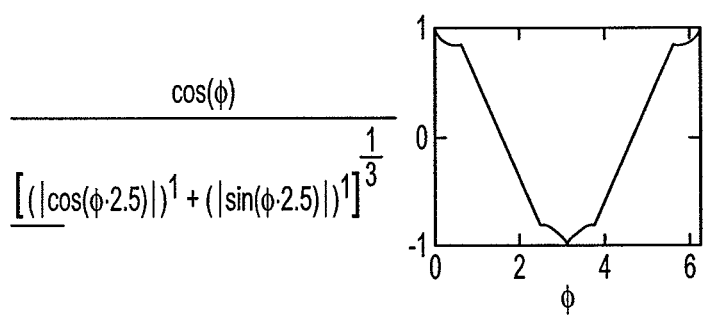
FIG. 14A
FIG. 14B
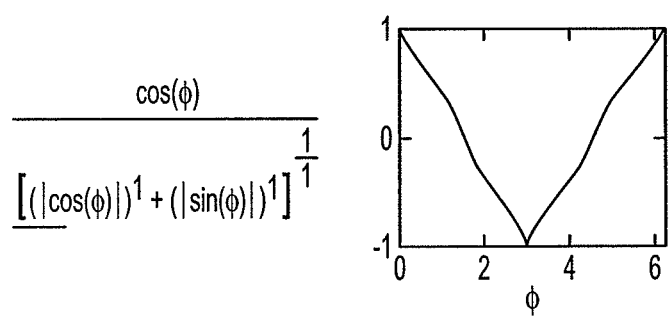
FIG. 14C $$\frac{e^{0.2\cdot(\phi)}}{\left[\left(\left|\cos\left(\frac{0\cdot\phi}{4}\right)\right|\right)^{1}+\left(\left|\sin\left(\frac{0\cdot\phi}{4}\right)\right|\right)^{1}\right]^{\frac{1}{1}}}$$

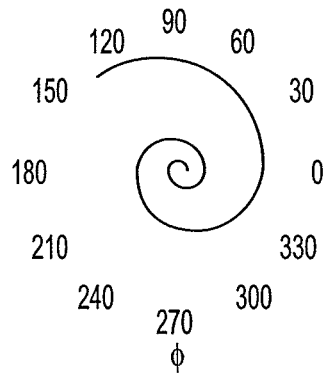

FIG. 15A $$\frac{e^{0.2\cdot\phi}}{\left[\left(\left|\cos\left(\frac{4\cdot\phi}{4}\right)\right|\right)^{1000}+\left(\left|\sin\left(\frac{4\cdot\phi}{4}\right)\right|\right)^{1000}\right]^{\frac{1}{1000}}}$$

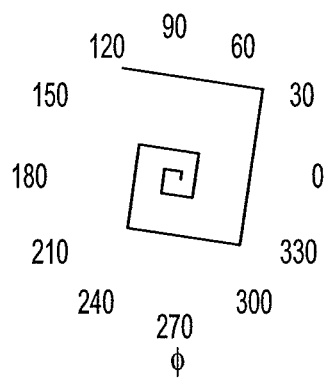

FIG. 15B $$\frac{e^{0.2\cdot(\phi)}}{\left[\left(\left|\cos\left(\frac{10\cdot\phi}{4}\right)\right|\right)^{5}+\left(\left|\sin\left(\frac{10\cdot\phi}{4}\right)\right|\right)^{5}\right]^{\frac{1}{5}}}$$

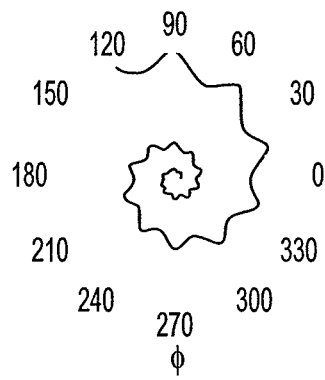

FIG. 15C

= (APPROXIMATION IN 2 STEPS)

= (SUPER-COSINE; m = 4, ni >>>) (cosϕ/☐)

FIG. 19A

FIG. 19B $$\frac{|\cos(1.5\cdot\phi)|}{[(|\cos(\phi\cdot1.5)|)^2+(|\sin(\phi\cdot1.5)|)^2]^{\frac{1}{2}}} + \frac{|\cos(2\cdot\phi)|}{[(|\cos(\phi\cdot2)|)^1+(|\sin(\phi\cdot2)|)^1]^{\frac{1}{1}}} + \frac{|\sin(2.5\cdot\phi)|}{[(|\cos(\phi\cdot2.5)|)^1+(|\sin(\phi\cdot2.5)|)^1]^{\frac{1}{1}}}$$

(WITH ɕ1 = 1)
FIG. 20A
(WITH m= 4;) ni >>>
FIG. 21A
(WITH m= 4;) ni <<<
FIG. 22A
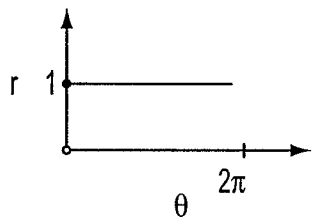
FIG. 20B
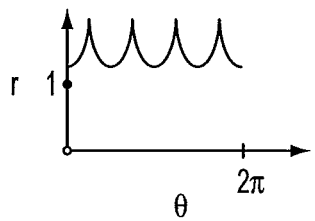
FIG. 21B
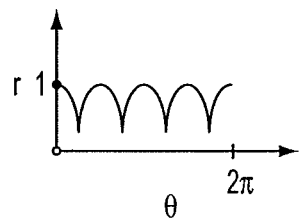
FIG. 22B
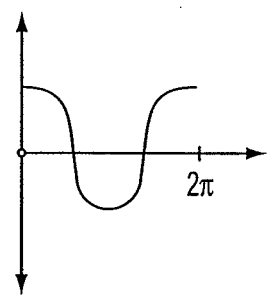
FIG. 20C
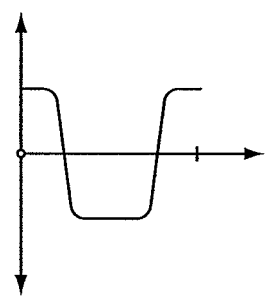
FIG. 21C
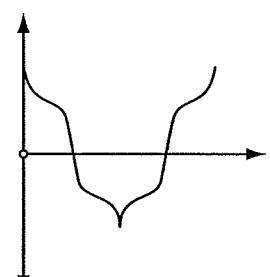
FIG. 22C
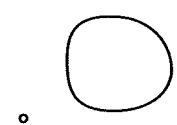
(NORMAL COSINE)
FIG. 20D
(SUPER COSINE)
FIG. 21D
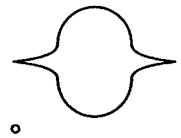
(SUB COSINE)
FIG. 22D
FIG. 20E
FIG. 21E
FIG. 22E

| n | otot(n) |
|---|---|
| 2 | 14922.53232 |
| 2.2 | 14805.73562 |
| 2.4 | 14729.58991 |
| 2.6 | 14680.29232 |
| 2.8 | 14649.22996 |
| 3 | 14630.81997 |
| 3.2 | 14621.33054 |
| 3.4 | 14618.20338 |
| 3.6 | 14619.64752 |
| 3.8 | 14624.38697 |
| 4 | 14631.49915 |
| 4.2 | 14640.29848 |
| 4.4 | 14650.30758 |
| 4.6 | 14661.1452 |
| 4.8 | 14672.53278 |
| 5 | 14684.26051 |
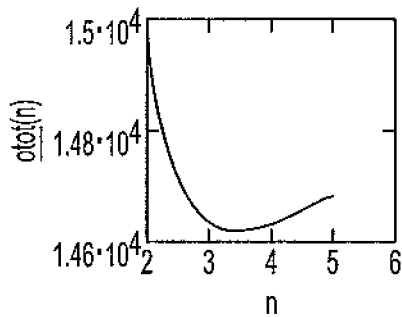
FIG. 24
| n | vol(n) |
|---|---|
| 2 | 222633.529 |
| 2.5 | 168704.726 |
| 3 | 138144.749 |
| 3.5 | 118989.958 |
| 4 | 106127.52 |
| 4.5 | 97044.47 |
| 5 | 90378.238 |
| 5.5 | 85333.966 |
| 6 | 81420.884 |
| 6.5 | 78321.888 |
| 7 | 75824.307 |
| 7.5 | 73781.547 |
| 8 | 72088.752 |
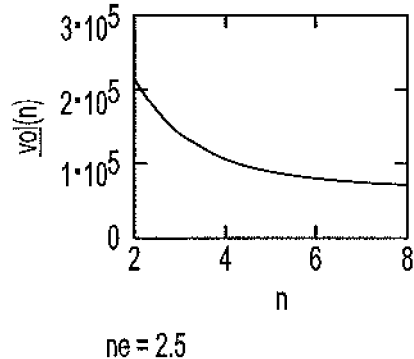
ne = 2.5
FIG. 25
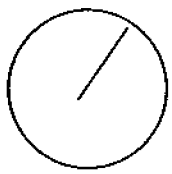 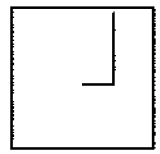
FIG. 26A  FIG. 26B

```
'*** Program to generate 3-D supershapes ***

DECLARE FUNCTION Hypfunc (pie, p, q, r, s, t, u, v)

factor = 15     'display width SCREEN 12            'VGA!

PRINT , "*** 3-D supershapes ***"
PRINT , "***          Geniaal          ***"

PRINT "We first determine the shape parameters of the object"
PRINT "*****************************************************"
PRINT
INPUT "Give shape parameter a"; a1
INPUT "Give shape parameter b"; b1
INPUT "Give shape parameter c"; c1
PRINT
PRINT "This series of exponent is to determine the supershape in XY"
PRINT "*************************************************************"
INPUT "Give exponent 1"; g1
INPUT "Give exponent 2"; h1
INPUT "Give root exponent"; i1
INPUT "Give argument1"; k1
INPUT "Give argument2"; l1
PRINT
PRINT "This series of exponent is to determine the supershape in Z"
PRINT "************************************************************"
INPUT "Give exponent 1"; g2
INPUT "Give exponent 2"; h2
INPUT "Give root exponent"; i2
INPUT "Give arugment1"; k2
INPUT 'Give argument2"; l2
PRINT
PRINT "Give the accuracy of the display (integer > 0, the smaller the finer)"
INPUT "Be careful: the smaller this number, the longer it takes.  Proposed
value = 6)"; Za
CLS
PRINT
PRINT
PRINT "We give the rotation of the display."
INPUT "Give the rotation around X-axis"; uh
INPUT "Give the rotation around Y-axis"; vh
INPUT "Give the rotation around Z-axis"; wh
CLS
uh1 = ((uh * 3.141593) / 180)
vh1 = ((vh * 3.141593) / 180)
wh1 = ((wh * 3.141593) / 180)

Zb = Za

FOR fi = 0 to 180 STEP Za
 FOR ga = -180 to 180 STEP Zb gam = (ga * 3.141593) / 180
   fie = (fi * 3.141593) / 180
```

FIG. 27A

```
    d = Hypfunc(fie, a1, b1, g1, h1, i1, k1, l1) '** determine d with shape
       parameters a=1, b=1
    r = Hypfunc(gam, d, c1, g2, h2, i2, k2, l2)

X = r * (COS(gam)) * (COS(fie))
    Y = r * (COS(gam)) * (SIN(fie))
    Z = r * (SIN(gam))
    IF Z < 0 THEN Z = 0

X1 = .X
    Y1 = (Y * (COS(uh1))) + (Z * (SIN(uh1)))
    Z1 = ((0 - Y) * (SIN(uh1))) + (Z * (COS(uh1)))

X2 = (X1 * (COS(vh1))) + (Z1 * (SIN(vh1)))
    Y2 = Y1
    Z2 = ((0 - X1) * (SIN(vh1))) + (Z1 * (COS(vh1)))

X3 = (X2 * (COS(wh1))) + (Y2 * (SIN(wh1)))
    Y3 = ((0 - X2) * (SIN(wh1))) + (Y2 * (COS(wh1)))
    Z3 = Z2 yp = 240 - (Y3 * factor)'** calculate position on the screen
    xp = 300 + (X3 * factor)
    PSET (xp, yp), 3
  NEXT ga
 NEXT fi LOCATE (26)
PRINT "SUPERSHAPES GENERATOR, BHG-format"
PRINT
PRINT "Shape parameters:a = "; a1; ", b = "; b1; ", c = "; c1
PRINT "1ste Hyp: exp.1 = "; g1; ",exp.2 = "; h1; ", root = "; i1; " argument =
"; k1; " en "; l1
PRINT "2ste Hyp: exp.1 = "; g2; ",exp.2 = "; h2; ", root = "; i2; " argument =
"; k2; " en "; l2
PRINT "Orientation: Angle around X = "; uh; ", around Y = "; vh; ", around Z =
"; wh FUNCTION Hypfunc (pie, a, b, m, s, t, u, v)
   Hypfunc = (1 / ((((ABS(COS(u * pie))) ^ m) / (a ^ m)) + (((ABS(SIN(v *
pie))) ^ s) / (b ^ s)))) ^ (1 / t)
END FUCTION
```

FIG. 27B $$r(n) = 2 \cdot m_1 \cdot \int_0^{\pi/2} \left[ \frac{1}{\left| \frac{\cos\left(\frac{m_1 \cdot \gamma}{4}\right)^n}{a(n)^n} + \frac{\sin\left(\frac{m_2 \cdot \gamma}{4}\right)^n}{b(n)^n} \right|} \right]^{2 \cdot \frac{n+1}{n}} \cdot \left[ \frac{m_1}{4} \cdot \sin\left(\frac{m_1 \cdot \gamma}{4}\right) \cdot \frac{\cos\left(\frac{m_1 \cdot \gamma}{4}\right)^{n-1}}{a(n)^n} - \frac{m_2}{4} \cdot \cos\left(\frac{m_2 \cdot \gamma}{4}\right) \cdot \frac{\sin\left(\frac{m_2 \cdot \gamma}{4}\right)^{n-1}}{b(n)^n} \right]^2 + \left[ \frac{1}{\frac{\cos\left(\frac{m_1 \cdot \gamma}{4}\right)^n}{a(n)^n} + \frac{\sin\left(\frac{m_2 \cdot \gamma}{4}\right)^n}{b(n)^n}} \right]^{\frac{2}{n}} d\gamma \cdot \frac{1}{2}$$

FIG. 28

$$\frac{1}{\Box}$$
{WITH m = 4; ni = 5}

FIG. 32A

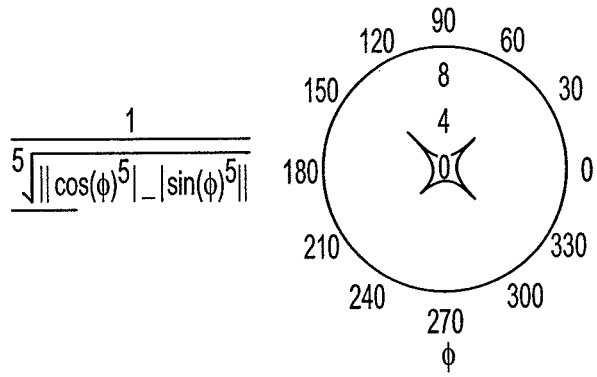

FIG. 32B $$\frac{1}{\sqrt[5]{\left\|\left|\cos(\phi)\right|^5 - \left|\sin(\phi)\right|^5\right\|}}$$

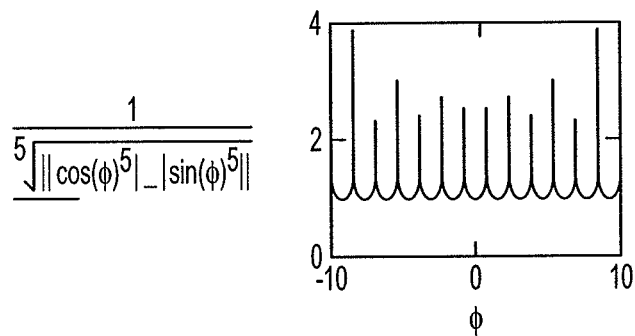

FIG. 32C $$\frac{1}{\sqrt[5]{\left\|\left|\cos(\phi)\right|^5 - \left|\sin(\phi)\right|^5\right\|}}$$

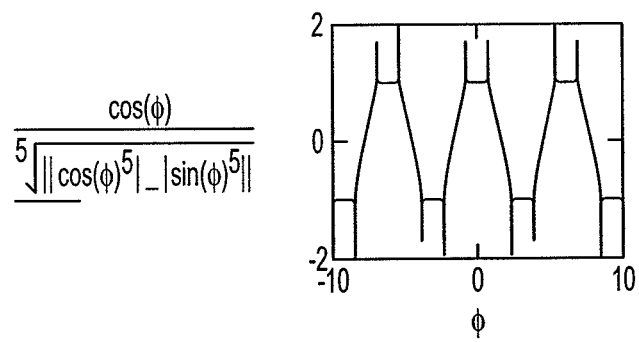

FIG. 32D $$\frac{\cos(\phi)}{\sqrt[5]{\left\|\left|\cos(\phi)\right|^5 - \left|\sin(\phi)\right|^5\right\|}}$$

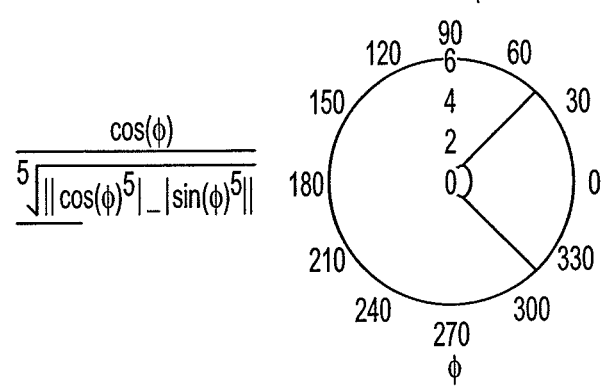

FIG. 32E $$\frac{\cos(\phi)}{\sqrt[5]{\left\|\left|\cos(\phi)\right|^5 - \left|\sin(\phi)\right|^5\right\|}}$$

METHOD AND APPARATUS FOR SYNTHESIZING AND ANALYZING PATTERNS

This application claims priority to U.S. Provisional Application Ser. No. 60/133,279, filed on May 10, 1999, the entire disclosure of which is incorporated herein by reference as though recited herein in full.

BACKGROUND OF THE INVENTION

1. Field of the Invention

The present invention relates to the synthesis of patterns (such as images and waveforms such as sounds, electromagnetic waveforms, etc.) and to the analysis of existing patterns.

The present invention involves the "synthesis" and "analysis" of such patterns using a novel geometrical concept developed by the present inventor that describes many geometrical shapes and forms by a single mathematical formula, referred to herein as the "super-formula." The various geometrical shapes and forms that may be described by this formula are referred to herein as "super-shapes" or "super-spirals."

2. Background of the Invention

With the advent of computer technology, various methods of synthesizing and analyzing patterns (e.g., images and waveforms, such as sounds and various electromagnetic waveforms including light, electricity, etc.) have been developed. Various techniques for synthesizing images are used, for example, in various computer graphics programs and in a variety of other applications—such as computer screen saver programs and a wide range of other applications. In addition, various techniques for analyzing existing images have also been developed in the existing art.

While a variety of techniques are known, there still remains a great need for improvements in pattern synthesis and in pattern analysis. Although computers are becoming more versatile and intelligent, there remains are great need to simplify functions and operations within computers to save valuable memory space and to enable quick and accurate determinations to be performed by the computers.

In the arts of pattern synthesis and pattern analysis, a variety of mathematical concepts have been put forth in an effort to simplify pattern synthesis and analysis. However, while there have been improvements in prior methods, there remains a need for fundamental improvements in such methods.

While variation in form and shape has always intrigued students of nature (e.g., such as biologists and mathematicians), creating accurate and simple characterizations of form and shape has proven to be a conceptually arduous task. There remains a need for simple mathematical and biophysical rules underlying shapes in general and morphology and morphogenesis.

The ancient Greeks developed some basic geometric principles to explain natural forms. In both ancient and modern concepts, the circle prevails as the ideal object. Generally, circular and cylindrical forms and shapes can also be observed in plants and organisms. Much of existing geometry is based on the circle, including all trigonometry and all technology based on trigonometric functions. Complex forms can also be analyzed in terms of circles and harmonics.

More recently, other findings to describe natural forms have included, for example, fractals and algorithms that can, for example, generate some types of virtual plants.

With the advancement of computer technology, models have become very sophisticated. In such models, mathematics has been used as a tool. But these tools alone have not unraveled principles underlying shapes. Moreover, natural forms in general fail to follow exact mathematical rules: e.g., perfect circles are never observed in nature; and no two single leaves are ever exactly the same. With existing algorithms it remains impossible to describe forms as they exist in nature and it remains impossible to conceptualize the true relationships between various shapes and forms.

There remains a need for those in the applied mathematical and biological fields to be able to characterize various shapes and forms utilizing ever simpler geometrical rules. Similarly, there remains a need in the arts of pattern synthesis and analysis for improved methods whereby a wide variety of patterns (e.g., geometric shapes, waveforms, etc.) can be quickly and accurately synthesized and/or analyzed with optimal use of computer memory and resources.

SUMMARY OF THE INVENTION

The present invention overcomes the above and other problems experienced by persons in the arts described above. The present inventor has 1) developed a new geometrical concept that can be used to describe many natural and abstract geometrical shapes and forms with a single mathematical formula and 2) has advantageously applied this new geometrical concept in unique computer applications for, for example, the synthesis and analysis of patterns.

This geometrical concept enables one to describe many natural and abstract shapes in a simple and straightforward manner. The geometric concept of the present invention is also useful for modeling and for explaining why certain natural shapes and forms grow as they do. As explained hereinbelow, the present inventor has found that most of the conventional geometrical forms and regular shapes, including circles and polygons, can be described as special realizations of the following formula:

$$r = \frac{1}{\sqrt[n_1]{\left|\frac{1}{a} \cdot \cos\frac{m_1 \cdot \phi}{4}\right|^{n_2} \pm \left|\frac{1}{b} \cdot \sin\frac{m_2 \cdot \phi}{4}\right|^{n_3}}}$$

(for a, b, $n_i$ and $m_i \in \Re^+$)(where a and b are not equal zero)

This formula and representations thereof can be utilized, for example, in both the "synthesis" and "analysis" of patterns (i.e., including for example image patterns and waveforms such as electromagnetic (e.g., electricity, light, etc.), sound and other waveforms or signal patterns) and the like.

In order to synthesize various patterns, the parameters in this equation can be modified so that a variety of patterns can be synthesized. Notably, the parameters $m_1$, $m_2$, $n_1$, $n_2$, $n_3$, a and/or b can be moderated. By moderating or modulating the number of rotational symmetries ($m_i$), exponents ($n_i$), and/or short and long axes (a and b), a wide variety of natural, human-made and abstract shapes can be created. The moderation of these parameters can also be carried out in a well-defined and logical manner. The formula can be used to generate a large class of super-shapes and sub-shapes. In view of the advancement of the above formula beyond existing super-circles and sub-circles (Lame-ovals), this new formula is coined herein as the "super-formula."

While the equation can define various shapes, any point within the contour of the shape can be defined as well, for $0 < R < R_{max}$ if a=b, for $0 < a, b < a_{max}$ and $b_{max}$.

This new super-formula can be used advantageously as a novel linear operator. When combined with other functions, the formula proper can also transform or moderate such functions. When the function f(Φ)=constant, the formula is like that shown above. In combination with other functions it will moderate, for example, the graphs of these functions—e.g., to become more flattened, to become more pointed, or to have a different number of rotational symmetries, etc. For ease in reference, the present novel linear operator (i.e., the super-formula), with its unique moderation abilities, is identified herein by the following new symbol.

$$_{1/}\boxed{\phantom{x}}_{j}$$

Where: $r \cdot \boxed{\phantom{x}} = 1$

In addition to the foregoing, the super-formula can, as discussed in detail below, be similarly applied in three or more dimensions and in a variety of representations and applications.

The above and other features and advantages of the present invention will be further understood from the following description of the preferred embodiment thereof, taken in conjunction with the accompanying drawings.

BRIEF DESCRIPTION OF THE DRAWINGS

The accompanying drawings, which are included to illustrate by way of example and not limitation, are briefly described below as follows.

FIGS. 2(A)-2(I) show 2-dimensional images, represented in polar coordinates, that are created by the super-formula linear operator containing the parameters as shown adjacent to the respective images. In these FIGS., the values of $n_1=n_2=n_3=1$, and the values $m_1=m_2$=the values as shown to the right and in the respective formulas adjacent to the FIGS. These FIGS. illustrate, e.g., introduction of rotational symmetries so as to form polygonal shapes.

FIGS. 4(A)-4(I) show 2-dimensional images, represented in polar coordinates, demonstrating creation of pointed polygons with the super-formula by appropriate variation of the parameters as shown adjacent to the respective drawings—e.g., with values of $n_1=n_2=n_3<2$.

FIGS. 6(A)-6(I) show 2-dimensional images, represented in polar coordinates, demonstrating creation of images with parameters such that $n_1 \neq n_2 \neq n_3$ and m incrementally increases between FIGS.

FIGS. 7(A)-7(G) show 2-dimensional images, represented in polar coordinates, demonstrating creation of images with parameters such that $a \neq b$ and m incrementally increases between FIGS.

FIGS. 9(A)-9(G) show 2-dimensional images, represented in polar coordinates, demonstrating incremental change in images created when rotational symmetry values change between m=4 and m=3, where $n_1=n_2=n_3=100$.

FIG. 13(A) shows an integration of the linear operator with parameters as shown for illustrative purposes of how shapes can be formed therewith, and FIG. 13(B) shows an exemplary shape as formed with the linear operator identified adjacent to that exemplary shape.

FIG. 14(A) shows a cosine function in XY coordinates, and FIGS. 14(B)-14(C) shows examples of moderation of the cosine function with parameters as per the respective equations shown.

FIGS. 15(A)-15(C) show 2-dimensional (spiraled) images, represented in polar coordinates, created by the insertion of parameters as per the respective super-formula equations shown—with the super-formula operator acting on the logarithmic spiral ($r=e^{a\theta}$).

FIG. 19 (A) schematically illustrates the analysis of basic natural patterns using a moderated Fourier analysis with the super-formula operator, and FIG. 19(B) shows a formula that can be used to recreate or analyze the basic natural pattern in this exemplary illustrative case.

FIGS. 20(A)-20(E), 21(A)-21(E) and 22(A)-22(E) each schematically illustrate five different possible modes of representation of super-shapes created by particular super-formula equations.

FIG. 24 illustrates calculations according to one exemplary embodiment providing preferred values of n for an optimal shape for yogurt pots or the like.

FIG. 25 illustrates calculations according to another exemplary embodiment providing preferred values of n for an optimal shape for an engine block or the like.

FIGS. 26A and 26B schematically illustrates how a circle and a square, and also a sphere and a cube, can be represented as equivalent utilizing the super-formula.

FIG. 27 is an actual program useable to generate 3-D super-shapes.

FIG. 28 is an equation showing calculation of a perimeter of a sectional area r(n).

FIGS. 32(A)-32(E) illustrate five exemplary modes of representation of super-shapes using representations of the super-formula based on hyperbolas.

DETAILED DESCRIPTION OF THE PREFERRED EMBODIMENTS

Figure 1A:
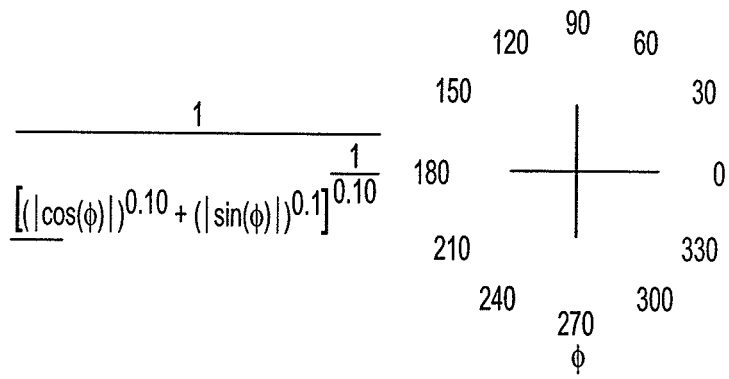
FIGS. 1(A)-1(T) show 2-dimensional images, represented in polar coordinates, that are created by the super-formula linear operator containing the parameters as shown adjacent to the respective images. In these FIGS., the values of $m_1$ and $m_2$=4, and the values of $n_1=n_2=n_3$=the values as shown to the right and in the respective adjacent formulas. These FIGS. illustrate, e.g., step-wise inflation with incremental increase in the values of $n_i$.
Figure 1B:
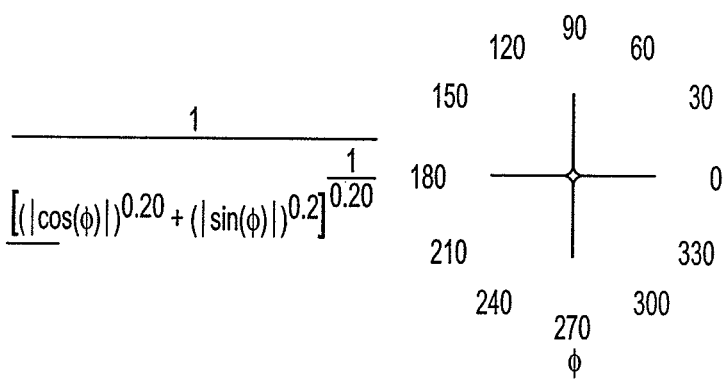
Figure 1C:
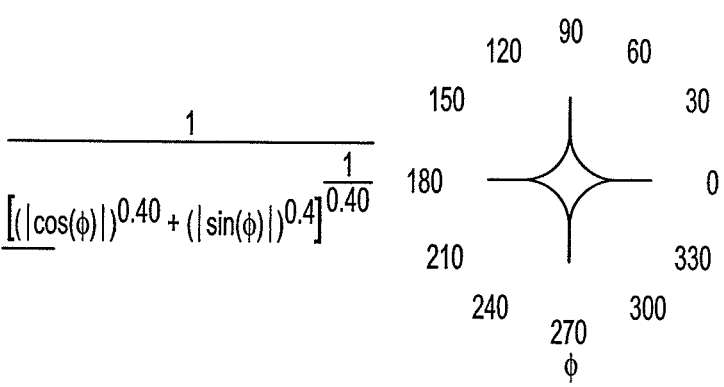
Figure 1D:
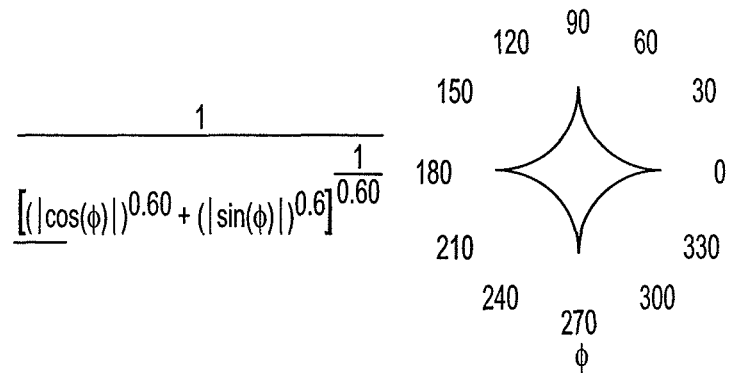
Figure 1E:
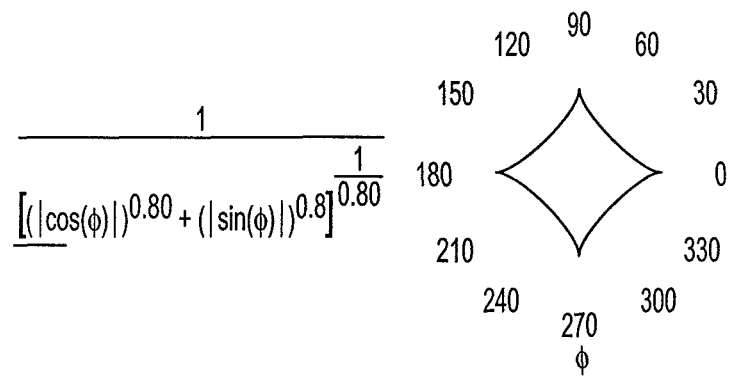
Figure 1F:
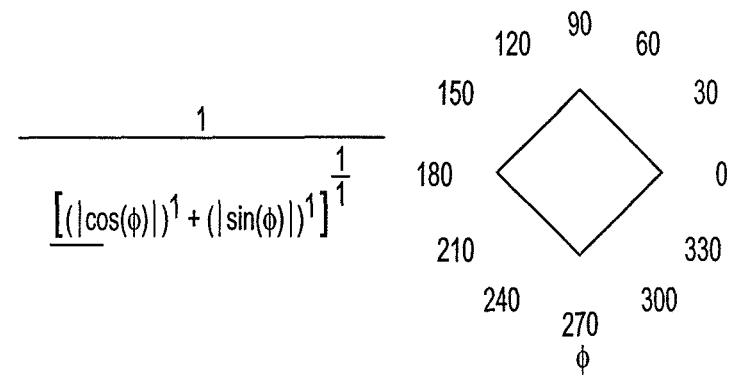
Figure 1G:
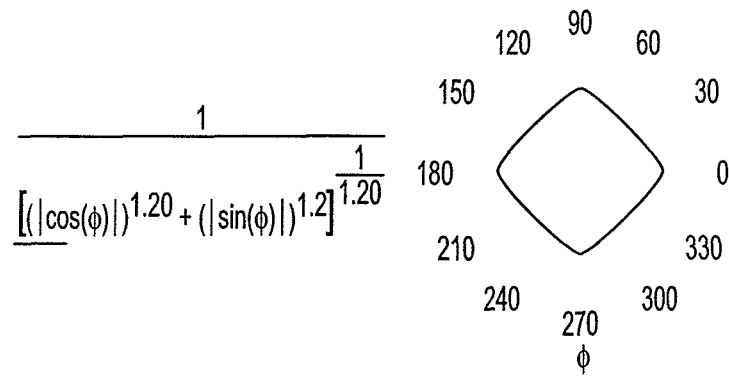
Figure 1H:
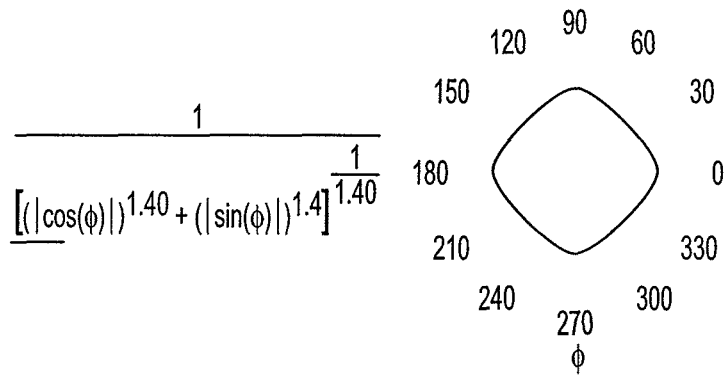
Figure 1I:
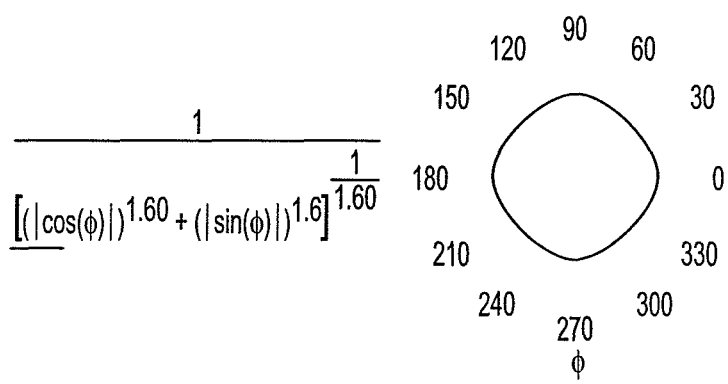
Figure 1J:
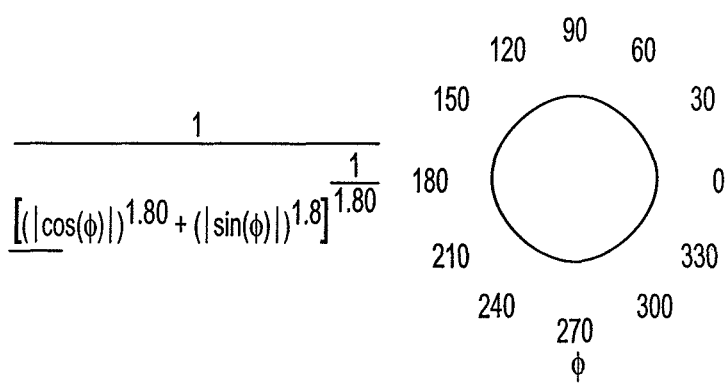

As discussed above, the present invention involves methods and apparatuses for the "synthesis" and/or "analysis" of patterns (e.g., such as images, waveforms such as sounds or other signals, etc.) through the use of a novel mathematical formula—referred to herein as the "super-formula."

A. The Derivation of the Super-Formula

At an initial stage, the equation for a circle in cartesian coordinates is presented.

$$x^2 + y^2 = R^2 \quad (1)$$

Second, the equation is generalized as follows.

$$|x^n| + |y^n| = R^n \quad (2)$$

Third, the equation is transformed into polar coordinates (with x=r cos φ; and y=r sin φ) as follows.

$$|r^n \cos^n \phi| + |r^n \sin^n \phi| = R^n \quad (3)$$

Fourth, the equation is modified as follows.
(4)

$$r = \frac{R}{\sqrt[n]{|\cos^n \cdot \phi| + |\sin^n \cdot \phi|}}$$

Fifth, the equation is modified to introduce rotational symmetries: introducing m φ.

Sixth, the equation is modified to introduce differentiation in the exponent n: introducing $n_1$, $n_2$ and $n_3$.

Seventh, the equation is modified to introduce differences in axis length: introducing A and B.

The "super-formula" can then be initially written as follows:

$$r = \frac{R}{\sqrt[n_1]{\left|A \cdot \cos \frac{m_1 \cdot \phi}{4}\right|^{n_2} + \left|B \cdot \sin \frac{m_2 \cdot \phi}{4}\right|^{n_3}}}$$

Preferably, the super-formula starts from the equation of an ellipse such that the formula has 1/a and 1/b instead of A and B and such that the nominator becomes 1. This manner of representing the super-formula is preferred since the super-formula is preferably to be usable as a linear operator proper as described herein. Thus, the super-formula is thus preferably represented as follows:

$$r = \frac{1}{\sqrt[n_1]{\left|\frac{1}{a} \cdot \cos \frac{m_1 \cdot \phi}{4}\right|^{n_2} + \left|\frac{1}{b} \cdot \sin \frac{m_2 \cdot \phi}{4}\right|^{n_3}}}$$

Similarly, another representation of the superformula can be derived starting with the equation of the hyperbola $|x|^n - |y|^n$ such that in the denominator of the superformula equations a minus sign appears between the cosine and sine terms. In addition, a similar equation can be obtained when the derivation is performed starting from the modulus of a complex number z=cos x+i sin x. In both cases, the absolute value is applied over the whole sum. Here, for example, the following equations can be initially presented: a) calculating distances with complex numbers: x+iy:→x²-y²=1; and b) based on a hyperbola: x²-y²=1.

For example, we may represent or generalize this as follows:

$$r = \frac{1}{\sqrt[n_1]{\left|\frac{1}{a^{n_2}} \cdot \cos^{n_2} m \cdot \phi\right| + i^{n_3} \cdot \left|\frac{1}{b^{n_4}} \cdot \sin^{n_4} m \cdot \phi\right|}}$$

(Notably: i=the square root of -1 and, thus, the value of $n_3$ determines if this will be positive or negative.)

Accordingly, the general equation may preferably be represented as follows:

$$r = \frac{1}{\sqrt[n_1]{\left|\frac{1}{a} \cdot \cos \frac{m_1 \cdot \phi}{4}\right|^{n_2} \pm \left|\frac{1}{b} \cdot \sin \frac{m_2 \cdot \phi}{4}\right|^{n_3}}}$$

The "super-formula" can be mathematically presented in a variety of modes of representation. As discussed below, the mode of representation can be selected in accordance with the particular application at hand. Exemplary modes are as follows:

(a) The super-formula as shown above (represented by the operator symbol noted above in short hand). See, as some examples, FIGS. 20(A), 21(A), 22(A) and 32(A) (note: in the examples of FIGS. 32(A)-(E) the super-formula may be derived from, e.g., a hyperbola).

(b) The graph of the super-formula in polar coordinates. See, for example, FIGS. 20(B), 21(B), 22(B) and 32(B).

(c) The graph of the super-formula in XY coordinates (e.g., with y values corresponding to the radius values rata particular angle φ and with x values corresponding to the values of the angle φ). See, for example, FIGS. 20(C), 21(C), 22(C) and 32(C).

(d) The XY representation of the projection of the lygon created by the super-formula onto a certain system of axes (e.g., $\cos\phi/\boxed{\phantom{x}}_j$ in the orthogonal system). See, for example, the rough illustrations in FIGS. 20(D), 21(D), 22(D) and 32(D).

(e) The polar representation of that in (d) above. See, for example, FIGS. 20(E), 21(E), 22(E) and 32(E).

In addition, the super-formula may also be represented in different numbers of dimensions, such as in three or more dimensions. The basic equation in three dimensions, for example, may be written as follows, using spherical coordinates with $r=f(\phi, \theta)$:

$$r = \frac{1}{\sqrt[n_1]{\left|\frac{1}{d}\cdot\cos\frac{m_1\cdot\phi}{4}\right|^{l_2} + \left|\frac{1}{c}\cdot\sin\frac{m_2\cdot\phi}{4}\right|^{l_3}}}$$

where:

$$d = \frac{1}{\sqrt[n_1]{\left|\frac{1}{a}\cdot\cos\frac{m_3\cdot\theta}{4}\right|^{n_2} + \left|\frac{1}{b}\cdot\sin\frac{m_4\cdot\theta}{4}\right|^{n_3}}}$$

B. Creating and Modifying Shapes and Forms with the Super-Formula

Figure 2A:
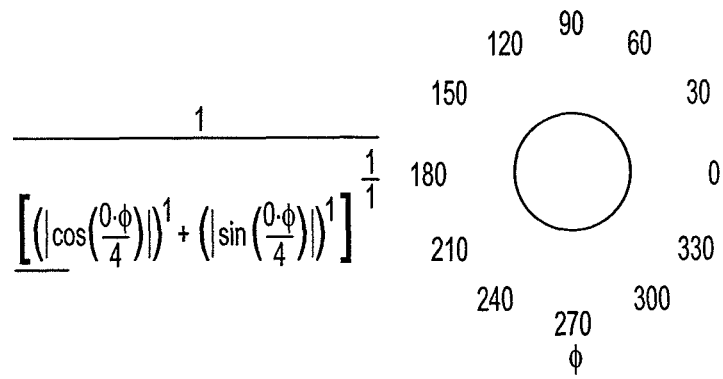

1. Introduction of Rotational Symmetries, Inflation of Shapes, Etc. —Application of the Super-Formula to Zero, Mono, Dia and Polygons First, by varying the arguments $m_1$ and $m_2$ of the angle · as integers in the "super-formula," specific rotational symmetries may be introduced. These rotational symmetries are equal to $m_{1,2}$. That is, polygons are created having $m_i$ angles and sides. FIGS. 2(A)-2(I) illustrate shapes that are created by varying the value of $m_1$ and $m_2$ (with $m_1$ and $m_2$ being equal) (and with $n_1=n_2=n_3=1$). In FIG. 2(A) $m_{1,2}=0$, while in FIG. 2(B) $m_{1,2}=1$, while in FIG. 2(C) $m_{1,2}=2$, etc. As shown in FIGS. 2(A)-2(E), shapes with outwardly bulging sides are produced for values of m<4. And, as shown in FIGS. 2(F)-2(I), shapes with inwardly curved sides are produced for values of m>4. With each of the shapes shown in FIGS. 2(A)-2(I), if rotated by an angle of $2\pi/m$, the shape remains exactly the same. When this rotation is repeated m times, the shape returns to its original orientation.

Figure 2B:
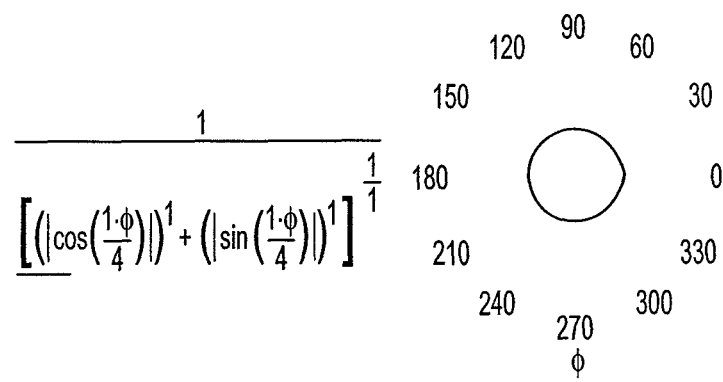
Figure 2C:
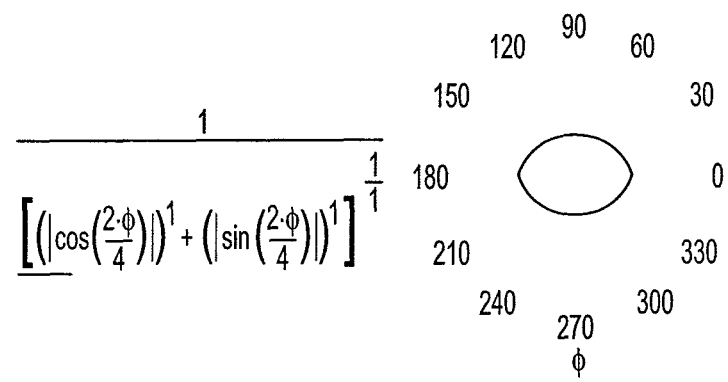
Figure 2D:
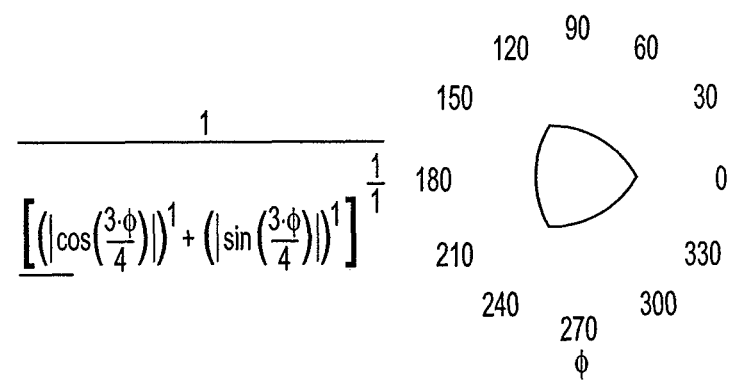
Figure 2E:
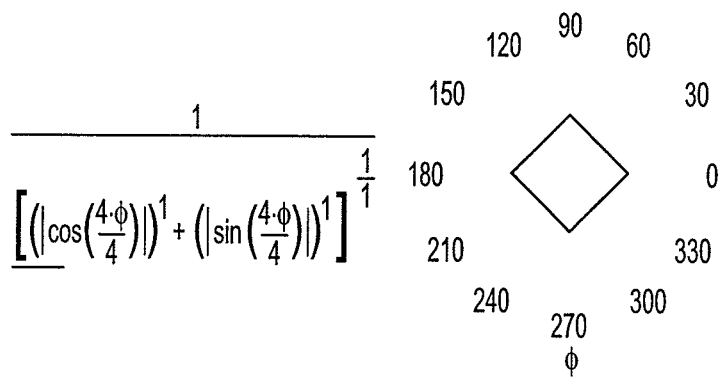

As shown in FIG. 2(A), it is possible to define 0-angle shapes (e.g., circles). As shown in FIG. 2(B), it is also possible to define 1-angle shapes. As shown in FIG. 2(C), it is also possible to define 2-angle shapes. And, it is also possible to define shapes with additional corners, such as the more common triangles, squares and other polygons with higher rotational symmetries. A circle is defined either as a zero-angle for any value of or for any number of rotational symmetries $m_i$ (given that $n_{2,3}=2$).

In addition, further shape moderation can be accomplished by varying the values of the exponents $n_1$, $n_2$ and $n_3$.

Figure 1K:
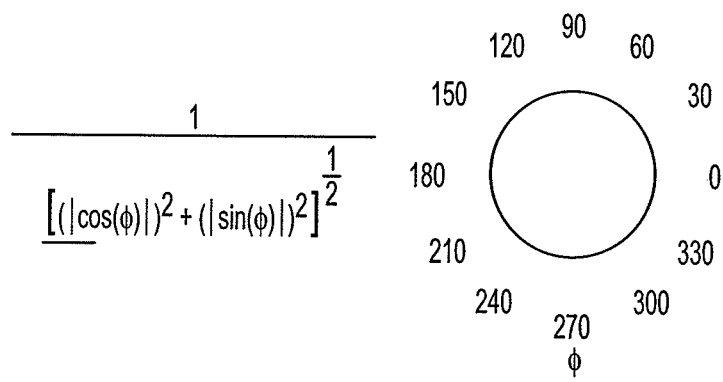
Figure 1L:
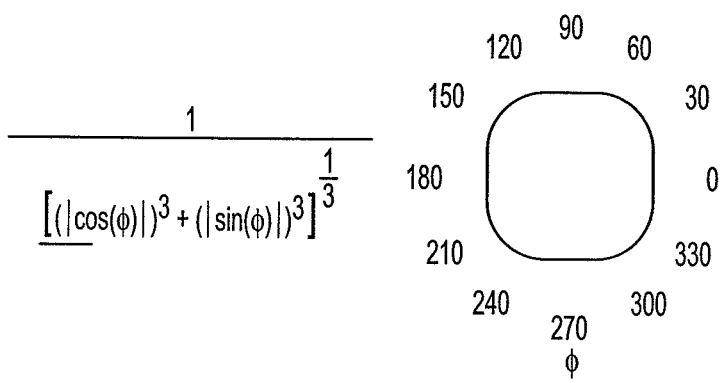
Figure 1M:
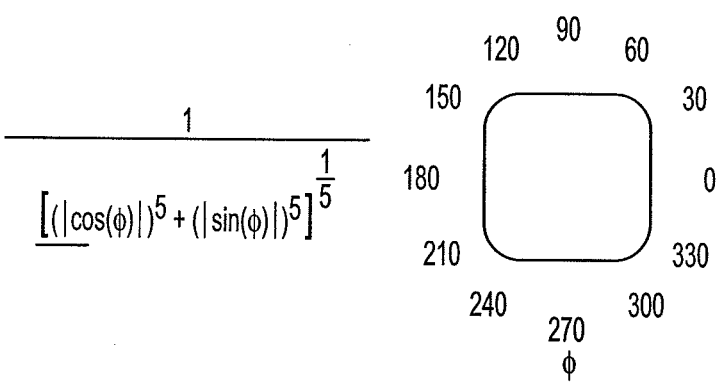
Figure 1N:
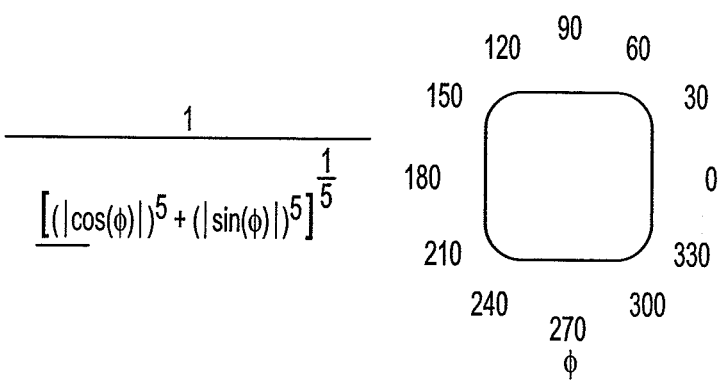
Figure 1O:
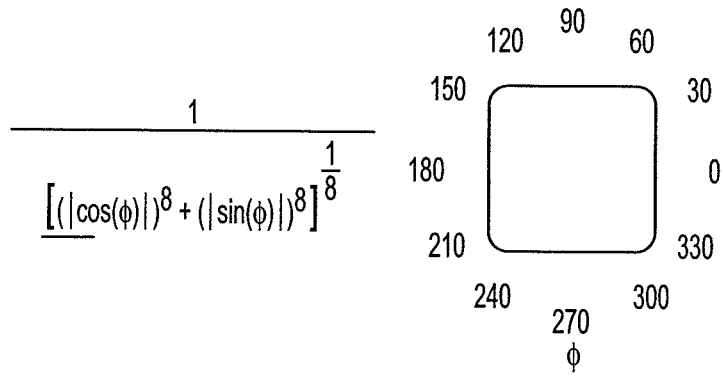
Figure 1P:
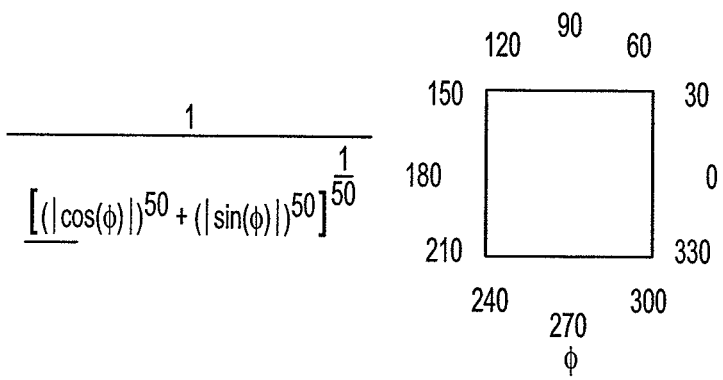
Figure 1Q:
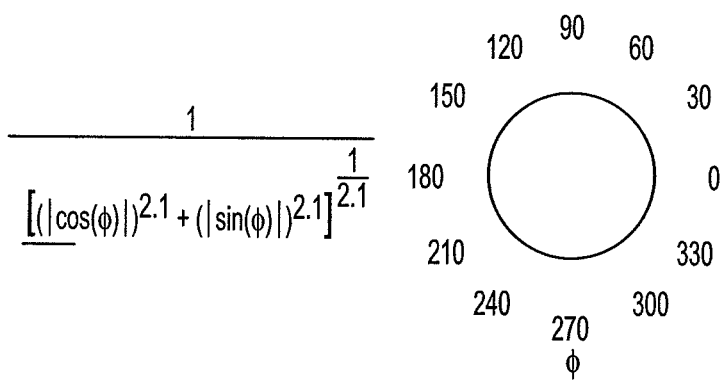
Figure 1R:
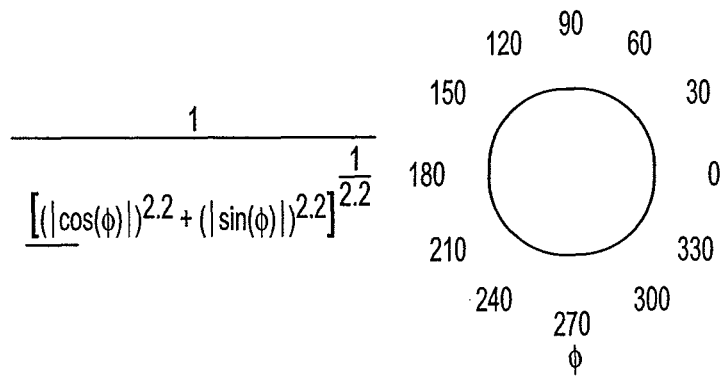
Figure 1S:
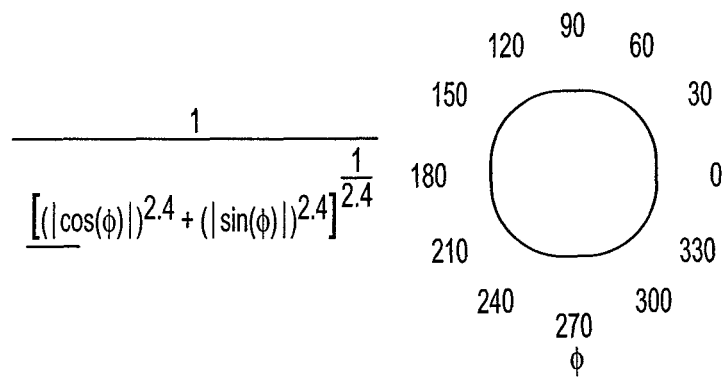

As shown in FIGS. 1(A)-(J), for the values of $n_i<2$, the shapes created are inscribed within the circle shown in FIG. 1(K). As the values of $n_i$ increase from 0 to 1, the shape becomes "inflated" so-to-speak from a cross to a square, with inwardly curved sides extending between outer points, the degree of curvature decreasing as the value of n approaches 1. Then, between 1 and 2, the sides continue as outwardly curved sides until the exact circle is obtained as shown in FIG. 1(K). Because the shapes in FIGS. 1(A)-(J) are each inscribed within the exact circle shown in FIG. 1(K), these shapes are referred to as sub-circles.

Figure 1T:
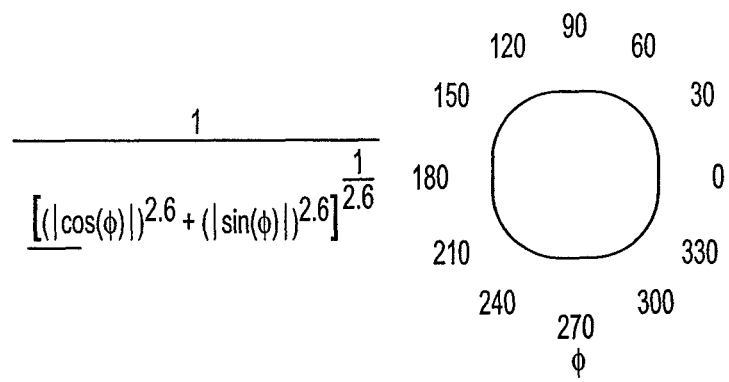

As shown in FIGS. 1(L)-1(T), as the value of n increases beyond 2 the shapes begin to "inflate" beyond that of the exact circle so as to circumscribe the exact circle. In this regard, the shapes shown in FIGS. 1(L)-1(T) are referred to as super-circles. The shape of the super-circles approaches a square as the value of n becomes large (e.g., toward infinity), with the corners having slowly increasing sharpness as the value becomes greater (see, e.g., virtually ideal square in FIG. 1(P) with a value of n=50). As shown, the sub-circles are in essence rotated by $\pi/2$ (e.g., 90 degrees) relative to super-circles. As shown in FIGS. 1(A)-1(T), the "sides" of the sub-circles actually become the "corners" of the super-circles as the shape become "inflated" past the ideal circle.

Similarly, for polygons, when the exponents $n_i$ are lower than 2, the polygons are inscribed in the circle and are rotated by n/m relative to the orientation of the circumscribed polygon, so that the angles of the former meet the latter (for $n_i>2$) in the middle of their sides. As before, depending on whether they are inscribed in the circle or are circumscribed around the circle, they are referred to herein as either sub-polygons or super-polygons, respectively. Again, when sub-polygons transform into super-polygons (and vice-versa), the corners transform into sides, and the sides transform into corners. Accordingly, the term rotational symmetry is more useful than angles or sides.

As described above and shown in FIGS. 1(A)-1(T), for super-circles with $n_1=n_2=n_3$, when m=4, straight sides are obtained when n goes to infinity. However, for polygons with m>4, inwardly bent sides result as n goes to infinity. On the other hand, the sides bend outward for m<4 as n goes to infinity.

Moreover, varying the ratio of $n_1$ to $n_2=n_3$ enables the creation of pentagons, hexagons, heptagons, octagons, nonagons, decagons, and so on, as illustrated in FIGS. 3(A)-3(F). Whereas polygons are commonly described based on coordinates, the "super-formula" enables the generation of polygons by a single equation.

One way in which the ratio of $n_1$ to $n_2=n_3$ can be defined to yield a regular polygon for a given rotational symmetry is by evaluating the area of the generated polygons, which is equal to $R^2$ m tg (180°/m), the general formula for area of regular m-gons, with R the radius of the inscribed circle. This procedure enables one to determine the ratio with enough precision for any application. Once the ratios are established, they remain fixed, for higher values of $n_i$.

Here, there is an inherent robustness: for example, if $n_1=100$, to obtain visually straight sides the value of $n_{2,3}$ can range from about 98 to 102 for squares, from about 58 to 62 for pentagons, and from about 38 to 42 for hexagons. This ratio will then remain fixed for higher values of $n_i$. The higher the number of rotational symmetries, the smaller is this range.

Additionally, with the formula $R^2$ m tg (180°/m), it is impossible to calculate areas or perimeters of zerogons, monogons or diagons, but it is possible to calculate these areas using the "super-formula."

Figure 5A:
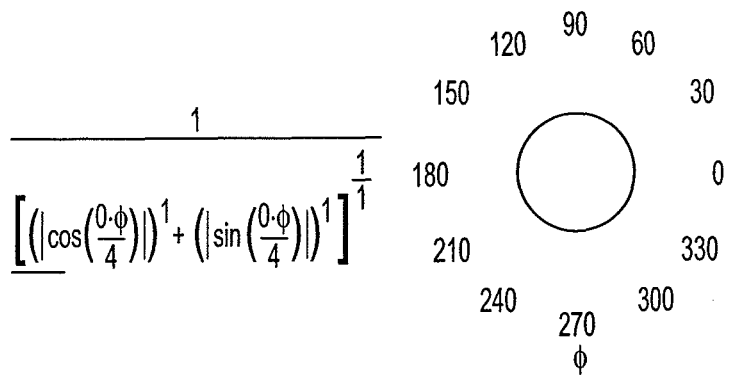
FIGS. 5(A)-5(I) show 2-dimensional images, represented in polar coordinates, demonstrating creation of zero-gons, mono-gons, dia-gons and polygons with curved sides with the super-formula by appropriate variation of the parameters as shown adjacent to the respective drawings—e.g., with values of $n_1=n_2=15; n_3=30$; and m incrementally increased between FIGS.
Figure 5B:
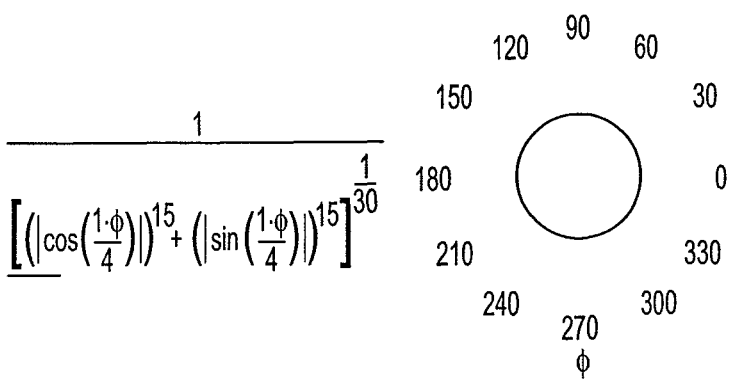
Figure 5C:
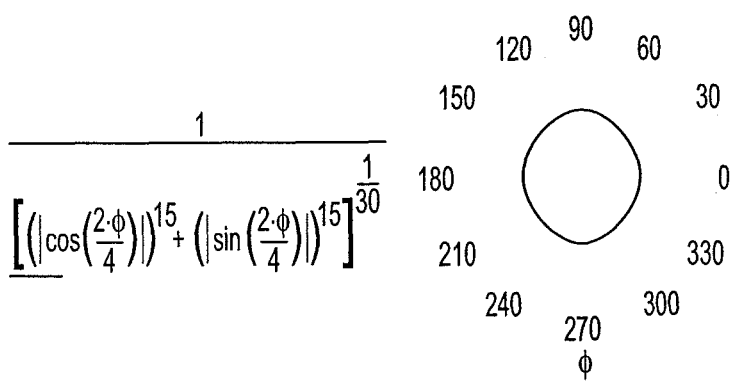
Figure 5D:
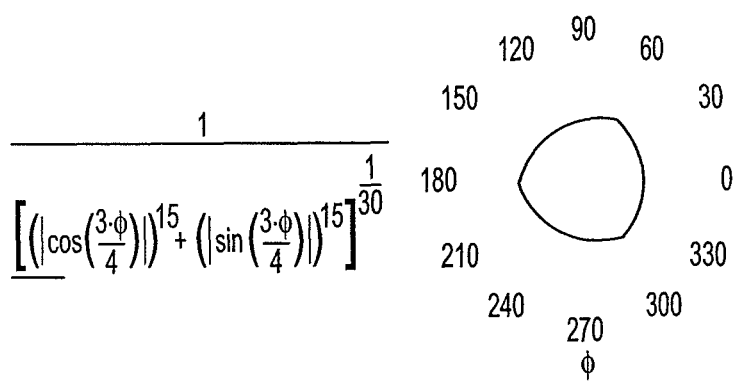
Figure 5E:
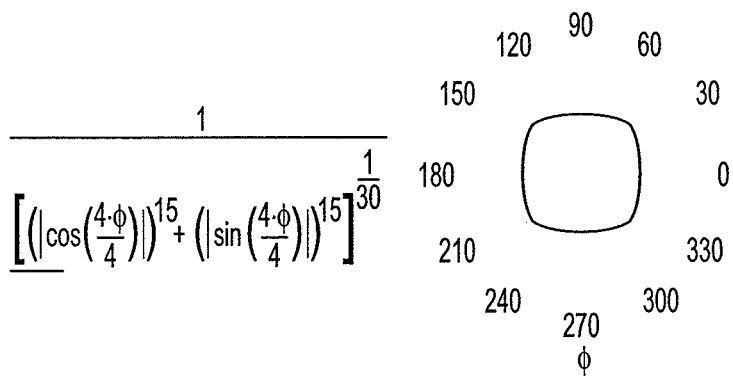
Figure 5F:
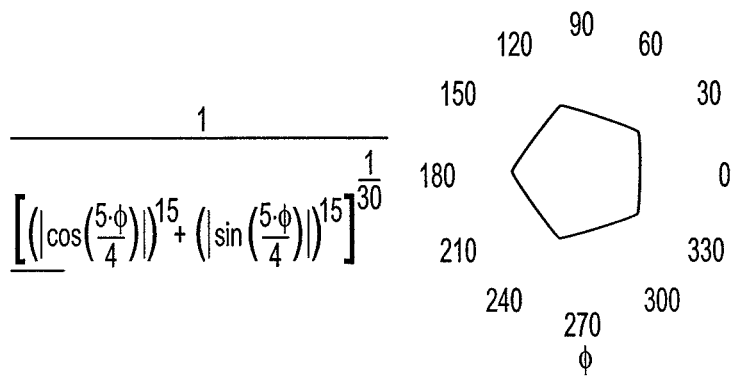

In addition to the foregoing possible moderations, the super-formula can also be moderated by varying the absolute value of the exponent. As shown, for example, in FIGS. 1(L)-1(O), it is possible to create more or less straight sides with rounded angles (with $n_2$ and $n_3$ between, e.g., 2 and 10). As shown, for example, in FIGS. 3(A)-3(F), it is also possible to obtain polygons with straight sides and more or less sharp angles (for example, with $n_{2,3}>10$). As shown in FIGS. 5(A)-

5(I), it is also possible to obtain polygons with either inwardly or outwardly bent sides (for example, with $n_{1,2}=15$ (i.e., >2) and $n_3=30$ (i.e., >2)).

In contrast to the shapes illustrated in FIGS. 2(A)-2(H), as shown in FIGS. 4(A)-4(I) it is also possible to obtain polygons with more inwardly curved sides and sharper angles by providing values of $n_1$, $n_2$ and $n_3<2$.

While the introduced rotational symmetries remain invariant under moderations of exponents and arguments as described above, this is no longer true when further moderations of the super-formula are applied, such as varying the ratio $n_2/n_3$ (see FIGS. 6(A)-6(I)) or varying the ratio of a/b (see FIGS. 7(A)-7(G)). When the lengths of the axes a and b differ, for example, a circle becomes an ellipse and a square a rectangle. This manipulation, however, is restricted: for an even number of rotational symmetries, changing the length of a and b halves the number of symmetries. On the other hand, when the number of rotational symmetries is odd, the shape does not close after one turn (0 to $2\pi$) when a and b are different (see, e.g., FIGS. 7(B), 7(D) and 7(F)).

2. Introducing Broken Symmetries

For a=b, by selecting a positive integer or zero for $m_i$, shapes are generated which close after 1 full rotation (i.e., between 0 to $2\pi$). Subsequent rotations by $2\pi$ ($2\pi$ to $4\pi$, $4\pi$ to $6\pi$, etc.) will generate exactly the same shape. However, when m is positive but not an integer, the shape generated does not close after 1 rotation. Instead, in further rotations the shapes will never close if irrational numbers are used, but will grow larger or smaller, depending on the values chosen.

In this manner, using natural numbers (including zero) yields closed shapes, while using rational numbers and irrational numbers yields open shapes in one rotation. Rational numbers will cause a repeat of a pattern (for example, similar to 5 leaves in 2 rotations in plant phyllotaxis) while there will be no pattern using irrational numbers. As such, real numbers of values zero or positive arise naturally in or from this formula.

The rotational symmetries observed in such open shapes, are in fact "apparent" rotational symmetries. The true number of rotational symmetries in these shapes of broken symmetry is only 1 because of the definite position of origin, and they are in a finite open shape because of the position of the terminus.

FIGS. 8(A)-8(F) and 9(A)-9(G) show how shapes can "grow" between whole number symmetries. FIG. 9(A) through 9(F) show incremental decrease in symmetry values of m from 4 to 3, and FIGS. 8(A) through 8(F) show incremental increase in values of m from 4 to 5. This also demonstrates how sides bend outwards for triangles (and for zero-angles, one-angles and two-angles) and how sides bend inwards for polygons with m>4.

With the super-formula, shapes may have perfect mathematical symmetry (e.g., rotational, reflection and translational) defined by m. In contrast to previous notions on symmetry groups with integers, the present invention enables non-integer symmetries to be introduced into geometry. Among other things, the super-formula can be used to describe, synthesize and/or analyze, for example, certain existing non-integer symmetries, such as seen in, for example, plant phyllotaxis (e.g., Fibonacci numbers) and in spin quantum numbers of fermions (e.g., as compared to integer spin quantum numbers 0, 1, 2 of bosons, corresponding to zero-, mono- and diagons, respectively).

Accordingly, the super-formula can also be used to describe, categorize, synthesize and/or analyze shapes as set forth in this section.

3. Creating Image Patterns Similar to Various Plants and Other Shapes with the Super-Formula—Square Bamboos, Sea Stars, Horsetails and Other Shapes Super-circular stems (often referred to as tetragonal, square or quadrangular), occur in a wide variety of plants: in Lamiaceae, in *Tibouchina* (Melastomataceae) and in *Epilobium tetragonum*. In culms of the square bamboo *Chimonobambusa quadrangularis* as well as in the culms of most of the other species in the genus, the lower part is super-circular in cross section. Such super-circular (or super-elliptical) shapes are also observed very frequently at the anatomical level. In bamboo culms in longitudinal section, parenchyma cells (long and short) resemble files of building blocks piled upon each other. In cross sections of roots of *Sagittaria* and *Zea mays*, cells try to maximize the available space (at the same time minimizing the intercellular space), by forming super-circles. Almost square or rectangular cells can be observed in algae and in tracheids in pine wood.

The "super-formula" can be used to describe, synthesize and/or analyze these various super-circular shapes seen in nature as well as a wide variety of other natural forms with higher rotational symmetries. The arguments determine the number of "corners" (and thus rotational symmetries), the absolute values of $n_1$, as well as their ratios allows one to sharpen or soften/flatten corners and to straighten or bend lines connecting the corners (either inward or outward bending). FIGS. 10(A)-10(F) show a number of examples of some naturally occurring shapes (i.e., naturally occurring "super-shapes") that can be described, synthesized and/or analyzed using the "super-formula," including cross-sections of sea stars (FIGS. 10(A)-10(B)), raspberries (e.g. *Rubus sulcatus* and *Rubus phyllostachys*) with pentagonal symmetry (FIG. 10(C), cross-section of horsetails (FIG. 10(D)), stems of *Scrophularia nodosa* with tetragonal symmetry (FIG. 10(E)), cross-section of a petiole of *Nuphar luteum* (European yellow pond lily) (FIG. 10(F)). Other shapes can also be described, synthesized or analyzed with the super-formula, such as that of the algae *Triceraterium favus* (with 'triangular symmetry'), *Pediastrum boryanum*, with 20 'angles', and *Asterionella*. Species of Cyperaceae (cypergrasses) can have triangular, super-circular or pentangular stems in cross section.

The number of rotational symmetries in, for example, horsetails depends on the diameter of the stem and since fertile stems are thicker than vegetative stems, one can find, e.g., octagonal symmetry in vegetative stems of *Equisetum arvense* and 14-gonal symmetry in fertile ones.

Figure 2F:
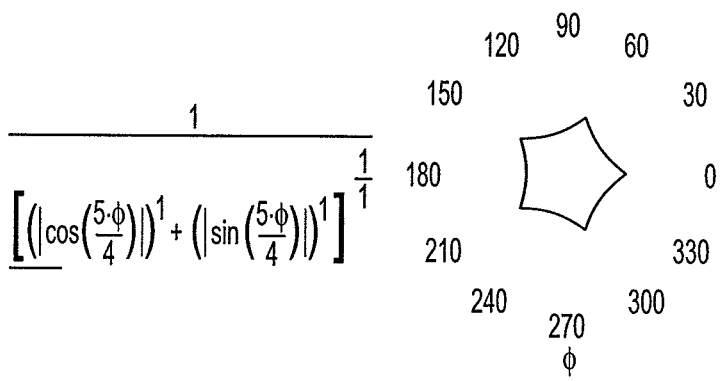
Figure 2G:
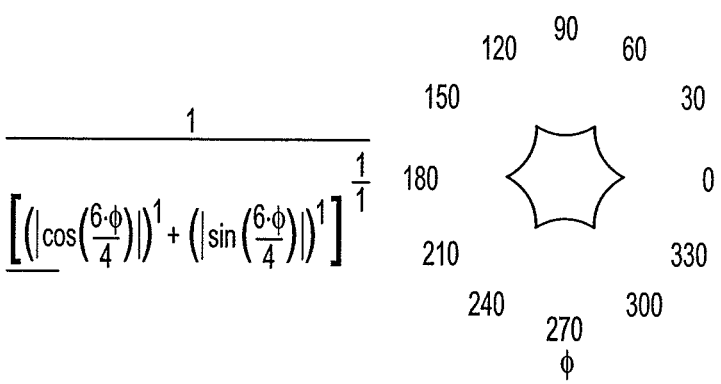
Figure 2H:
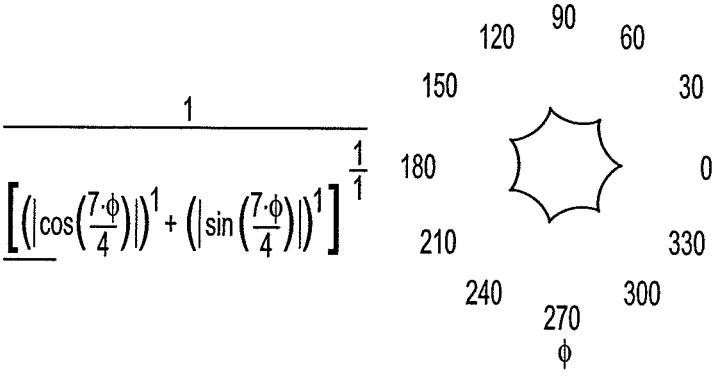
Figure 3A:
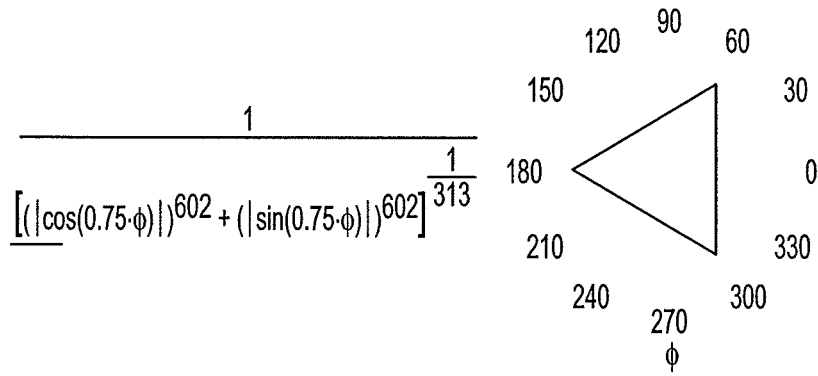
FIGS. 3(A)-3(F) show 2-dimensional images, represented in polar coordinates, demonstrating the creation of straight-sided polygons with the super-formula by appropriate variation of the parameters as shown adjacent to the respective drawings.
Figure 3B:
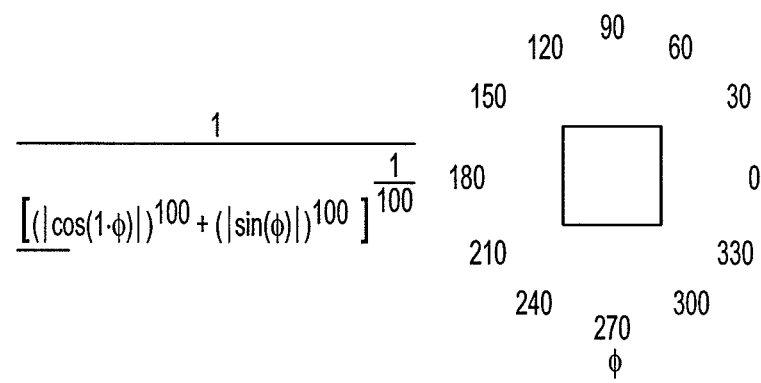
Figure 3C:
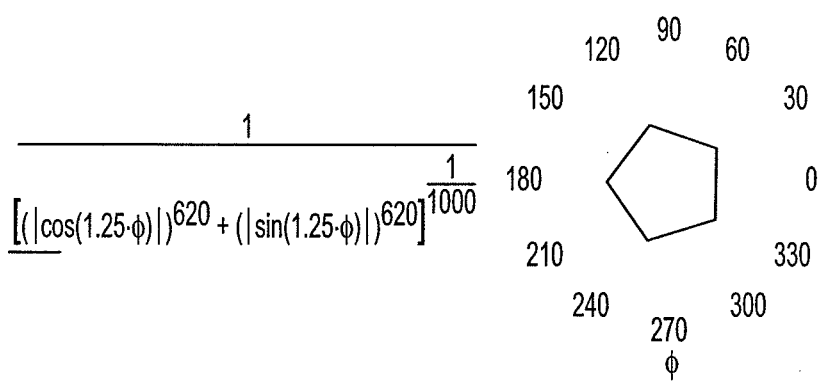
Figure 3D:
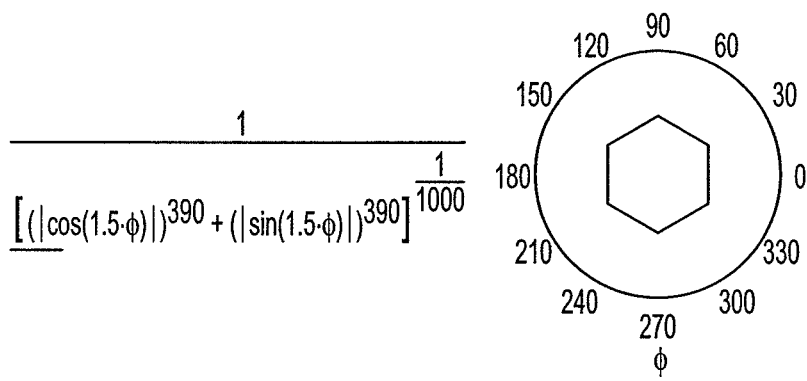
Figure 3E:
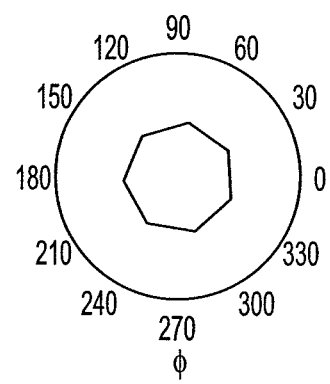
Figure 3F:
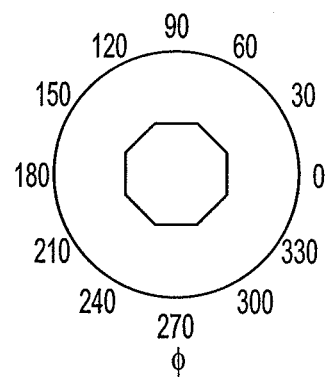
Figure 4E:
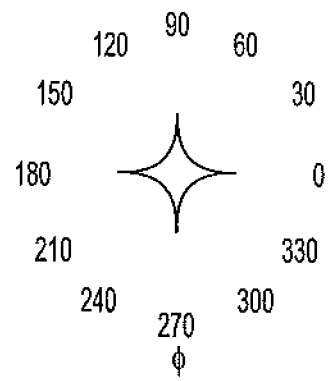
Figure 4F:
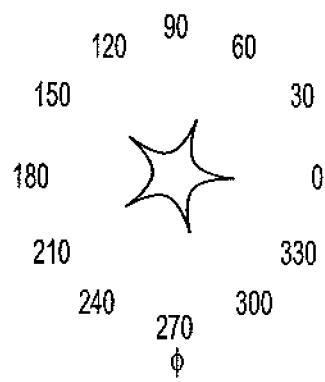
Figure 4G:
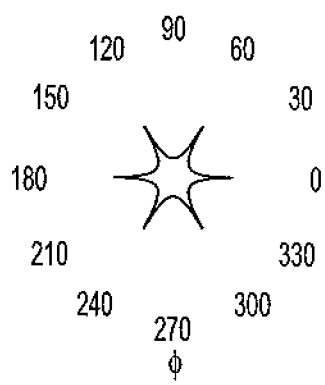
Figure 4H:
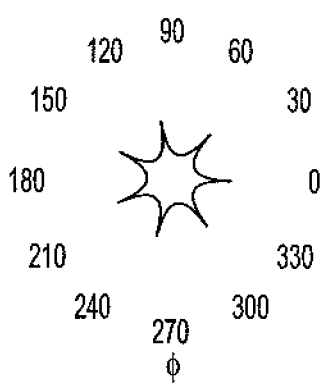
Figure 4I:
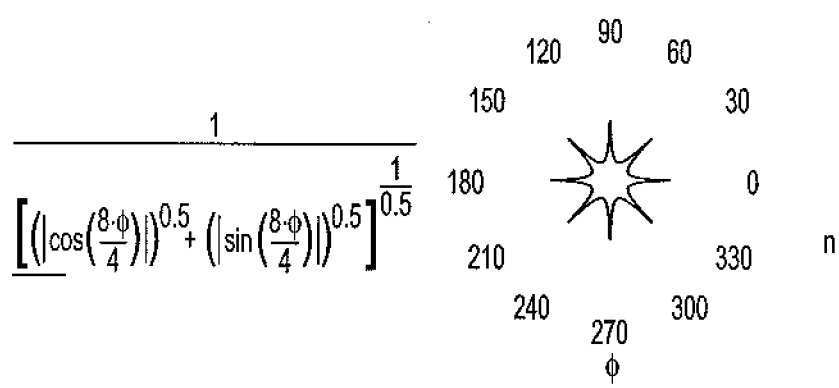
Figure 5G:
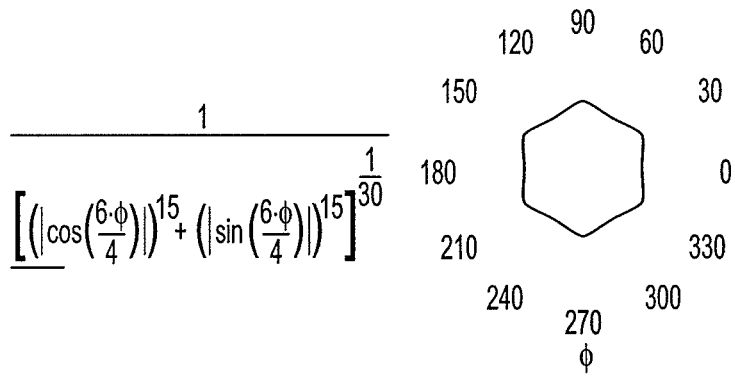
Figure 5H:
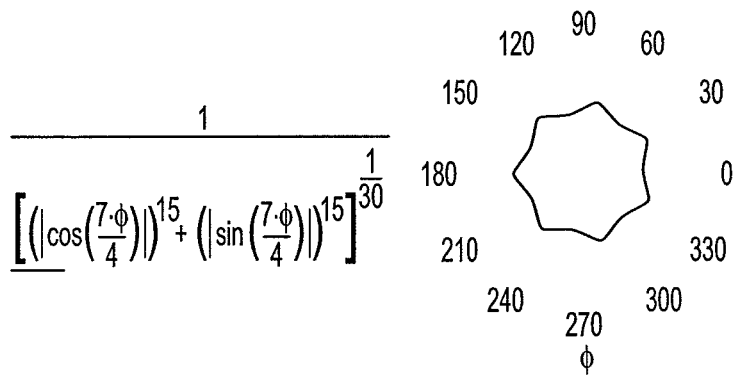
Figure 5I:
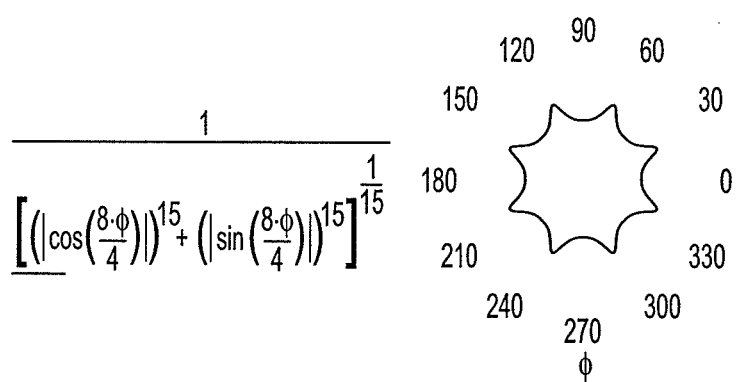
Figure 6A:
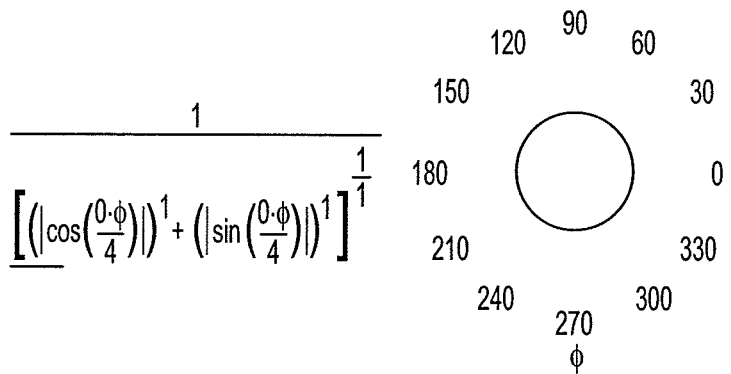
Figure 6B:
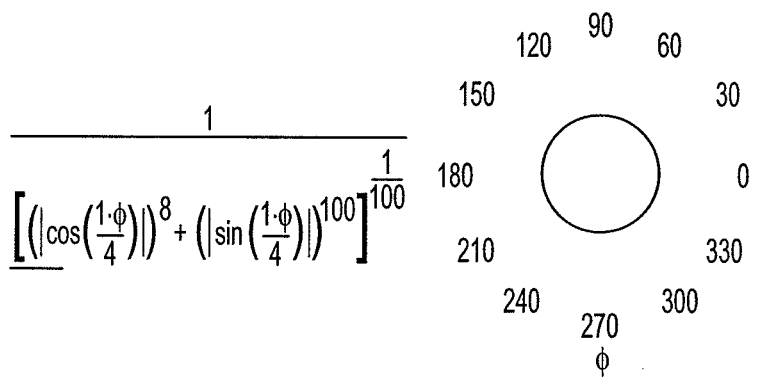
Figure 6C:
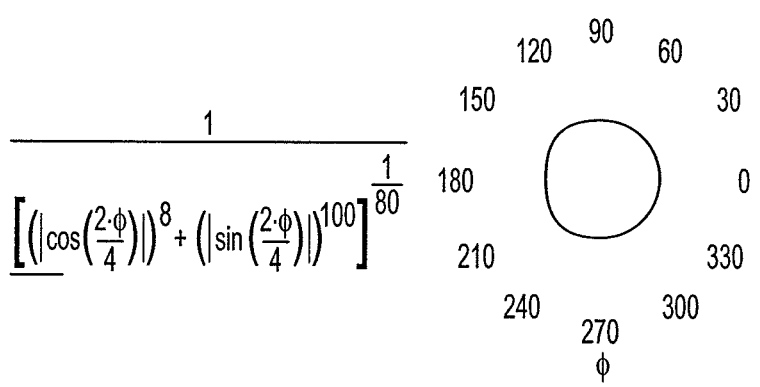
Figure 6D:
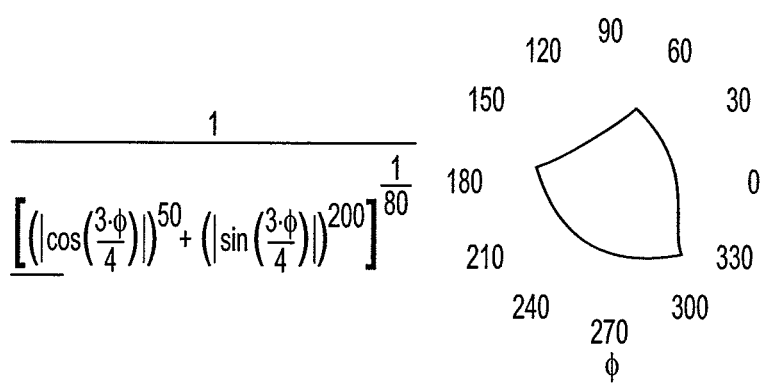
Figure 6I:
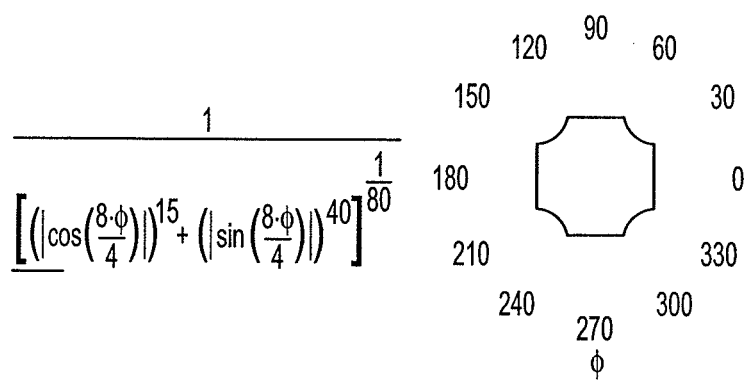
Figure 7E:
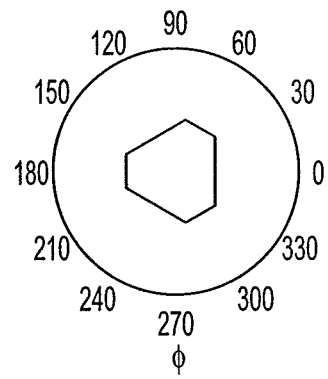
Figure 7F:
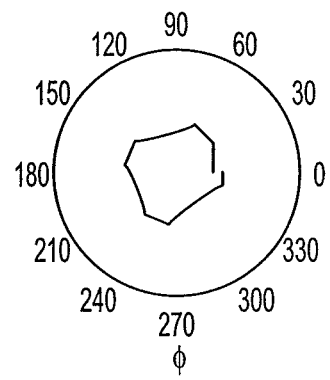
Figure 7G:
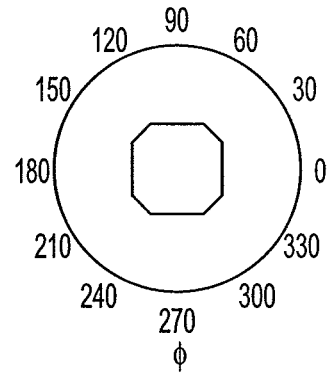
Figure 8A:
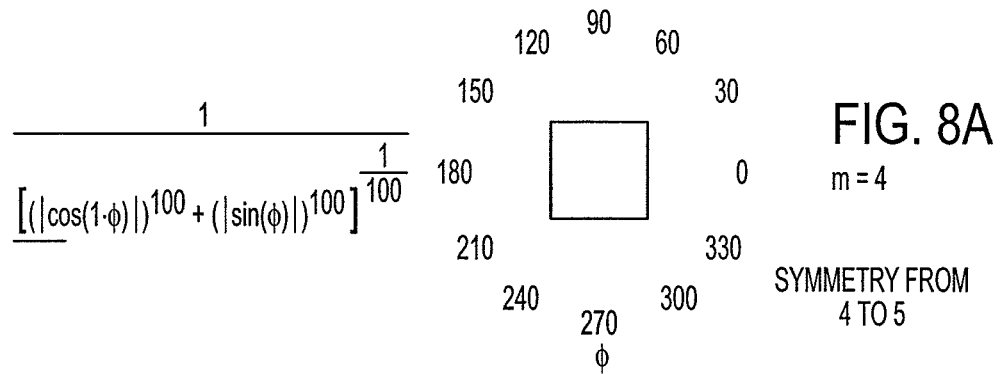
FIGS. 8(A)-8(F) show 2-dimensional images, represented in polar coordinates, demonstrating incremental change in images created when rotational symmetry values change between m=4 and m=5, where $n_1=n_2=n_3=100$.
Figure 8B:
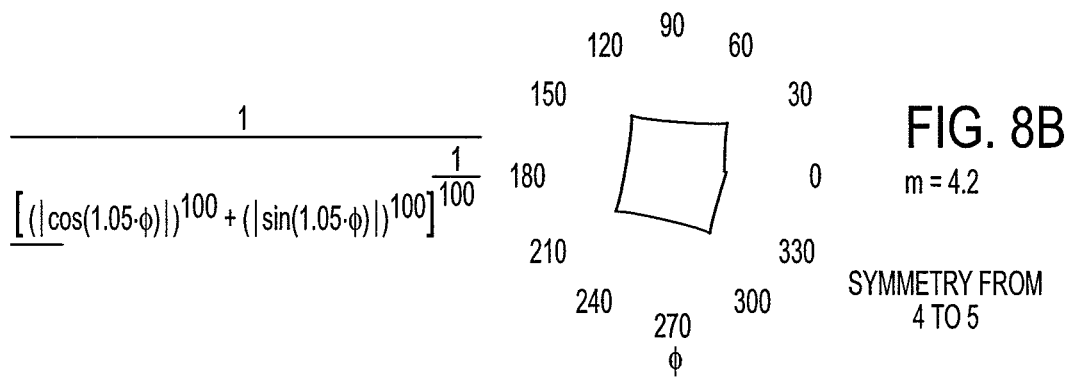
Figure 8C:
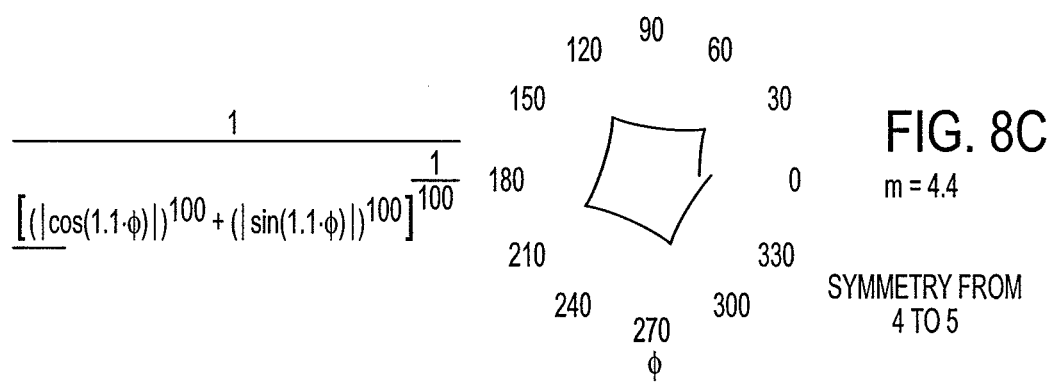
Figure 8D:
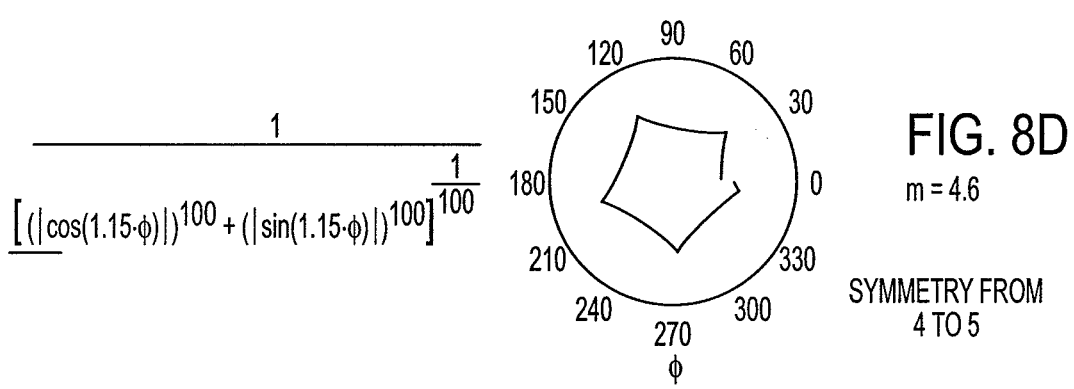
Figure 8E:
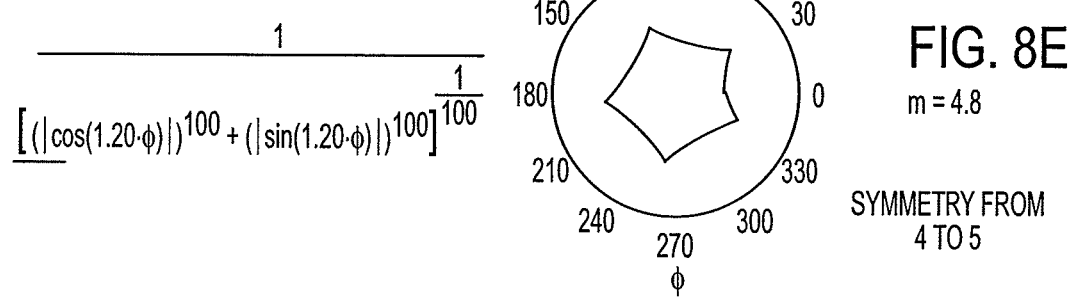
Figure 8F:
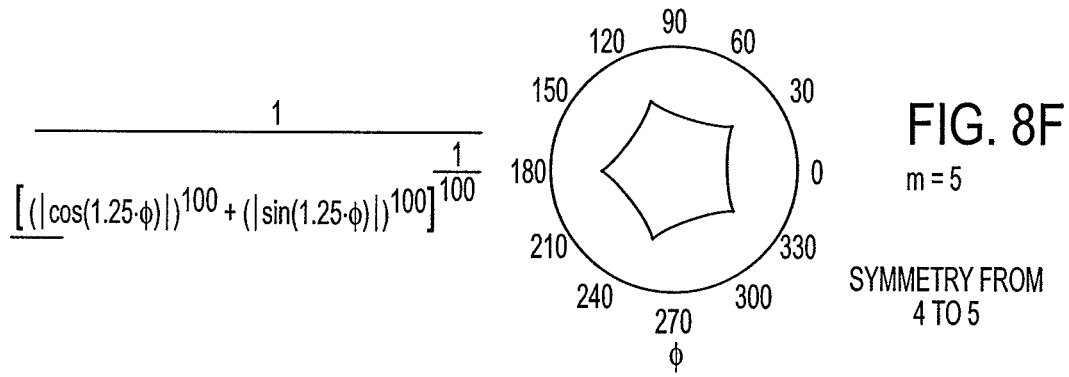
Figure 9A:
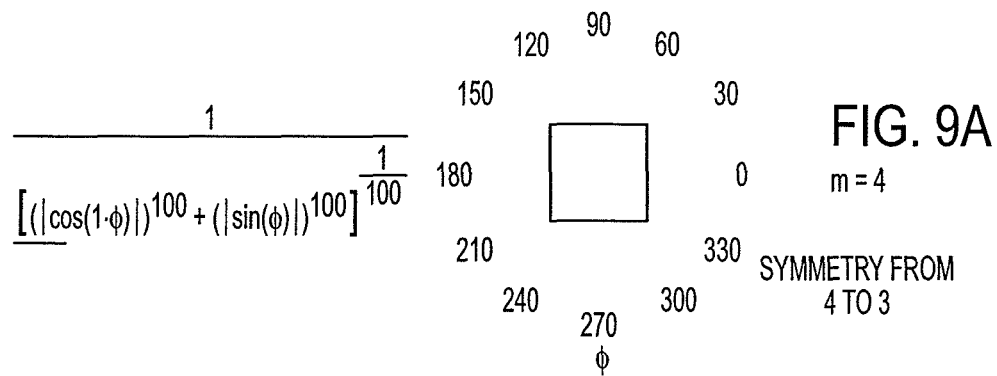
Figure 9B:
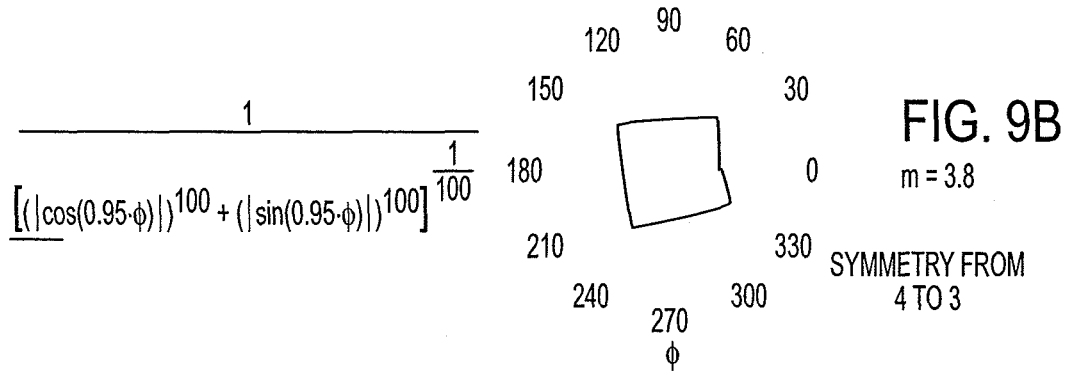
Figure 9C:
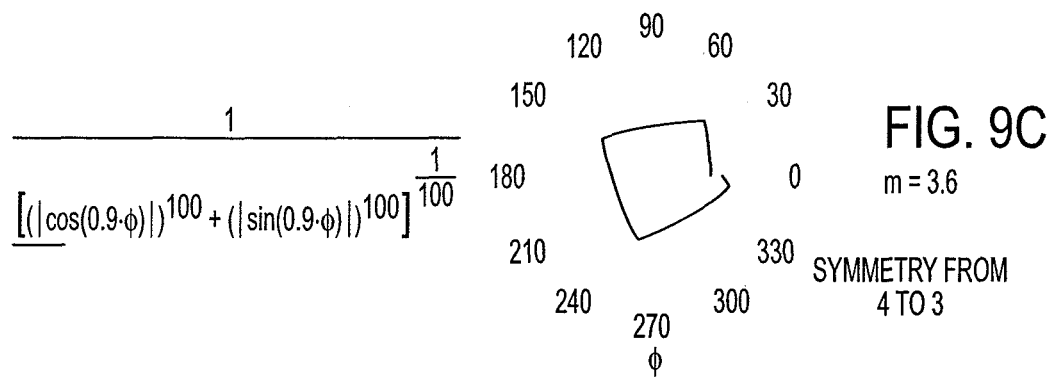
Figure 9D:
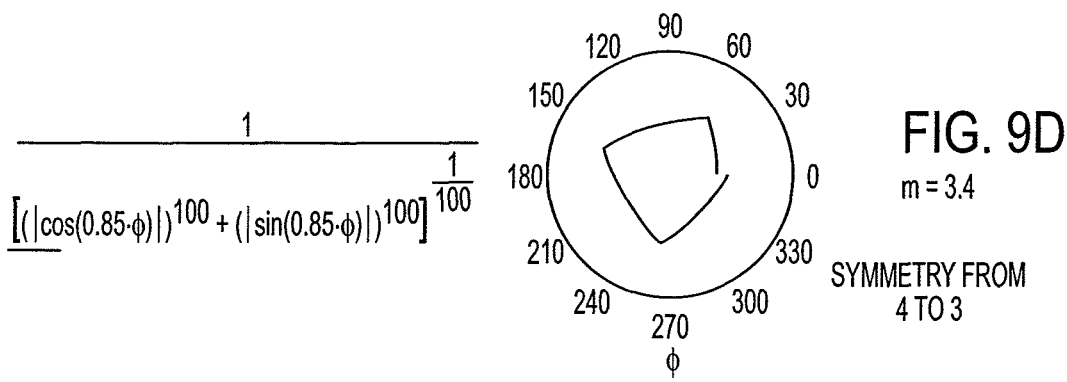

Fruits of many higher plants have similar super-shapes in cross section: in cross-section bananas can have quadragonal symmetry, and fruits of certain varieties of Okra (*Abelmoschus esculentus* Moench) are almost perfect pentagons with inwardly bent sides (see, e.g., FIGS. 2(F) and 5(G)).

In addition to the foregoing, it is noted that corners can also be thought of as points of suspension. An exemplary 1-angle super-shape is, e.g., a tear drop (see, e.g, FIGS. 2(B) and 4(B)). Exemplary 2-angle super-shapes include the shapes of human eyes or of knots in trees (see, e.g., FIGS. 2(C) and 4(C)). Circles, as zero angles, have no points of suspension, and thus no discontinuities, and have a constant curvature (see, e.g., FIGS. 2(A) and 4(A)).

Figure 10A:
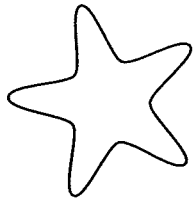
FIGS. 10(A)-10(F) show 2-dimensional images, represented in polar coordinates, demonstrating a variety of natural forms created by the insertion of parameters as per the respective super-formula equations shown.
Figure 10B:
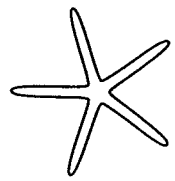
Figure 10C:
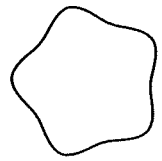
Figure 10D:
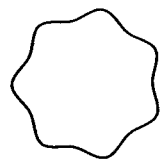
Figure 10E:
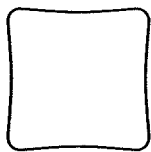
Figure 10F:
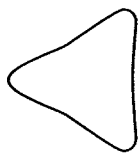
Figure 11A:
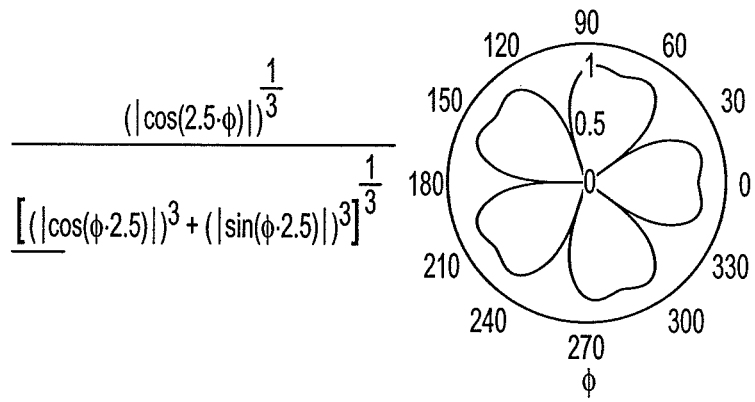
FIGS. 11(A)-11(E) show 2-dimensional (flower-like) images, represented in polar coordinates, created by the insertion of parameters as per the respective super-formula equations shown.
Figure 11B:
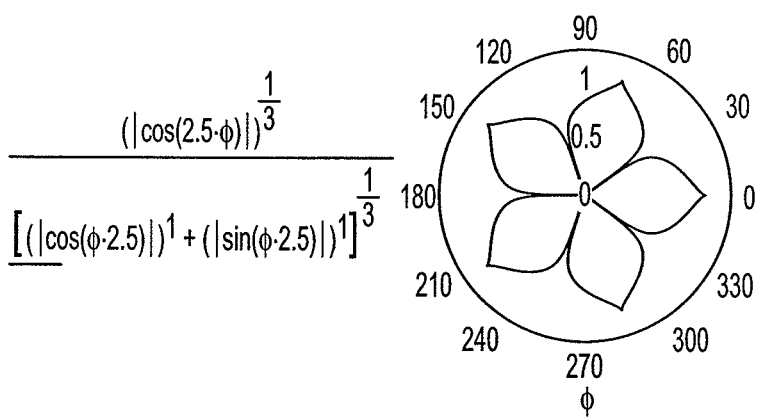
Figure 11C:
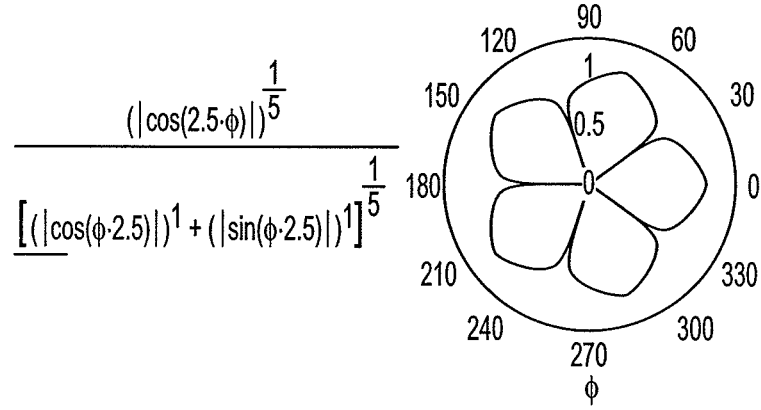
Figure 11D:
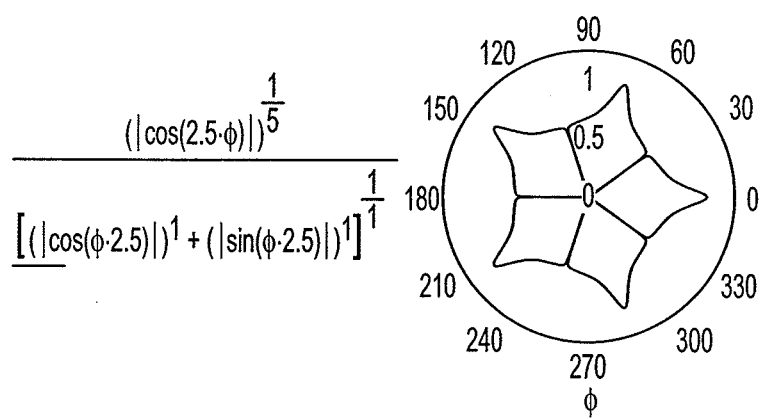
Figure 11E:
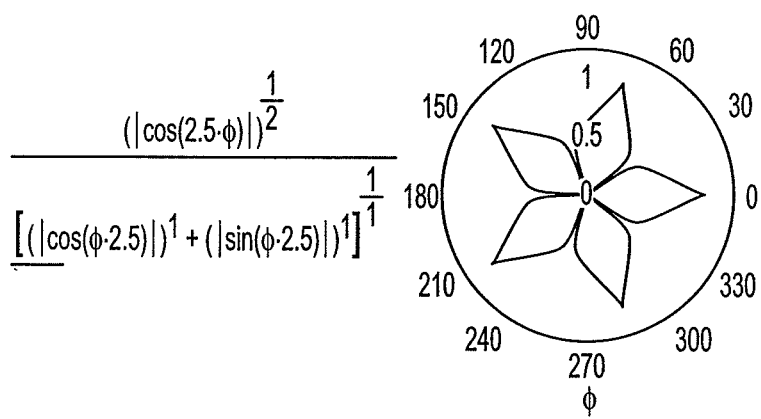
Figure 12A:
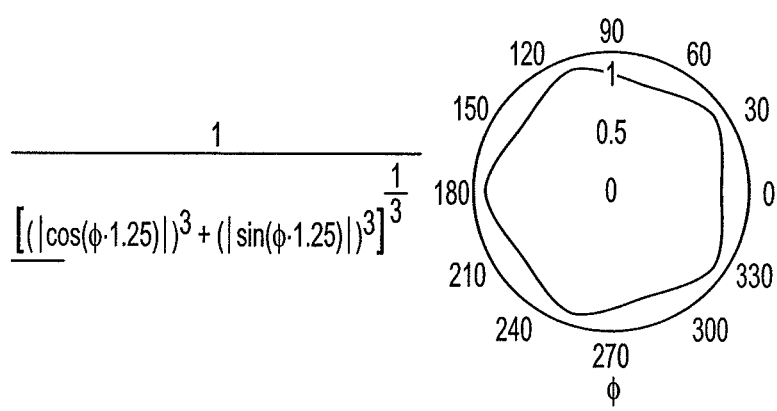
FIGS. 12(A)-12(E) show 2-dimensional (polygonal) images, represented in polar coordinates, created by the insertion of parameters as per the respective super-formula equations shown. The polygons shown in FIGS. 12(A)-12(E) are, in respective order, the polygons in which the flower-like images shown in FIGS. 11(A)-11(E) are inscribed.
Figure 12B:
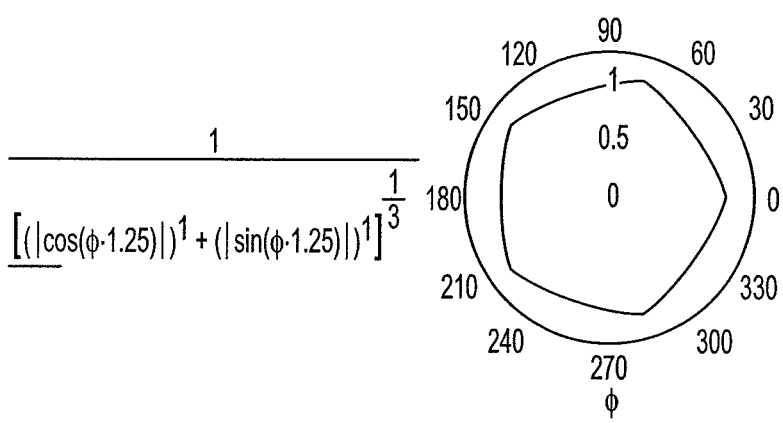
Figure 12C:
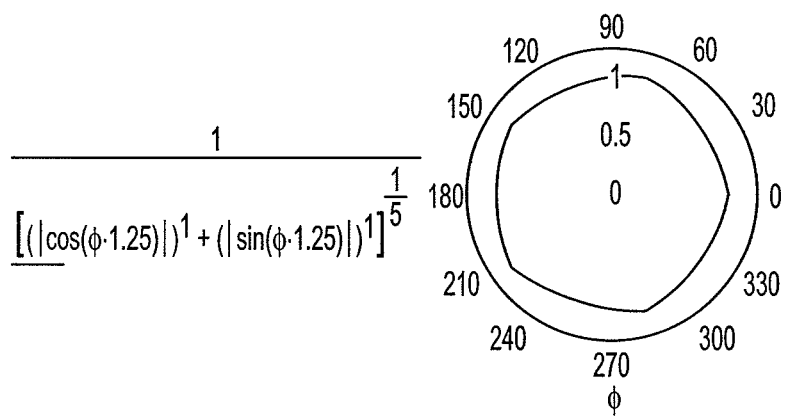
Figure 12D:
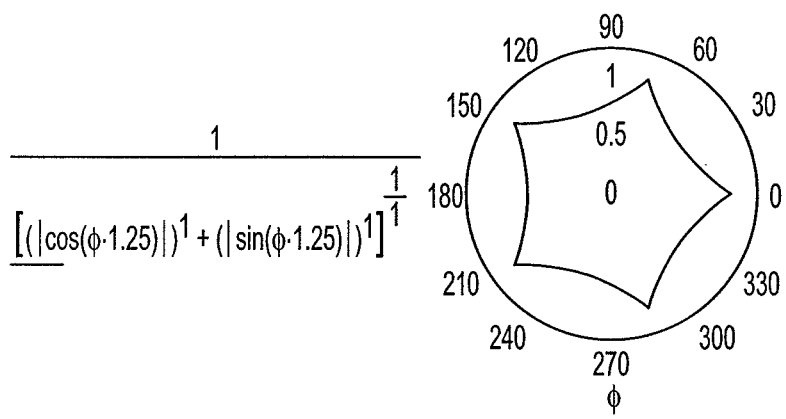
Figure 12E:
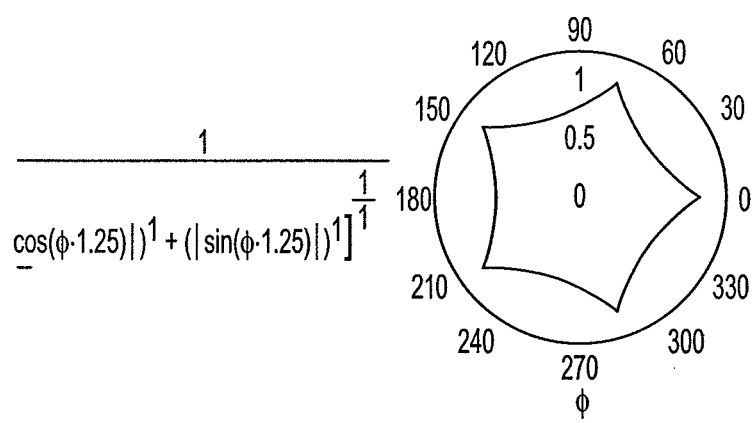

When the inward folding of the sides is more pronounced, shapes of seastars may be obtained (see, e.g., FIGS. 10(A) and 10(B)). After the initial larval stage with bilateral and left/right symmetry, sea stars (Asteroidea) and other species of Echinodermata, develop in the adult stage with radial symmetry. Most examples are chosen herein from living organisms, but examples can be found throughout the natural world, such as in, as one of many examples, crystallography.

Many of the "abstract" shapes generated by the super-formula and shown in the accompanying FIGS. are found throughout nature. For instance, hexagons are ubiquitous in nature, most often associated with efficient use of space: in honeycombs, in insect's eyes, in species of the algae genus *Hydrodictyon*, in the duckweed *Wolfiella floridana* (Lemnaceae) and in sporangia of *Equisetum* species. While a perfect circumscribing square with flat sides can be obtained as a limit shape when the exponent n approaches infinity, squares that are nearly visually perfect are already obtained for exponents higher than 10 (see, e.g., FIG. 1(P)). Similarly, with respect to m-gons, nearly perfect m-gons can be obtained for exponents $n_1=100$ (for a given ratio of $n_1/n_{2=3}$).

Notably, in living organisms, the corners always tend to be rounded. The polygons observed in nature are typically only approximations and not "perfect" polygons.

In addition, the super-formula can also be used to create shapes having some sides that are straight (or curved) in one direction, while other sides that are bent in another direction by modulating the values of $n_2$ and $n_3$ (see, e.g., illustrations shown in FIG. 6). In nature such forms can be observed in epidermal cells in leaves of plants, in algae (e.g. *Oscillatoria* spp.) and in hyphae of fungi (FIG. 6(E)).

Accordingly, the super-formula has particular advantages in applications describing, categorizing, synthesizing and/or analyzing a variety of shapes and notably a variety of shapes as found in nature.

4. Applying the Super-Formula to Shells, Spiders and Almost Everything Else

The relation of the logarithmic spiral ($r=e^{a\theta}$) to the Golden Ratio, has been well documented. The logarithmic spiral is "inscribed" in a Golden Rectangle, and an apparent rotational symmetry of four (spiral symmetry) is observed.

Using the "super-formula" as an operator on the original formula enables one to visualize a similar relation directly, since for values of n that are large the super-log-spiral approximates the Golden Rectangle (see FIG. 15(B)).

The logarithmic spiral, originally described by Descartes, is considered to be one of the most perfect mathematical geometrical objects, since it allows objects to grow without changing their overall form. This has helped to describe spiral-like forms in nature, such as in phyllotaxis of plants and in shells of mollusks, with Nautilus as the classical example. However, many shells with a so-called logarithmic spiral design do have apparent rotational symmetries. The varices and combs in many species, associated with discontinuous growth of the shells, are demonstrations of this (see FIG. 15(C)), and these apparent rotational symmetries may reflect discontinuous development.

Furthermore, a true logarithmic spiral is only obtained for n=2. However, for the symmetries to show up, values of $n_{2=3}$ should be different from 2. Clearly, many shells with periodic growth do not exhibit perfect logarithmic spirals. Instead, they are natural objects with defined symmetries (and undefined values of $n_1$). In contrast, shells growing continuously (e.g., snails) show no such apparent rotational symmetries. Similar apparent rotational symmetries occur during the development of leaves or floral organs from apical meristems in plants. This process involves well defined periodic outgrowth of lateral organs, by biophysical and physiological transduction mechanisms.

Figure 15D:
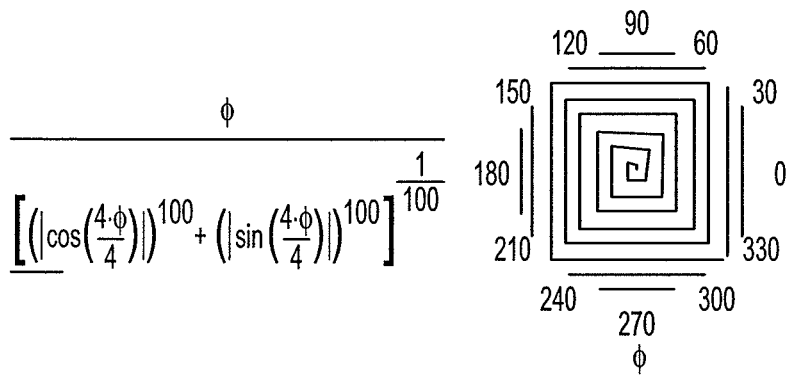
FIGS. 15(D)-15(F) show 2-dimensional (spiraled) images, represented in polar coordinates, created by the insertion of parameters as per the respective super-formula equations shown—with the super-formula operator acting on the spiral of Archimedes ($r=a\phi$).

The combination of the super-formula with the spiral of Archimedes ($r=a\phi$), also causes this spiral to grow towards its circumscribed "open rectangular frame" (4 apparent rotational symmetries) for n>>2 (see FIG. 15(D)). Notably, a single parafine crystal grows around a screw dislocation exactly in such square spiral.

Figure 15E:
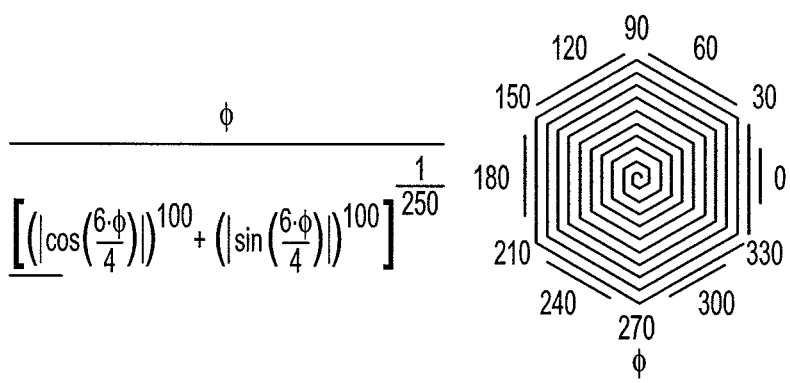
Figure 15F:
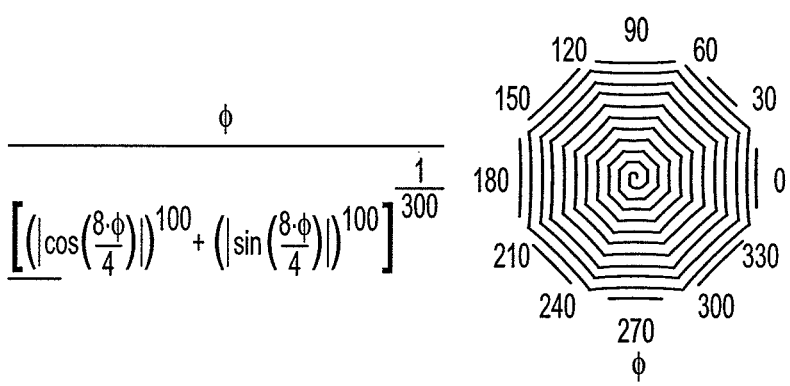

By increasing the number of apparent rotational symmetries, both the simplicity and the beauty of planar spider webs can be visualized and appreciated. As illustrated by the super-formula, like flowers, many spiders webs are mathematically simple. FIG. 15(E) illustrates spider-web like super-shapes; spiders weave their webs in spiral-like fashion, evolving either gradually inwards or gradually outwards. The number of (apparent) rotational symmetries is defined by the points of attachment of the main "wires." In spiders, this is also species dependent.

In geometry, a general definition of a spiral is any geometrical shape defined by $r=f(\phi)$. It thus includes all shapes described in this article so far, as well as all other 2-D shapes defined by $r=f(\phi)$. Accordingly, both the "super-formula" proper, as well as its use with other "spirals," lead in a very natural way (since its origin is found in natural objects) to a generalization of geometry with all known "spirals"—with circles and ellipses being only very special cases (for $n_{2,3}=2$). An infinite number of "super-spirals" is thus defined, and the "super-formula" transforms into a super-spiral formula as follows.

$$r = f(\phi) / \left| \Box \right|_j$$

Accordingly, the super-formula has particular advantages in applications (as discussed below) describing, categorizing, synthesizing and/or analyzing a variety of spiraled shapes, including such found in nature, as discussed above.

5. Moderating Exponents within a Range without Greatly Altering the General Forms of Super-Shapes One notable aspect of the super-formula, in contrast to prior geometrical concepts (i.e., with perfect circles and squares), is that it is possible to moderate the exponents of the super-formula. This moderation can be used to demonstrate for example growth in nature, such as plant growth, etc. Because organs of plants grow individually by means of meristems, the original developmental program is modified in various ways, such as by environmental circumstances or internal constraints. In this respect, the geometry presented by the "super-formula" inherently allows for small modifications of the formula. For example, it is relatively unimportant whether the exponent $n_i$ is 2 or, for example, 1.996788 or 2.000548. These small differences would not be visually observable. However, small, seemingly unnoticeable differences, may create opportunities for plant growth, etc. For example, a difference of 0.1% in area may be very important in absolute values.

This principle can be seen, for example, by reference to FIGS. 11(A)-11(E) which illustrate how moderation of a cosine function can create differences in shape. By slightly moderating the exponent $n_i$ in the denominator of super-formula, a variation in leaf-like shape can be visualized. The triangular leaves of *Sagittaria* turn out to be remarkably simple and these various shapes (demonstrated, for example, in FIGS. 29(A)-29(D)), either rounder or sharper, can be found in even just one plant. So, while the basic shape is laid down in the hereditary material, individual leaves can still differ from other leaves of the plant. In addition to leaves, other organs of plants or other organisms may vary in shape in a similar manner. And, the range of potential variation (i.e., the range of the potential exponent values) may vary, e.g., be larger or smaller, depending on the particular organs/organisms.

While this exponent moderation allows for adaptive growth, it is also highly important from a conceptual point of view because in reality exact exponents and exact models do not really exist. For example, abstract objects such as circles are not found in the real world since the condition $n_{2,3}=2$ is never really exactly met. In contrast, circular objects in nature may easily adopt a value of $n_{2,3}$ within a close enough range, such as for example from 2.0015 to 1.9982 without visually departing from the circular shape. Likewise, plants with square stems do not achieve angles of precisely 90°. Values of $n=50$ or even less within the super-formula more closely approximate the real "squareness" in such actual stems. Most organisms prefer slightly rounded corners, like *Triceratium favus* or square bamboos (see, e.g., FIGS. 10(C)-10(F)). In fact, it would be virtually impossible to determine with infinite precision the value of $n_i$.

Along with some freedom to moderate exponents adaptively, there is an inherent robustness. With a hexagon, for example, visually straight sides are obtained for values of $n_i$ ranging from about 38 up to 42, for $n_1=100$. The larger the number of rotational symmetries, the smaller the range. Such robustness is important in nature because it allows objects to grow without changing their shape. For example, while a circle is strictly defined by $n_i=2$, in nature as illustrated by the super-formula, the shape is still circular for values of, for example, $n_i=2.075$ or $n_i=1.9875$.

Accordingly, for these reasons also, the super-formula has particular advantages in applications describing, categorizing, synthesizing and/or analyzing such natural shapes and changes therein (e.g., growth of individual organs, shape differences between like organs, etc.).

6. Other Applications of the Super-Formula: Using the Super-Formula to Illustrate, Synthesize and/or Analyze Preferred Shapes for Certain Applications In certain situations, ideal objects are preferred. For example, in isolation (e.g., as seen in soap bubbles floating freely in the air or in drops of mercury) the circle and sphere are considered to be ideal objects having, preferred mathematical properties, such as the least surface area for a given volume.

In many other natural conditions, other shapes, such as super-circles, are preferred. A number of examples are illustrated herein-above. These shapes, at least the symmetrical ones defined by the super-spiral formula, are no less perfect mathematically than a circle or an ellipse. Only, they each have their own set of properties.

The "super-formula" can be used to illustrate, describe, synthesize and/or analyze ideal conditions, such as that achieved in plants and other organisms. A few straightforward examples are now described.

(i) Packing of Circles and Spheres

Circles or spheres can be packed more efficiently in two notable ways. Specifically, the available space can be maximized (i.e., minimizing the area in-between the circles or spheres) by making the circles or spheres approximate either 1) squares or 2) hexagons (i.e., slightly modifying the shapes of the circles or spheres).

In nature, examples of the "super-circular" packing are shown in the cells of plant roots and stems and in some viruses, such as Bromoviruses. In addition, natural examples of hexagonal packing are seen in honeycombs and insects eyes. In these natural systems, it is clear that this strategy enables the optimization of available space (as in plant cells) or the maximization of empty space (as in honeycombs). In both cases, the contact surface is also enlarged (Flachpunkt) effectively avoiding rotation or sliding of super-circles relative to each other. This effect may also have played a role in the evolutionary transition from unicellular to multicellullar organisms.

Alternatively, the same size area that is enclosed by an exact circle can be enclosed within in a super-circle that has a smaller radius than that of the circle. A moderate increase of the exponents $n_i$ in the super-formula can assure a more efficient packing of area in smaller super-circles. Notably, this effect is especially pronounced in three dimensions. In this regard, a decrease in radius of 5%, creating super-spheres enclosing the same volume as the original spheres, would allow the accommodation of, for example, 9261 (21*21*21) super-spheres instead of 8000 (20*20*20) spheres in the some volume.

In this regard, a good equation to calculate area for super-circles and sub-circles can be, for example:

$$A_n = 2R^2 \cdot \int_0^{\Pi/2} \frac{d\phi}{\left(\sqrt[n]{|\cos^n\phi| + |\sin^n\phi|}\right)^2}$$

In addition, a more general formula that can be utilized with respect to all 2-D super-shapes is, for example:

$$A_n = \frac{mR^2}{2} \cdot \int_0^{2\Pi/m} \frac{d\phi}{\left(\sqrt[n1]{\left|\cos\frac{m\phi}{4}\right|^{n2} + \left|\sin\frac{m\phi}{4}\right|^{n3}}\right)^2}$$

(ii) Improving Mechanical Resistance and Super-Shape Packing

Certain shapes that can be described, synthesized and/or analyzed by the super-shape formula may have improved mechanical and other properties. For example, the formation of stems that have super-shaped cross-sections, such as in square bamboos, can greatly enhance resistance against mechanical stresses. In *Chimonobambusa quadrangularis*, the square bamboo and in most other species of that genus, the cross-section of the culm tends to be more or less quadrangular in the lower ⅓ part of the culm, where most mechanical forces act. By increasing exponents in the super-formula, more area is created for a given radius R. Investing in this area yields a large return in terms of increased resistance against bending, as can be determined by the moment of inertia I.

Increasing the exponent n to 5, for example, increases the area for a given radius by 21%, but the resistance against bending is enlarged by 51%. Note that this calculation is for isotropic materials only, but the effect will actually be even more pronounced in many living materials because strongest parts of the culms and stems are typically on the outer sides—e.g., such as the increased proportion of fibres in bamboo or the extra collenchym in ribs of stems of Lamiaceae. Since leaves, and certainly petals and sepals, are planar, it is also important to note that because of the efficient space filling, the momentum exerted by the lobes on the point of attachment with the stem is much less than if the same area would be described by lobes inscribed in a circle (n=2).

In this regard, a good equation to calculate moment of inertia for super-circles and sub-circles can be, for example:

$$I_{polar} = R^4 \cdot \int_0^{\Pi/2} \frac{d\phi}{\left(\sqrt[n]{|\cos^n\phi| + |\sin^n\phi|}\right)^4}$$

C. Preferred Applications of the Super-Formula

The super-formula can be utilized in a variety of applications, including that wherein patterns are synthesized or analyzed. As noted, the formula can be used in the synthesis and/or analysis of object shapes or of waves (e.g., sound waves or electromagnetic waves) and it can be used in a variety of coordinate-systems (whether in polar coordinates, in spherical coordinates, in parametric coordinates, etc.) and in a variety of dimensions (e.g., 1-D, 2-D, 3-D, etc.). For example, the super-formula can be used to reproduce and/or to analyze, describe, or explain various natural patterns and/or man-made patterns. As noted, it can also be used in calculating optimizations and the like.

The super-formula has particular usefulness in computer applications (i.e., in applications utilizing a controller of some sort). The terminology computer or controller is used herein to identify any device that can compute—especially, an electronic machine that performs high-speed mathematical or logical calculations or that assembles, stores, correlates, or otherwise processes and information derived from data. Some exemplary computers include: personal computers, mainframe computers, host computers, etc. In addition, the terminology computer as used herein encompasses single computers and plural computers, e.g., where plural computers together perform the necessary tasks. The terminology computer thus also encompasses computers accessed via the internet or via various on-line systems or communications systems; the present invention clearly has substantial benefits in these environments in applications ranging from the creation of company logos and various images for Internet websites, to remote applications of various embodiments described herein, etc.

It will be apparent to those in the art based on this application that the present super-formula can be applied with existing software and/or technology into a variety of environments. It is also contemplated, as should be understood based on this disclosure, that the super-formula can be applied, e.g., programmed, in computer applications in a variety of ways—as some examples, the programming can be contained on any known computer readable medium, such as a hard drive, CD-ROM, diskette, etc., can be downloaded on-line, such as over the Internet, over an Intranet or the like, etc. The super-formula can be used, for example, by those in the art in any appropriate application of pattern synthesis and/or analysis known in the arts.

The super-formula can be used as a novel "operator" which can create a variety of images and patterns and which can be used to modify various functions in unique ways. For certain values of the parameters of the formula, well known shapes can be generated, such as circles, ellipses and various polygons, etc.

When operating on different functions, such functions may not be modulated if the value of the operator is one. Accordingly, well known functions such as circles, cosines and sines, and spirals are unchanged. In fact, the operation of the operator for a value 1 comes down to the operation of the identity element, more specifically to multiplying the function by 1. Herein-above, the linear operator (i.e., the super-formula or super-operator) has been defined in 2-D and it has been given the symbol:

In 2-D, the operator allows one to moderate any given function—such as constant functions, trigonometric functions, spiral functions, etc., some examples of which are shown in FIGS. 11(A)-11(E), 13(A)-13(B), 14(A)-14(C), 15(A)-15(F), etc.

The operator enables one to classify a wide range of objects observed in nature and mathematics—with a single formula.

When the operator acts on constant functions, circles and polygons having straight or bent sides and/or sharp or rounded corners can all be created from the operation of the operator on such constant functions.

When the operator acts on trigonometric functions, a variety of other shapes can be created. As some examples, FIGS. 11(A)-11(E) show a variety of flower-like shapes with basically the same fivefold rotational symmetry which can be created, wherein the only real difference is the value of the operator. Geometrically, the operations shown in FIGS. 11(A)-11(E) can be understood as a trigonometric functions inscribed in a pentagon which is defined by the operator (see FIGS. 12(A)-12(E), respectively).

When expressed in XY coordinates, it is easy to see how the operator can also be used to moderate wave-like functions, see, e.g., FIGS. 14(A)-14(C).

Given that all of these shapes can be described as the product of the function with the operator, it is also possible to quantify certain parameters, such as perimeter, surface area, moment of inertia, etc., by the process of integration. This type of quantification also allows one to estimate quantitatively "efficiency," such as efficiency of a space filled by flowers in the circumscribed polygon (see FIGS. 11-12), as compared to space filling in, e.g., a circle, where this efficiency would be very poor. This also enables the estimation of space use efficiency in larger arrays of objects, such as in an array of super-circles.

The present invention has particular applicability within a computer in two general processes (1) the "synthesis" of patterns (e.g., image shapes or waves) in a computer by using parameters as input and (2) the "analysis" of such patterns with the determination of such parameters.

I. SYNTHESIS

Figure 16:
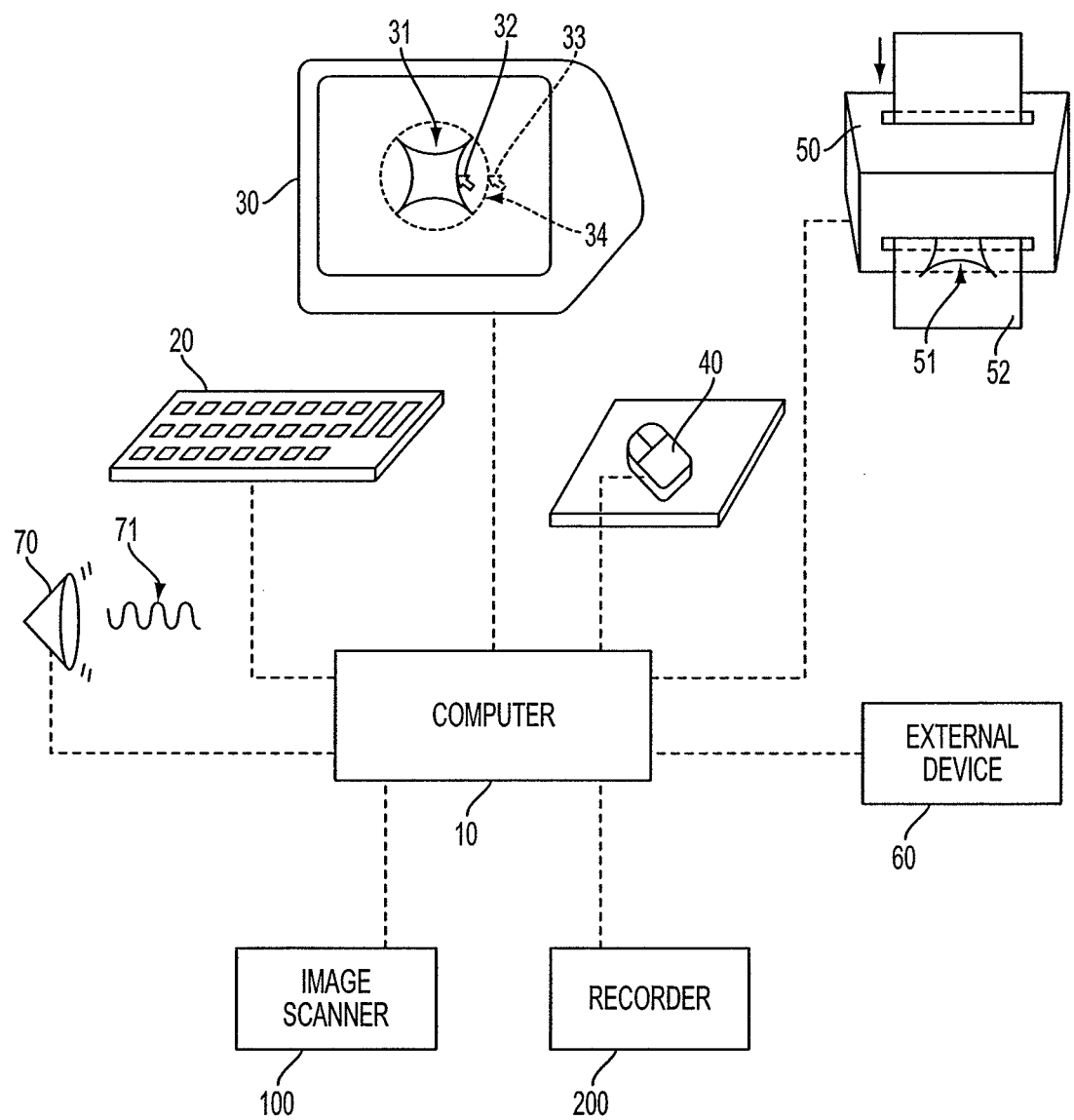
FIG. 16 is a schematic diagram showing various components that can be included in various embodiments for the synthesis of patterns and/or for the analysis of patterns with the super-formula operator.

According to the first aspect, for illustrative purposes with reference to FIG. 16, shapes or waves can be "synthesized" by the application of the following exemplary basic steps:

In a first step, a choice of parameters is made (e.g., by either inputting values into the computer 10, i.e., via a keyboard 20, a touch screen, a mouse-pointer, a voice recognition device or other input device or the like, or by having the computer 10 designate values), and the computer 10 is used to synthesize a selected super-shape based on the choice of parameters.

In a second optional step, the super-formula can be used to adapt the selected shapes, to calculate optimization, etc. This step can include use of graphics programs (e.g., 2D, 3D, etc.); CAD software; finite element analysis programs; wave generation programs; or other software.

In a third step, the output from the first or second step is used to transform the computerized super-shapes into a physical form, such as via: (a) displaying the super-shapes 31 on a monitor 30, printing the super-shapes 51 upon stock material 52 such as paper from a printer 50 (2-D or 3-D); (b) performing computer aided manufacturing (e.g., by controlling an external device 60, such as machinery, robots, etc., based on the output of step three); (c) generating sound 71 via a speaker system 70 or the like; (d) performing stereolithography; (e) performing rapid prototyping; and/or (f) utilizing the output in another manner known in the art for transforming such shapes.

Various computer aided manufacturing ("CAM") techniques and products made therefrom are known in the art and any appropriate CAM technique(s) and product(s) made can be selected. As just some examples of CAM techniques and products made therefrom, see the following U.S. patents (titles in parentheses), the entire disclosures of which are incorporated herein by reference: U.S. Pat. No. 5,796,986 (Method and apparatus for linking computer aided design databases with numerical control machine database); U.S. Pat. No. 4,864,520 (Shape generating/creating system for computer aided design, computer aided manufacturing, computer aided engineering and computer aided technology); U.S. Pat. No. 5,587,912 (Computer aided processing of three dimensional, objects and apparatus therefor); U.S. Pat. No. 5,880,962 (Computer aided processing of 3-D objects and apparatus thereof); U.S. Pat. No. 5,159,512 (Construction of Minkowski sums and derivatives morphological combinations of arbitrary polyhedra in CAD/CAM systems).

Various stereolithography techniques and products made therefrom are known in the art and any appropriate stereolithographic technique(s) and product(s) made can be selected. As just some examples of stereolithographic techniques and products made therefrom, see the following U.S. patents (titles in parentheses), the entire disclosures of which are incorporated herein by reference: U.S. Pat. No. 5,728,345 (Method for making an electrode for electrical discharge machining by use of a stereolithography model); U.S. Pat. No. 5,711,911 (Method of and apparatus for making a three-dimensional object by stereolithography); U.S. Pat. No. 5,639,413 (Methods and compositions related to stereolithography); U.S. Pat. No. 5,616,293 (Rapid making of a prototype part or mold using stereolithography model); U.S. Pat. No. 5,609,813 (Method of making a three-dimensional object by stereolithography); U.S. Pat. No. 5,609,812 (Method of making a three-dimensional object by stereolithography); U.S. Pat. No. 5,296,335 (Method for manufacturing fiber-reinforced parts utilizing stereolithography tooling); U.S. Pat. No. 5,256,340 (Method of making a three-dimensional object by stereolithography); U.S. Pat. No. 5,247,180 (Stereolithographic apparatus and method of use); U.S. Pat. No. 5,236,637 (Method of and apparatus for production of three dimensional objects by stereolithography); U.S. Pat. No. 5,217,653 (Method and apparatus for producing a stepless 3-dimensional object by stereolithography); U.S. Pat. No. 5,184,307 (Method and apparatus for production of high resolution three-dimensional objects by stereolithography); U.S. Pat. No. 5,182,715 (Rapid and accurate production of stereolithographic parts); U.S. Pat. No. 5,182,056 (Stereolithography method and apparatus employing various penetration depths); U.S. Pat. No. 5,182,055 (Method of making a three-dimensional object by stereolithography); U.S. Pat. No. 5,167,882 (Stereolithography method); U.S. Pat. No. 5,143,663 (Stereolithography method and apparatus); U.S. Pat. No. 5,130,064 (Method of making a three dimensional object by stereolithography); U.S. Pat. No. 5,059,021 (Apparatus and method for correcting for drift in production of objects by stereolithography); U.S. Pat. No. 4,942,001 (Method of forming a three-dimensional object by stereolithography and composition therefore); U.S. Pat. No. 4,844,144 (Investment casting utilizing patterns produced by stereolithography).

Moreover, the present invention can be used in known microstereolithographic procedures. For example, the present invention can, thus, be used in the creation of computer chips and other items. Some illustrative articles, the disclosures of which are incorporated herein by reference, are as follows: A. Bertsch, H Lorenz, P. Renaud "3D microfabrication by combining microstereolithography and thick resist UV lithography," Sensors and Actuators: A, 73, pp. 14-23, (1999). L. Beluze, A. Bertsch, P. Renaud "Microstereolithography: a new process to build complex 3D objects," Symposium on Design, Test and microfabrication of MEMs/MOEMs, Proceedings of SPIE, 3680(2), pp. 808-817, (1999). A. Bertsch, H. Lorenz, P. Renaud "Combining Microstereolithography and thick resist IN lithography for 3D microfabrication," Proceedings of the IEEE MEMS 98 Workshop, Heidelberg, Germany, pp. 18-23, (1998). A. Bertsch, J. Y. Jézéquel, J. C. André "Study of the spatial resolution of a new 3D microfabrication process: the microstereophotolithography using a dynamic mask-generator technique," Journal of Photochem. and Photobiol. A: Chemistry, 107, pp. 275-281, (1997). A. Bertsch, S. Zissi, J. Y. Jézéquel, S. Corbel, J. C. André "Microstereophotolithography using a liquid crystal display as dynamic mask-generator," Micro. Tech., 3(2), pp. 42-47, (1997). A. Bertsch, S. Zissi, M. Calin, S. Ballandras, A. Bourjault, D. Hauden, J. C. André "Conception and realization of miniaturized actuators fabricated by Microstereophotolithography and actuated by Shape Memory Alloys," Proceedings of the 3rd France-Japan Congress and 1st Europe-Asia Congress on Mechatronics, Besancon, 2, pp. 631-634, (1996).

Similarly, various rapid prototyping techniques and products made therefrom (e.g., moulds, etc.) are known in the art and any appropriate technique(s) and product(s) made can be selected. For example, three exemplary 3-Dimensional model rapid prototyping methods currently available, include, as described in U.S. Pat. No. 5,578,227, the disclosure of which is incorporated herein by reference: a) photocurable liquid solidification or stereolithography (e.g., see above); b) selective laser sintering (SLS) or powder layer sintering; c) fused deposition modeling (FDM) or extruded molten plastic deposition method. As just some examples of rapid prototyping techniques and products made therefrom, see the following U.S. patents (titles in parentheses), the entire disclosures of which are incorporated herein by reference: U.S. Pat. No. 5,846,370 (Rapid prototyping process and apparatus therefor); U.S. Pat. No. 5,818,718 (Higher order construction algorithm method for rapid prototyping); U.S. Pat. No. 5,796,620 (Computerized system for lost foam casting process using rapid tooling set-up); U.S. Pat. No. 5,663,883 (Rapid prototyping method); U.S. Pat. No. 5,622,577 (Rapid prototyping process and cooling chamber therefor); U.S. Pat. No. 5,587,913 (Method employing sequential two-dimensional geometry for producing shells for fabrication by a rapid prototyping system); U.S. Pat. No. 5,578,227 (Rapid prototyping system); U.S. Pat. No. 5,547,305 (Rapid, tool-less adjusting system for hotstick tooling); U.S. Pat. No. 5,491,643 (Method for optimizing parameters characteristic of an object developed in a rapid prototyping system); U.S. Pat. No. 5,458,825 (Utilization of blow molding tooling manufactured by stereolithography for rapid container prototyping); U.S. Pat. No. 5,398,193 (Method of three-dimensional rapid prototyping through controlled layerwise deposition/extraction and apparatus therefor).

Figure 17:
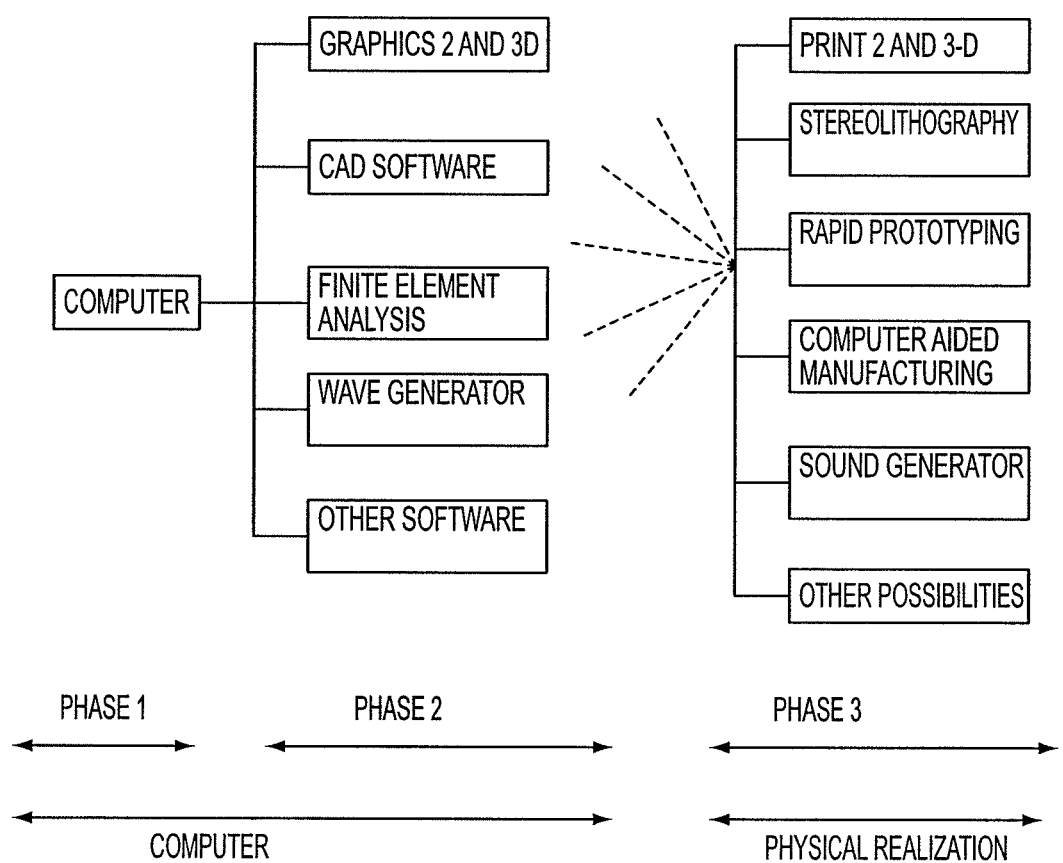
FIG. 17 is a schematic diagram illustrating steps or phases that can be performed in exemplary embodiments involving synthesis of patterns with the super-formula.

The above-noted three steps, or phases, are also schematically illustrated in the schematic diagram shown in FIG. 17 (steps 1 and 2 being capable of being carried out within the computer itself as shown).

In the following sections, a number of exemplary embodiments of pattern "synthesis" with the super-formula are described in further detail.

A. 2-D Graphical Software

The present invention has great utility in 2-D graphic software applications.

The present invention can be applied, for example, in conventional commercial programs such as Corel-Draw™ and Corel-Pain™, Adobe Photoshop™, in various drawing programs in Visual Basic™ or Windows™, or in other environments like, for example, Lotus WordPro™ and Lotus Freelance Graphics™, Visual C™, Visual C++™ and all other C-environments. The present invention has substantial advantages in image synthesis because, among other things, the present approach enables a substantial savings in computer memory space because only the super-formula with classical functions (such as powers, trigonometric functions, etc.) needs to be utilized. In addition, the number of image shapes available with the super-formula is substantially increased beyond that previously available.

Graphics programs (such as Paint in Windows™, drawing tools in Microsoft Word™, Corel-Draw™, CAD, that used in architectural design, etc.) use "primitives" which are shapes programmed into the computer. These are very restrictive, e.g., often limited to mainly circles, ellipses, squares and rectangles (in 3-D, volumetric primitives are also very restricted).

The introduction of the super-formula greatly enlarges by several orders of magnitude the overall possibilities in 2-D graphics (and also in 3-D graphics as discussed below). Used as a linear operator it can operate in many different ways and formulations, whether polar coordinates, etc, and also in 3-D using spherical coordinates, cylindrical coordinates, parametric formulations of homogenized cylinders, etc.

Figure 23A:
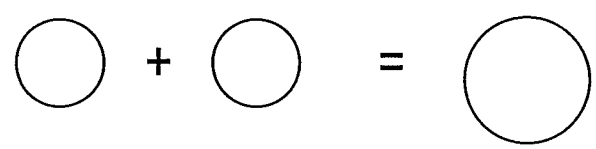
FIG. 23(A) is a schematic diagram illustrating the combination of more than one individual super-shape via the process of super-position.
Figure 23B:
FIG. 23(B) is a schematic diagram illustrating the combination of more than one individual super-shape via the process of reiteration.
Figure 29A:
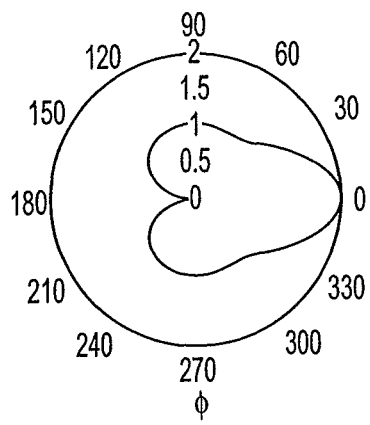
FIGS. 29(A)-29(D) illustrates super-shape variations comparable to various leaves of a *Sagittaria* plant.
Figure 29B:
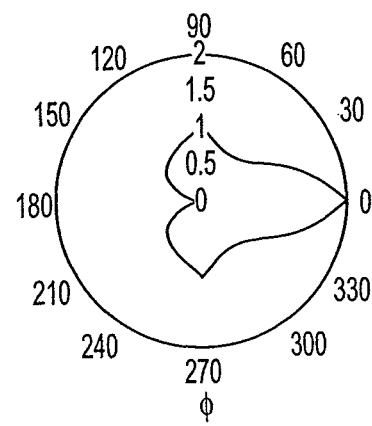
Figure 29C:
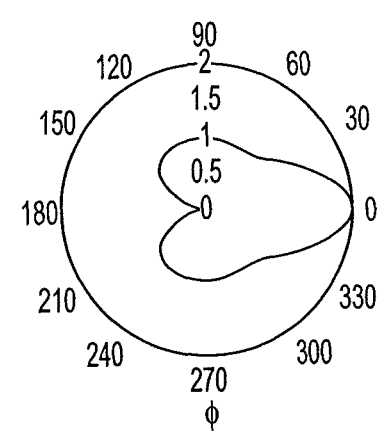
Figure 29D:
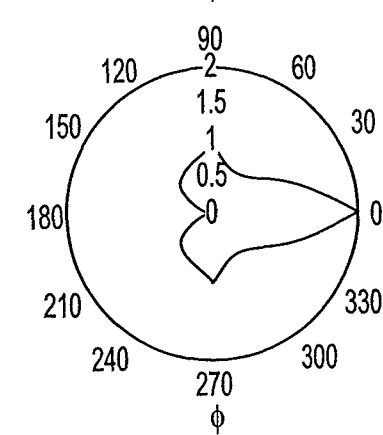

Some exemplary embodiments within 2-D graphics software applications are as follows.

a.1. The computer may be adapted to make plain use of the operator, in for example polar coordinates or in XY coordinates. In this sense, the parameters can be chosen (e.g., by an operator input or by the computer itself) and used as input in the super-formula (e.g., via programming). The individual shapes or objects can be used in any manner, such as to print or display an object, etc.

a.2. The computer may also be adapted to perform operations such as integration to calculate area, perimeter, moment of inertia, etc. In this regard, the computer can be adapted to perform such an operation either by a) selection of such operation via an operator input (e.g., via keyboard 20) or b) adapting of the computer (e.g., via pre-programming) to perform such operations.

a.3. The computer may be adapted (e.g., via software) to: a) display or otherwise present shapes; b) to allow a user to modify such shapes after the display thereof; and c) to display the shape as modified by the user. In this regard, the user can modify the shape by, for example, changing parameters. In an exemplary embodiment, the computer can be adapted to enable shapes that are displayed or otherwise presented (i.e., presented in step three noted above) by physically acting on the physical representation created in step three. In a preferred embodiment, the computer can be adapted to enable shapes that are displayed on a monitor to be modified by pulling out sides and/or corners of the pattern, e.g. image. In that regard, preferably, an image 31 is displayed on a computer screen or monitor 30 and a user can use his hand manipulated "mouse" 40 (or other user-manipulated screen or display pointer device) to place a displayed pointer 32 on the shape to "click" and "drag" the same to a new position 33—thereby moderating the super-shape to assume a new "super-shape" configuration 34. This will also include a recalculation of the formula and parameters.

a.4. The computer may also be adapted to perform operations whereby more than one of the individual shapes generated in a1 or a3 are taken together, either through the process of super-position (algebraic addition, shown schematically in FIG. 23(A)) or through the process of reiteration (shown schematically in FIG. 23(B)). In some cases, individual supershapes that are combined by, e.g., super-position and/or reiteration or the like may be, e.g., sectors or sections that are combinable to create shapes having differing sections or regions (as just one illustrative example, a sector of a circle between, e.g., 0 and $\pi/2$ can be combined with a sector of a square between, e.g., $\pi/2$ and n to create a multi-component shape). The computer may also be adapted to perform additional operations upon the created super-shapes—e.g., to flatten, skew, elongated, enlarge, rotate, move or translate, or otherwise modify such shapes.

B. 3-D Graphical Software

As with 2-D applications, the present invention has great utility in 3-D graphic software applications (as well as in representations in various other dimensions).

The present invention can be applied, for example, in Computer Aided Design ("CAD") software, software for Finite Element Analysis ("FEM"), architectural design software, etc. The present invention allows, for example, one to use single continuous functions, rather than spline functions, for various applications. Industrial applications of CAD include, e.g., use in Rapid Prototyping or in Computer Aided Manufacturing ("CAM"). The present invention enables, among other things, a substantial savings in memory space and in computing power.

Previously, the introduction of "superquadrics" (including superellipsoids, etc.) offered some improved possibilities for graphics programs. But as illustrated below, the super-formula offers vast new possibilities over that available with superquadrics.

The explicit formula, defining vector x for a superellipsoide, for example, is as follows:

$$x(\eta, \omega) = \begin{vmatrix} a_1 & \cos^{\epsilon 1}\eta & \cos^{\epsilon 2}\omega \\ a_2 & \cos^{\epsilon 1}\eta & \sin^{\epsilon 2}\omega \\ a_3 & \sin^{\epsilon 1}\eta & \end{vmatrix},$$

with $-\pi/2 < \omega < \pi/2$ $-\pi = < \omega < \pi$

But here, the number of possible rotational symmetries again is limited to 4 in the orthogonal directions.

On the other hand, the super-formula operates in a different way. It operates on every individual trigonometric function in the explicit function in a same or different way, allowing the introduction of any rotational symmetry and at the same time preserving radius.

The introduction of the super-formula greatly enlarges by several orders of magnitude the overall possibilities in 3-D graphics (and also in 2-D graphics as discussed above). As noted, used as an operator it can operate in many different ways and formulations, whether polar coordinates, spherical coordinates, cylindrical coordinates, parametric formulations of homogenized cylinders, etc.

With the super-formula, a new notation for the superelipsoid may be written as follows:

$$x(\eta, \omega) = \begin{vmatrix} a_1 & \cos^{\epsilon 1}(m_1\eta/4)/\boxed{\phantom{n}}\big|_{j1} & \cos^{\epsilon 3}(m_3\eta/4)/\boxed{\phantom{n}}\big|_{j3} \\ a_2 & \cos^{\epsilon 1}(m_1\eta/4)/\boxed{\phantom{n}}\big|_{j1} & \sin^{\epsilon 4}(m_4\eta/4)/\boxed{\phantom{n}}\big|_{j4} \\ a_3 & \sin^{\epsilon 2}(m_2\eta/4)/\boxed{\phantom{n}}\big|_{j2} & \end{vmatrix}$$

Indices $J_1$ to $J_4$

So, instead of being restricted to superquadrics, any shape can be programmed as a primitive in graphics or CAD programs, etc. While this preceding example deals with matrices, it should be recognized that it may made be in any notation, whether spherical, cylindrical, parametric, etc.

While the super-formula can be used to create 3-D super-shapes defined by the 3-D super-formula, it is also contemplated that other 3-D "super-shapes" can include any shape in which at least a 2-D section is super-shaped according to the 2-D super-formula. In that regard, 3-D "super-shapes" can also include, for example: a) a body of revolution of 2-D super-shape about symmetry points within the 2-D super-shape; b) a body of revolution about any point—e.g., about points outside the 2-D super-shape, etc; c) homogenized cylinders (e.g., generalized cylinders and conics)—e.g., a 2-D super-shape may be extended in 3-D along any line; d) non-homogenized cylinders—e.g., a 2-D super-shape may be extended in 3-D along any line, while at the same time varying the 2-D super-shape (e.g., its size and/or shape) to create a cylinder having a varied shape (this can be, e.g., very useful for the creation of flower vases, ornamental columns, and much more—in these cases, in some preferred examples, the 2-D super-shape is preferably varied continuously to create a smoothly changing outer surfaces); d) combinations of the foregoing; and/or e) any appropriate known means to create 3-D shapes from 2-D shapes. It should be understood that the super-formula can also be generalized in other dimensions and similarly used to create various super-shapes having other dimensions (e.g., 4-D or more).

Some exemplary embodiments within 3-D graphics software applications are as follows.

b.1. The computer may be adapted to make plain use of the operator in the same manner as described above at a.1. In order to utilize the operator in 3 dimensional graphics, the operator is developed in either spherical coordinates or in parametric coordinates. Otherwise, the operation is similar to that with respect to 2 dimensions.

In spherical coordinates, the linear operator can be expanded into three dimensions with $r=f(\phi, \theta)$:

$$r = \frac{l}{\sqrt[l_1]{\left|\frac{1}{d} \cdot \cos\frac{m_1 \cdot \phi}{4}\right|^{l_2} + \left|\frac{1}{c} \cdot \sin\frac{m_2 \cdot \phi}{4}\right|^{l_3}}}$$

where:

$$d = \frac{1}{\sqrt[n_1]{\left|\frac{1}{a} \cdot \cos\frac{m_3 \cdot \theta}{4}\right|^{n_2} + \left|\frac{1}{b} \cdot \sin\frac{m_4 \cdot \theta}{4}\right|^{n_3}}}$$

and with: c as a third shape parameter.

In parametric coordinates, the use of trigonometric functions can be expanded by using modified trigonometric functions—i.e., by a simple action of the operator upon the trigonometric functions.

b.2. The computer may also be adapted to perform the process as set forth in a.2. above, by expanding the same into 3-D (or even into additional dimensions).

b.3. The computer may also be adapted to perform the process as set forth in a.3. above, by expanding the same into 3-D (or even into additional dimensions).

b.4. The computer may also be adapted to perform the process as set forth in a.4. above, by expanding the same into 3-D (or even into additional dimensions).

One exemplary embodiment of a computer program to generate 3-D super-shapes is shown in FIG. 27. The program illustrated in FIG. 27 is a simple program in the programming language BASIC™ which is capable of creating 3-D representations of super-formula shapes. It should be understood that the formula can be readily programmed in any mathematical software available—such as, for example, Mathlab™, Mathematica™ or MathCAD™. In addition, in environments, such as Mathlab™, Mathematica™, MathCAD™, Graphing Calculator of Pacific Tech™, as well as in various of other programs, real time views of changing parameters can be performed. This can also be programmed in any suitable computer language. (As an additional note, the various 2-D illustrations shown in FIGS. 1-15 were created using MathCad 7.0™ of MathSoft International™.) Formulas to calculate perimeter, area, moment of inertia, etc., can be easily introduced into this software (or into any other suitable software as would be understood based on this disclosure).

C. Waveform Generation and Waveform Modulation

The present invention also has substantial utility in the generation of and in the modulation of waveforms—such as sound waveforms, electromagnetic waveforms including, as some examples, light, electricity, etc., and all other waveforms. A few exemplary applications include the use of speaker systems 70, synthesizers or other devices that can be used to create sounds, etc., when coupled to a computer having a wave generating program in which the mathematical form of the wave can be used as input.

Some exemplary embodiments for the generation of sounds (or other waveforms) are as follows.

c.1. The computer can be adapted to express the linear operator as acting on trigonometric functions in XY coordinates mode. This can be used to thereby create a signal that can be used in a known manner to create a sound or other output. For example, the waveform could be used to operate speakers 70, etc.

c.2. The computer can also be adapted to superpose various waves, such as waves generated as per c.1. above and to generate an output corresponding to the superposition of such different waves.

c.3. The computer can also be adapted to utilize the computer-generated wave forms from c.1 or c.2 within various known sound generator programs.

D. Optimizations and Other Applications

In addition to the forgoing applications of the super-formula for the synthesis of images, sounds, etc., the super-formula can also be used to specifically generate results and to display or use such results for a variety of applications.

In a first example, the super-formula can be used in various optimization determinations. In this regard, the super-formula can be used to calculate and optimize shapes, areas, sizes, etc., of various structures. For example, the super-formula could be used to calculate and optimize the configurations of products, such as for example of plastic pots for packaging of food products, etc. In that regard, the computer could be adapted to generate a display, a print-out, etc., to identify the results of such optimization—such as identifying acceptability determinations, % optimization, potential shapes, potential parameters, etc. Additionally, the super-formula could be applied directly in the manufacturing process of such optimized products.

In other examples, the computer could be adapted to calculate various other values or characteristics based on the super-formula. And, the computer could be adapted to display, print, etc., results of such other values or characteristics or to control another device or mechanism 60, etc., based on such results or characteristics.

(i) Industrial Examples

The following examples demonstrate the use of the super-formula to calculate compactness, e.g., the ratio of area/perimeter, in the construction of exemplary industrial products. In this manner, optimization of materials can be made in the development of products, such as containers, etc., such as, for example, packages for food or other contents (e.g., plastic containers, metal cans, etc.), other products having internal cavities, etc. Two, non-limiting, examples, described herein, include:

(a). Yogurt (and the like) packs: Yogurt, for example, is commonly sold in containers made with plastic cups and a removable top. The containers are often sold in multi-packs with plural containers—e.g., commonly in packs of six. The present invention can be used to create the cheapest shape (in terms of minimal material use and minimal area, and thus minimal volume of the containers proper).

(a). Engine (and the like) manufacture: In engines, for example, the super-formula can be used to decrease volume and weight (e.g., of the engine block) for a constant cylinder content and engine stiffness.

In geometry, the circle has been considered to be the simplest and most perfect shape. One commonly known principle is called the isoperimetric property which states that of all planar shapes with a given perimeter, the circle has the largest area. In technological applications, however, the question is slightly different. Engineers try to put a certain amount or volume of substance into a reservoir, while keeping the reservoir itself (e.g., its surface material) as small as possible. The question can be rephrased as follows: "what shape has the largest compactness, which is calculated by the division of internal volume over the total external surface material?"

This surface material is not only the surface that is in contact with the enclosed substance, but for instance multi-pack yogurt containers have multiple cups or cavities that are connected side-by-side. These connections also involve needed materials and also result in additional expenses. The present invention uses the super-formula to design new, optimized shapes for such pots or containers and the like.

(a) The Optimization of Packaging Materials (e.g., Yogurt Packs, etc.)

For the following example, we assume that the pots are stuck together by, for example, plastic at the top of the pots (e.g., as is typically done with common multi-pack yogurt containers described above). The following calculation determines which elementary super-shape (here, e.g., only with variables a=b=ground radius R, and exponent n) is cheapest for a given sectional area. This area determines the ground radius (=radius at an angle=0°) of the super-shape and also the volume of the pot. If, for example, a pot has a sectional area of about 2250 mm² (this is an actual example), the exponent of the super-shape is a variable that we are trying to determine, so we do not know our ground radius yet. For a span of exponents, we calculate the constant of area (which is determined by the exponent of the super-shape):

$$B(n) := \int_0^{\pi/2} \frac{1}{[(|\cos(\theta)|)^n + (|\sin(\theta)|)^n]^{2/n}} d\theta$$

For every exponent, we can now determine the ground radius rg(n). First, the area is calculated by:

$$A_n = 2 \cdot B_{1,n} \cdot r_g^2$$

with $$B_{1,n} = \frac{d\phi}{\left[\int_0^{\pi/2} \left(\sqrt[n]{|\cos^n\phi| + |\sin^n\phi|}\right)^2\right]}$$

Hence:

$$rg(n) := \sqrt{A/(2 \cdot B(n))}$$

As the shape-parameters a and b are equal, they both equal rg(n).

$$a(n) := rg(n)$$

$$b(n) := rg(n)$$

Now, the perimeter of the sectional area r(n) can be calculated by using the equation as set forth in FIG. 28.

In these examples, $m_1$ and $m_2$ (i.e., the rotational symmetry) are equal to 4. It should be understood that this can also be generalized for other rotational symmetries. Also, the absolute values have been removed, since integration is in the first quadrant from 0 to π/2. If we assume, for example, that the pots are 16 mm apart, this space has to be filled by the plastic connecting plate. Hence the total surface is calculated as:

$$ozijde(n) := r(n) \cdot 60$$

$$otot(n) := ozijde(n) + (2 \cdot (rg(n) + rand))$$

Where: ozijde(n)=area of the pot (=perimeter of the sectional area multiplied by a height of, for example, 60 mm); otot(n) =total area of plastic needed to produce the pots. FIG. 24 illustrates calculations based on the foregoing. After performing only two iterations (choosing several discrete ranges of exponents and each with higher accuracy), it was thus easily found that an exponent of about n=3.4 (and, more precisely at about n=3.427) provides an optimal shape for these yoghurt pots.

(b) The Optimization of Engines:

Another, very notable, industrial application of the use of super-shapes is in the construction of engine blocks. Because of the super-formula, pistons can be packaged keeping the same distance from side-to-side, while, lowering the distance from midpoint to midpoint. As a result, an engine can be made much more compact and its weight can be decreased drastically.

In one illustrative, and non-limiting, example, we start with a simple engine made with a rectangular block from which an engine cylinder is to be cut out. By using a cylinder having a super-shape (or a super-cylinder), the size of the rectangle (i.e., of the engine block) can be reduced, without losing its mechanical stiffness at the weakest places. Accordingly, a substantial amount of excess and useless material, e.g., metal, can be excluded, thus making engines more efficient. When calculating the volume of the engine block (=rectangle−cylinder) with the super-formula, significant results can be found. For example, as shown in FIG. 25, with a one-cylinder engine, in a rectangular block having a square cross-section which has a ground radius that is 2 mm wider than the ground radius of the super-shape, by using super-cylinders with n=2.5 in stead of 2, it is possible to save up to 24% in weight. Accordingly, the super-formula enables the use of methods to include circumstantial parameters into calculations in order to produce optimized shapes, etc. (Notably: one super-shape with a highest area/perimeter-ratio has an exponent of about n=4.393549, which can be proven by the calculations as shown above.)

E. Various Articles of Manufacture

As indicated above, according to one aspect of the invention, the super-formula can be utilized to provide an output to be used to control an external device such as a device used in the manufacture of products.

(a) In one exemplary embodiment, the present invention can be utilized to create toys similar to a "russian doll." For example, a cube can be provided that can be opened up (e.g., made of two half-shells) that has smaller super-spheres and/or sub-spheres formed therein of continuously decreasing size (e.g., each also being made of two half-shells that can be separated to reveal other super-shapes therein). Along these same lines, a mathematical tool can be created which comprises a plurality of forms (either in 2 or 3 dimensions) that can be used to teach students principles of the super-formula. For example, these forms could be a plurality of forms, such as similar to the shapes shown in for example FIGS. 1(C)-1 (N), etc. The forms could also be portions of these super-shapes, such as a bow-like form made to be like one half of the super-shape.

(b) In another embodiment, a teaching tool and/or amusement device can be provided having a plurality of super-shapes pictured or displayed together either: a) time-wise (e.g., on a movie screen, computer monitor, video monitor or television monitor, etc., wherein different super-shapes are displayed sequentially)(this could be done slowly to enable viewers to see and understand each shape in sequence or quickly to create a film-like sequence or flow between generally-instantaneously displayed shapes); or b) position-wise (e.g., on one or more pages of a book, or on one or more photographs, or on a film strip, or displayed side-by-side on a movie screen, monitor, television display, video display or the like). In these structures, the super-shapes can be arranged for example such that: a) the displayed super-shapes differ in a manner to demonstrate step-wise variations in parameters and hence in shapes created by the super-formula, such as shown for example in any of FIGS. 1(A)-1(T), or FIGS. 2(A)-2(I), or FIGS. 3(A)-3(F), or FIGS. 4(A)-4(I), or FIGS. 5(A)-5(I), or FIGS. 6(A)-6(I), or FIGS. 7(A)-7(G), or FIGS. 8(A)-8(F), or FIGS. 9(A)-9(G), etc.; or b) can be displayed or pictured together to demonstrate variations occurring from other variations in the parameters of the super-formula (such as shown in FIGS. 11(A)-11(E), etc.); or c) can be displayed or pictured together to demonstrate relationships between super-shapes (such as the relationship between that shown in FIGS. 11(A)-11(E) and in FIGS. 12(A)-12(E), etc.). Similarly, an article of manufacture can be made which displays variations in the super-formula in other coordinate systems and the like. Similarly, an article of manufacture can be made which displays or shows differing waveforms (e.g., sounds) created by similar variations in super-formula parameters. While these various articles of manufacture, including toys, books, film, etc., are preferably formulated with the assistance of computers, such is not necessarily required.

(c) In another embodiment, articles of manufacture can be created having one or more super-shapes printed, stitched, etched, machined, painted, or otherwise formed on or in a piece of stock material. For example, fabric materials or other textiles can be made to have super-shapes printed, stitched, etc., thereon (such as, as some examples, on clothing (e.g., T-shirts, sweaters, etc.), sheets, blankets, curtains, etc.). For example, a plurality of flower-like super-shapes can be made thereon. As another example, a painting can be made upon a canvas by a computerized process whereby one or more super-shapes are pictured thereon—the process preferably being guided by a computer controlling the operation of the process to illustrate such shapes. As another example, a piece of material such as wood, plastic, metal, ceramic, etc., can be machined, etc., so as to have one or more super-shapes depicted thereon—the process preferably being guided by a computer controlling the operation of the process to make such shapes in the piece of material.

(d) In another application, the present invention can be utilized in the manufacture of various globes, maps and the like. In this regard, an explanation is made regarding the terminology "metric." Commonly, people are accustomed to thinking in terms of well defined measures, such as for example 1 m and its millionth part, a μm. But, this is not the only way to look at distances.

As described herein, the super-formula can be used to model the circle into a variety of polygons and other shapes. Accordingly, as described above, the super-formula can be used as an operator onto functions. But, by reversing this line of reasoning, one can, in essence, say that all these shapes are circles. In this case, the super-formula or operator defines the "metric." For example, if we model a circle into a square, we see a transition from the circle to the circumscribed square. At 0°, the radius of the circle is exactly half the side of the square, but at 45°, the radius R enlarges to square root 2 time the radius. The radius is still the same, but now the radius is measured in other units, namely the unit given by the formula. In the present example, we are—in essence—looking to the square from a circle's point of view with constant distances in fixed measures. But, even if we look at the square from the square point of view, with its own metric it still is a circle.

For example, in FIG. 26, it is demonstrated how a circle at FIG. 26(A) correlates to a square at FIG. 26(B). If we know that the definition of a circle is the collection of points all lying at a fixed distance from a center, we can see how the square is a circle. By deduction, we can imagine that all super-shapes are in fact circles with a metric defined by the super-formula (in the illustration shown in FIGS. 26(A)-26 (B), this metric is the formula with RS m=4, and all n values=1).

Along these same lines, other "metrics" can be seen with the super-formula. For example, the apparent rotational symmetries that the operator introduces with a spiral leading to the square spiral can also be viewed as a true spiral but with the metrics of a square.

Now, if one does the above with a sphere (e.g., especially with a globe, etc.) and cube, the cube is still a sphere, but with different "metric." Thus, if we "inflate" a globe into a cube all countries and continents, etc., will deform, but because this can be done with the formula, we can know the metric at all points.

Thus, we can, e.g., use the super-formula to deform the globe into any other super-formula shapes—such as cubes, beams, pyramids, dodecahedrons, and a variety of other polyhedrons, etc., and with straight or inflated sides, rounded or straight corners, etc.

The globe or the like can be, for example: (1) a two dimensional representation of the three dimensional form (e.g., shown on a computer monitor, printed on paper (e.g., from small papers (e.g., 8"×11", etc., or even much smaller) to posters or the like (e.g., 2 feet×3 feet, etc., or even much larger)), printed on a textile material such as on a fabric material (e.g., such as on an article of clothing like a T-Shirt, etc.), or otherwise formed on another material, etc.) made with, for example, a computer and graphics programming; or (2) a three dimensional construction based on such calculations performed preferably by a computer to create modified globes or the like that can be manufactured as salable items.

In addition, with the present invention, the super-formula enables one to easily map the globes onto flat surfaces. This is, thus, the first time that a globe can be mapped onto paper, for example, with exact precision. The intrinsic curvature of a globe (non-Euclidean) can easily be transformed into a Euclidean space (now Euclidean and non-Euclidean geometry are mutually exclusive).

One exemplary educational or the like tool can be made as follows. In one embodiment, sensors can be built in the surface (e.g., not visibly, but under the surface) which are related to the metric. So, if one moves a sensitive probe (e.g., pen-like) over the super-shape globe or a cube, or pyramid between two locations (e.g., between Rome and Washington, D.C), one would measure the same distance on each rendition of the globe. Of course, the spacing between the sensors would be different on a sphere and cube. This can help people understand how to think in terms of super-shapes—i.e., that spheres and cubes, etc., are the same. These shapes may be categorized as generalized spheres.

Even further than the above, the super-formula also provides a link between metrics of the shape and measure (in the sense that sine and cosine, etc., are measures) which provides a very powerful tool for a variety of other applications as would be understood based on this disclosure.

Moreover, in computer environments such generalized globes can be rotated around fixed axes using rotation matrices. In addition, with the super-formula, it is also possible to apply the super-formula on the trigonometric functions in the rotation matrix so that, e.g., a globe can be rotated, e.g., "square."

In principle, the super-formula operator can be applied as a metric onto any geometric space (i.e., to introduce metrics into in any geometrical space), including Euclidean Space or any other geometric space, such as for example on the 4-D Minkowski Space used in relativity theory.

Moreover, it is noted that the Fitzgerald-Lorentz contraction formula may be achieved by the superformula wherein the cosine term is a constant and equal to c (i.e., the velocity of light), the sine term is equal to v (i.e., the velocity of a particle or object) and the exponents n are all equal to 2.

(e) Another exemplary device can include, for example, a novelty or educational item having: (1) a screen or monitor, (2) key(s) for inputting or changing a values of one or more of the parameters: m, 1/a, 1/b, $n_1$, $n_2$, $n_3$; and (3) a processor (e.g., computer) for generating a super-shape image (e.g., a two dimensional image of a 2 dimensional or 3 dimensional super-shape) based on the input values and generating an image on the screen or monitor. In one exemplary embodiment, the keys can include "up" and "down" arrow keys for varying the values of the respective parameters. That is, by pressing an up key, for example, for an $n_2$ parameter, for example, a user can change the super-shape incrementally (the increments can be selected as desired to ensure that the shape changes visibly within a desirable range). This embodiment can comprise a computer program that is run on a PC computer (e.g., supplied via a CD Rom) or can comprise a hand-held device that includes a small monitor for viewing, internal electronics and software and required keys. In one variation, the computer can be made to display a super-shape on the monitor or screen (e.g., at a top region of the screen) and a user can then be shown a simple circle (e.g., at a bottom end of the screen) which the user is to modify into the super-shape shown at the top of the screen (in other variations, the images can also be shown overlapping or the initial image can be shown separately from the image modified by the user). Once the user alters the parameter values such that the created image is similar to (e.g., or within a predetermined range) the initial shown, the computer can, if desired, also: (a) indicate that the task has been accomplished (alternatively, the user could decide if the created image is similar to the first image), (b) indicate a time or speed of such accomplishment, (c) give a rating of the efficiency of the operator's use of the up and down keys, etc. (Note: in essence, this modification could involve performing a simple image analysis of the initial image by isolating parameters of the initial image through variation of parameters via the user (see "analysis" section below)).

(f) It is contemplated that the super-formula can be used to create a variety of articles of manufacture (e.g., either having 2-D super-shapes thereon, being formed with cross-sectional shapes that are made as 2-D super-shapes, and/or having structure made as 3-D super-shapes, etc.). In addition to the foregoing examples, other articles of manufacture can include, for example; vases (e.g., for flowers, etc.); dishes; cups; containers; door knobs; furniture (e.g., leg designs, table surface shapes, ornamentation thereon, etc.); and any other appropriate articles of manufacture.

II. ANALYSIS

As discussed herein-above, according to a second aspect of the invention, the super-formula is utilized in the analysis of patterns, such as images and waves.

In this regard, it is very notable that the super-formula has at least 5 different mathematical modes-of-representation, as discussed above with reference to FIGS. 20-22. In addition, other modes of representation include other graphs in other co-ordinate systems. When parameters are selected within the super-formula, a specific equation commensurate with those selected values is created. However, this specific equation can be represented in any of these mathematical modes-of-representation. In a mathematical sense, there is an isomorphism between these different modes-of-representation—i.e., a one-to-one relationship.

Among other things, this facilitates comparisons between various forms and things—enabling them to be "equated" together by a single formula. For example, geometry typically is viewed as having nothing to do with electromagnetic waves; where everything is based on sines and cosines. The super-formula, however, enables one to represent both waves and geometric shapes using a single formula—e.g., shedding light on the principles of particle-wave duality. The only difference is in the mode of representation.

Among the various modes-of-representation, in some respects there is no specific preference. However, among other things, different modes can be readily utilized in the analysis of different types of "patterns."

For example, in the analysis of certain kinds of signals in chemistry, e.g., representable as waves with peaks, etc. (e.g., such as in chemical reactions which can be represented in XY coordinates with the Y axis as a trait or condition and the X axis as the time domain), the XY representation of the type shown in FIGS. 20(C), 21(C) and 22(C) becomes particularly useful for analysis. As another example, in the analysis of electromagnetic waves, the XY representation of the projection type shown in FIGS. 20(D), 21(D) and 22(D) (either sub-sines or super-sines) become particularly useful. As illustrated in FIGS. 20-22, in these examples, these XY graphs can be easily transformed isomorphically into polar coordinate graphs.

In general, although not limited thereto, shapes or waves can be "analyzed" by the application of the following basic steps (these steps have similarities to the foregoing steps in synthesis in reverse):

In a first step, a pattern can be scanned or input into a computer (e.g., in a digital form). For example, an image of an object may be scanned (2-D or 3-D), a microphone may receive sound waves, or electrical signals (e.g., waves) may be input, data from a computer readable medium such as, e.g., a CD-ROM, a diskette, etc., may be input, data may be received on-line, such as via the Internet or an Intranet, etc. Various other known input techniques could be used, such as, for example, using digital or other cameras (e.g., whether single picture or continuous real time, etc.), etc. FIG. 16 illustrates examples wherein an image scanner 100 (e.g., a document scanner utilized to scan images on stock material such as paper or photographs, or another scanner device) and/or a recorder 200 (e.g., which receives waveforms via a microphone or the like) are utilized in conjunction with the computer 10.

In a second step, the image is analyzed to determine parameter values, etc., of the super-formula. In this step, the analyzed signals could also be identified, categorized, compared, etc. In some computer analysis cases, the computer can include a library or catalogue (e.g., stored in a memory) of primitives (e.g., categorizing assorted supershapes by parameter values). In such latter cases, the computer can then be used to approximate, identify, classify and/or the like the supershapes based on the information in the library or catalogue. The catalogue of primitives could be used, for example, for the first approximation of patterns or shapes.

In a third optional step, the analyzed signals can be moderated as desired (e.g., operations can be performed similar to that described above with reference to the second general phase or step of synthesis).

In a fourth step, an output can be created. The output can include: (a) providing a visual (e.g., displayed or printed) or an audible (e.g., sound) output; (b) controlling the operation of a particular device (e.g., if certain conditions are determined); (c) providing an indication related to the analyzed pattern (e.g., identifying it, classifying it, identifying a preferred or optimal configuration, identifying a defect or abnormality, etc.); (d) creating another form of output or result as would be apparent to those in the art.

In the analysis, after the pattern is digitized, the computer proceeds using a certain type of representation. If it is a chemistry pattern, the XY graph should be selected. If it is a closed shape, a modified Fourier analysis should be selected. The computer should be adapted (e.g., via software) to provide an estimation of the right parameters for the equation to represent the digitized pattern.

Fourier analysis techniques are disclosed, as just some examples, in the following U.S. patent applications (titles in parentheses), the entire disclosures of which are incorporated herein by reference: U.S. Pat. No. 5,749,073 (System for automatically morphing audio information); U.S. Pat. No. 3,720,816 (Method for Fourier analysis of interference signals); U.S. Pat. No. 5,769,081 (Method for detecting cancerous tissue using optical spectroscopy and fourier analysis); U.S. Pat. No. 5,425,373 (Apparatus and method for analyzing and enhancing intercardiac signals); U.S. Pat. No. 5,109,862 (Method and apparatus for spectral analysis of electro-cardographic signals); U.S. Pat. No. 5,657,126 (Ellipsometer); U.S. Pat. No. 5,416,588 (Small modulation ellipsometry); U.S. Pat. No. 5,054,072 (Coding of acoustic waveform); U.S. Pat. No. 4,885,790 (Processing of acoustic waveforms); U.S. Pat. No. 4,937,868 (Speech analysis-synthesis system using sinusoidal waves).

The "modified" Fourier analysis that can be performed utilizing the present super-formula has a number of advantages. First, the present "modified" analysis is not based merely on a circle; it is much wider. For example, the first term in a Fourier analysis is a constant, giving the basic measure of the wave or object. Then, further terms are added afterwards which are each based on much smaller circles.

Figure 18A:
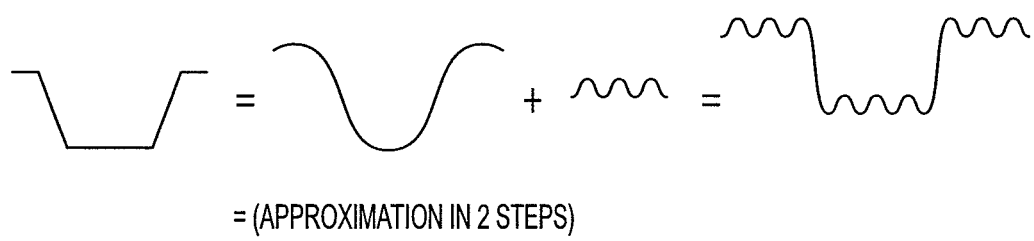
FIGS. 18(A)-18(B) schematically illustrate a Fourier analysis of a trapezoidal wave and a "modified" super-formula analysis of that same wave, respectively.
Figure 18B:
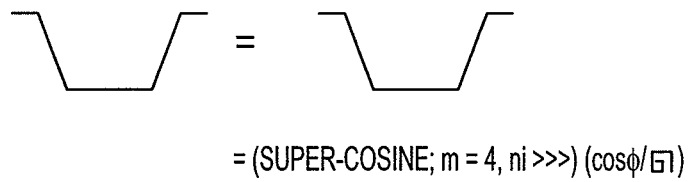

As an illustration, reference is made to FIGS. 18(A) and 18(B) schematically showing a Fourier analysis of a trapezoidal wave and a "modified" super-formula analysis of that same wave, respectively. As shown in FIG. 18(A), the Fourier analysis provides a rough approximation in 2 steps. With the present invention, since every term is sequentially moderated by the operator, it may be determined whether the basic form (or pattern) approximates a particular shape—e.g., a circle, a super-circle, etc. In this case, the operator may be found as follows:

$$\cos \phi / \boxed{\phantom{x}} \text{ (with } m=4; n_i \ggg \text{)}$$

(with $1 \leq n \leq \text{infinity}$)

Thus, as shown in FIG. 18(B), the present invention can converge much faster upon the trapezoid wave pattern.

Where more terms need to be added, there may be a best estimate in all of the terms. For example, when three terms are used, the moderation should be applied to every term, in combination to obtain a best estimate. Accordingly, the general formula for the extended Fourier analysis (or generalized) is as follows:

$$r = a_0 / \boxed{\phantom{x}} + \Sigma a_n (\cos m\phi) / \boxed{\phantom{x}} + \Sigma b_n (\sin m\phi) / \boxed{\phantom{x}}$$

This is a trial and error method, which the computer can be readily adapted to perform. Additional methods to transfer a Fourier series into a simplified one using the super-formula can be developed and utilized.

Notably, even "chemistry waves" and "electromagnetic waves" and other "waveforms" can be analyzed using the extended Fourier analysis and can also be converted into the corresponding super-shape.

A few exemplary embodiments demonstrating application of the super-formula in pattern analysis are described below.

A. An Illustrative Example of Image Analysis

One simple illustration of analysis utilizing the super-formula is related to certain basic embodiments of synthesis. Specifically, in synthesis, polygons can be used as "primitives" (as noted, the super-formula enables the creation of an infinite number of primitives, vastly improving upon the existing drawing programs). As noted above, in one embodiment, a super-shape can be shown on a monitor and the super-shape (e.g., here a "primitive") could be grabbed with a pointer, e.g., via a mouse or the like, so that, for example, one can "grab" one of the sides and drag it outwards or push it inwards. Because of the super-formula, the shape will change symmetrically. Then, the same "dragging" operation can be done with the corners of the displayed super-shape so as to make it, e.g., sharper or more rounded.

When the user performs the above operation, the computer can automatically calculate new parameters (e.g., new exponents $n_i$) of the new shape, and can even calculate new areas, perimeters, etc., of the new shape.

For an exemplary "analysis", a simple shape (e.g., such as a triangular shape) or a simple object such as a container (e.g., a yogurt pot bought in the store see embodiments described herein regarding optimizations thereof) can be scanned into a computer (e.g., a photograph thereof can be scanned in if needed—many scanning devices are known in the art). Then, a user can manually choose one of the primitives (e.g., triangle, square, etc.) and can overlay this primitive on a displayed image of the scanned-in shape on a computer monitor or screen. Then, the user can perform the "dragging" operations described above—namely, dragging the sides of the super-shape with, e.g., a mouse or the like over the scanned shape, until the sides of the primitive sufficiently match that of the scanned shape (e.g., outline of an object, etc.). As noted, the same operation can be done with the corners of the shape, so that a precise set of parameters can be determined for the scanned shape.

As noted, the area, perimeter or any associated characteristic can be readily calculated as described herein. In one exemplary embodiment, a multiple number of items of a certain type (e.g., a particular plant or other natural formation, etc.) can be scanned into a computer (e.g., cross-sections of a particular plant type can be scanned into the computer) and for each item, the values of the parameters (e.g., $n_i$, etc.) can be determined. Then, a median value or the like can be determined for the parameters of that particular item (as well as a range of values, a standard deviation of such values, etc.). Accordingly, based on such values obtained, classifications can be made whereby certain items are classified based on their values of the parameters (e.g., $n_i$, etc.). In this manner, future items can be classified based on a determination (via analysis) of the respective parameters. For instance, if certain plants have differing parameters based on environmental conditions (e.g., location of growth, nutrition, etc.) or the like, evaluation of parameters of a select plant can aid in determining the environmental conditions or the like of that plant according to such pre-classifications.

While in above examples, the analysis included a manual component, this could be improved, for example, by: (a) having the computer perform this analysis automatically (e.g., the computer can, among other things, increase precision); (b) for irregular curves or shapes super-shape approximation can be combined with other existing techniques like Bezier curves, wavelets, etc., that are known in the art (note: in the first approximation super-shapes are very efficient thereby economizing on computing power and memory); (c) using other techniques known in the art.

B. The Analysis of Basic Natural Patterns: Using a Moderated Fourier Analysis

Basic patterns can be analyzed utilizing the following exemplary steps.

In a first step, the general outline of and object can be scanned and digitized. For example, as shown in FIG. 19(A), the basic outline of a bird can be scanned.

In a second step, a modified Fourier analysis can be performed. As shown schematically in FIG. 19(A), first, second and third terms can be generated generally as shown. The first term may be represented by $\boxed{\phantom{0}}$ =1 and the second and third terms can be moderated. It is contemplated, as should be understood by those in the art based on this disclosure, that as with moderated or extended Fourier analysis, the super-formula can also be used as an operator to moderate wavelet families, spline functions, Bezier curves, etc.

In a third step, a derivation of a general formula can be performed.

FIG. 19(B) shows a formula that can be used to recreate or analyze the basic natural pattern in this exemplary illustrative case.

C. Direct Shape Analysis (2D or 3D): Object Recognition

In this application, objects (e.g., simple items such as sea stars, squares, polygons, either with bent or straight sides, etc.) can be scanned. The computer can then digitize these scanned shapes directly into a super-formula equation.

Among other advantages, for any form, the computer does not need to know about the coordinates, but only about the formula. Among other things, this can enable a significant savings in computer memory.

The computer can be adapted to have the respective super-formula equations (i.e., the respective parameters) and categorizations thereof stored as data within a memory in the computer. Accordingly, based on the stored data, a new object may be scanned and analyzed, and the results of analysis can be compared to the stored values. The computer can thus conclude what the categorization of the new object is. The computer can print these results, accumulate data regarding such results, make comparisons or other evaluations, control another device based on such results (e.g., controlling an external device 60—such as controlling a robot arm to position over particular objects, controlling a camera to photograph polygonal objects, etc.), etc.

D. Direct Shape Analysis (2D or 3D): Reverse Engineering

In this application, parts can be scanned and digitized in a computer (e.g., broken parts, etc.). Then, the image can be analyzed as discussed above. The result can be generalized in a general equation with parameters. Thereafter, the part can be reconstructed based on that generalization.

E. Moderated Fourier Analysis (or Generalized) on Waves: Sound Analysis

In this application, a sound can be recorded via any known recording means (e.g., recorder 200). Instead of analyzing the wave under classical Fourier analysis, a moderated Fourier analysis according to the invention can be performed.

In this regard, many sounds may be more like super-sounds or sub-sounds, as opposed to circular wave sounds of mathematical physics. Potentially, various components of sound (e.g., quality, tone, pitch, loudness, etc.) may be more readily distinguished using such a super-formula analysis.

With this moderated Fourier analysis, novel algorithms for fast transforms can be developed. Moreover, for example, the super-formula can also be used as an operator on wavelet families for wavelet transform.

F. Use in Known Pattern Recognition Applications

As should be apparent based on this disclosure, the present invention can be applied in any known application of pattern recognition.

For example, the present invention can be utilized in "machine vision" systems, wherein for example an image is captured via a camera and analyzed to produce descriptions of what is imaged. A typical application of a machine vision system is in the manufacturing industry, such as for automated visual inspection or for automation in an assembly line. In one example, in inspection, manufactured objects on a moving conveyor may pass an inspection station (having a camera), and the invention can be used to identify a defect or other quality of the objects. In that case, the analysis is to be conducted "on line" and speed and accuracy is important. After such detection, an action can be taken, such as to identify, mark, approve, reject, retain, discharge, etc., the particular object. In an assembly line, different objects are located and "recognized" (i.e., having been classified in one of a number of classes a priori). Then, a robot arm can place the recognized objects in a correct place or position.

As another example, the present invention can be used in "character recognition" systems (such as used in identifying letters, numbers, etc.), wherein a front end device including a light source, a scan lens, a document transport device and a detector is provided. At the output of the light-sensitive detector, light intensity variation can be translated into data, e.g., and an image array can be formed. Then, a computer is used to apply a series of image processing techniques for line and character segmentation. Pattern recognition software in the computer then classifies the characters. Some exemplary applications include: recognition of handwriting; on-line mail sorting machines; machine reading of bank checks; pen-input computers (wherein input is via handwriting); etc.

Another exemplary application of the present invention is in "computer-aided diagnosis" systems, wherein pattern recognition is used to assist doctors in making diagnostic decisions, such as applied to analyzing a variety of medical data, such as: X-rays; computed tomographic images; ultrasound images; electrocardiograms; electro-encephalograms; etc.

Another exemplary application of the present invention is in "speech" or other sound recognition systems, wherein, for example, data is entered into a computer via a microphone, software recognizes spoken text and translates it into ASCII characters or the like, which can be shown on a computer monitor and which can be stored in memory. Speech recognition can also be used to remotely: control the computer itself or to control other machines via the computer remotely.

The present invention can also be applied in a variety of other known applications, such as for example: fingerprint identification; signature authentication; text retrieval; face and gesture recognition; etc.

G. Data Transmission and Compression

When data is input into a computer (e.g., in analysis, synthesis, etc.), the data can be stored on data storing devices such as, e.g., hard discs, CD-ROMs, DVDs, diskettes, etc., or when on-line, e.g., over the Internet or the like, the data can be transferred to other computers or machines via data transmission methods, such as, as some examples, via cable, satellite, radio or other transmission.

The super-formula can be advantageously used to efficiently store data within a computer. For example, if the super-formula is used in a simple drawing program, a virtually unlimited number of shapes can be made and adapted by the user without the need of significant additional memory. Additionally, in CAD, for example, or other vector based graphics programs, many elements can now be stored with less memory.

In addition, the use of moderated Fourier analysis and transform, the use of wavelets, etc., can lead to a considerable savings of memory due to the compression of data and consequently a more efficient and economical use of data transmission. This is beneficial in a variety of applications, such as, for example, in CAD/CAM applications, transmission of digitized audio and video signals, waveform compression, and parametric encoding using orthogonal transform techniques such as Fourier transform.

It is also noted that the present invention could involve compression techniques similar to that described in U.S. Pat. No. 4,941,193, the entire disclosure of which is also incorporated herein by reference. As noted in the '193 patent, in the present state of the art in computer graphics, there are many problems in representing real-world images in forms for computer based storage, transmission or communications, and analysis. Efficient compression schemes can result in more effective means for storing data in a computer's memory, for transmitting photographs over telephone lines, for recognizing specific objects, etc., such as landscapes, etc., and for simulating natural scenery on a computer and more.

III. CONCLUSION

As described herein-above, the novel super-formula used in the various embodiments of the present invention—via simple modifications of exponents and rotational symmetries—can, among other things, yield a whole universe of shapes and waveforms, many of which may be found in nature or are commonplace realizations.

Long ago, in the first half of the 19$^{th}$ century, Gabriel Lame generalized the equation for a circle in Cartesian co-ordinates to include any positive real value for the exponent n, thus showing that the circle and the square, as well as the ellipse and the rectangle, could be described by a single formula.

Prior to the present invention, however, the super-formula had not been uncovered nor the hidden world that is capable of being described, synthesized and/or analyzed by this super-formula. A circle is only one of an infinite number of shapes that can be described by the super-formula. The general definition coined herein of "super-shapes" or "super-spirals" can help people to visualize and understand the mathematical simplicity of many natural, abstract and man-made forms and shapes. Accordingly, the super-formula can be used in one sense as a tool to describe and demonstrate relationships between various shapes and to demonstrate theories of development in nature as described herein-above. The super-formula enables one to describe for example: (a) various polygons, with rounded or sharpened angles or with sides bent inwards or outwards; (b) circles, which turn out to be zero-gons; (c) mono-gons and diagons; etc.

For all shapes and forms which can be described by this formula, parameters such as surface area, or optimal use or coverage of area, as well as moments of inertia, can easily be calculated by integration of the formula. Moreover, using R in the nominator as $R_{max}$, the function becomes an inside-outside function of $0<R<R_{max}$, and not only the perimeter, but all points within the shape are defined by this function.

Many shapes observed in nature (such as in lower and higher plants, including stems, leaves and fruits, as well as cells and tissues) turn out to be specific realizations of the super-formula that can be described, synthesized and/or analyzed with the super-formula. The super-formula can be used to demonstrate that many types of seastars, shells and spider webs follow the same mathematical route to existence. In addition, the super-formula can be used to demonstrate how paraffin crystals grow around a screw dislocation in a square form of a spiral. In addition, many other examples of realizations of the super-formula can be found in crystallography.

The super-formula has great usefulness, for example: (a) as a teaching tool in reference to such shapes; (b) as a means for synthesizing images, products, objects, etc., of these shapes; (c) as a means for analyzing or detecting such shapes, objects, etc.; (d) as a means for evaluating how such shapes, etc., develop, grow, etc., and the reasons for their development; and (e) in many more applications. The super-formula can also advantageously demonstrate how symmetry, one of the prevailing strategies in nature, can be expressed in a single formula.

One of the major characteristics of this class of geometrical shapes is the possible adaptive moderation of shape during development, as observed for example in leaves of *Sagittaria* (see, e.g., FIGS. 29(A)-29(D) showing exemplary leaves capable of being synthesized and/or analyzed with the super-formula) and *Cercis*.

The fact that so many different shapes, etc., are connected together via the super-formula is a substantial step forward in abstract geometry.

Many human-made shapes also follow the same rules as natural objects: the super-circular shape of Semitic clay tablets, the Egyptian pyramids, square spirals in the Maya culture, Tudor flowers in the Victorian era, the super-elliptical Olympic Stadium of Mexico City, circular and super-circular bottles in everyday life, are but a few examples. Seemingly, man has abstracted nature in much of his architecture and design, possibly through some a priori knowledge of the super-formula. The super-formula can thus help identify and be used as a tool to identify how man perceives or has perceived the world, and it helps shed some light on our understanding of natural and cultural (i.e., man-made) objects.

While the invention has been described in detail above, the invention is not intended to be limited to the specific embodiments as described. Those skilled in the art may now make numerous uses and modifications of and departures from the specific embodiments described herein without departing from the inventive concepts. Notably, those skilled in the art should recognize that a variety of representations of the super-formula can be made without departing from the scope of the present invention. For example, as noted herein-above, the super-formula can be represented in a variety of ways and forms.

Figure 30:
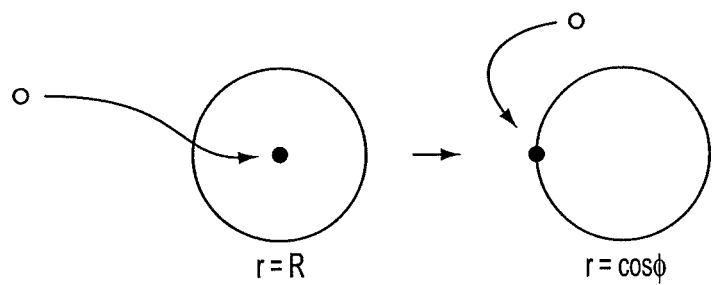
FIG. 30 is a schematic diagram showing one exemplary representation of the super-formula in a mode with the point of origin moved away from the center of the coordinate system.
Figure 31:
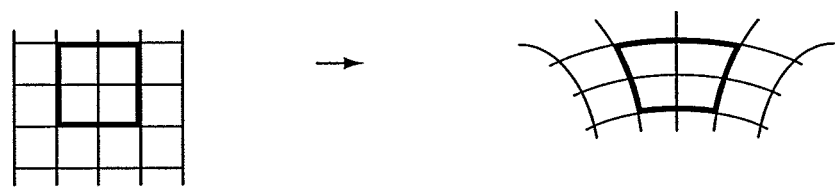
FIG. 31 is a schematic diagram showing one exemplary representation of the super-formula in a mode using non-orthogonal lattices.

For example, various representations of the super-formula described herein-above (such as shown in FIGS. 1-15) have involved symmetric figures where the point of origin is the same as the central point of the coordinate system, while it should be recognized that the point of origin O can be moved away from the central point of the coordinate system—such as, in one example, from r=R to r=cos φ as schematically shown in FIG. 30. In addition, these points or lines through these points can serve as a basis for rotation, such as in 3-Dimensional toroids, in which a circle is rotated around a line outside of the circle. In addition, various representations of the super-formula described herein-above (such as shown in FIGS. 1-15) have involved shapes made in orthogonal lattices, while it should be recognized based on this disclosure that the shapes can also be made in non-orthogonal lattices, such as by simple lattice transformation. In this regard, FIG. 31 schematically shows an exemplary transformation from an orthogonal lattice at the left to a non-orthogonal lattice at the right. The use of such transformation to various non-orthogonal lattices is useful for example in animation (e.g., computer animation) for modeling moving elements—such as, for example, modeling cartoon characters through apparent movement. Additionally, transformation to various non-orthogonal lattices can also be used for educational purposes, such as to illustrate smoothly in real time variation from various lattices (e.g., similar to that which would be done for animation purposes) or to show discrete changes.

In addition, other representations of the formula can also include providing the parameters 1/a and/or 1/b in the super-formula equation with separate exponents—such as, for example exponents $n_4$ and $n_5$, respectively, as shown below:

$$r = \frac{1}{\sqrt[n_1]{\left|\frac{1}{a}\right|^{n_4} \cdot \left|\cos\frac{m_1 \cdot \phi}{4}\right|^{n_2} + \left|\frac{1}{b}\right|^{n_5} \cdot \left|\sin\frac{m_2 \cdot \phi}{4}\right|^{n_3}}}$$

In addition to the foregoing, the representations of the super-formula can also include any other known modifications and/or alterations of the super-patterns that are formed. For instance, any of the modifications described in U.S. Pat. No. 5,467,443, the disclosure of which is incorporated herein by reference, can also be utilized as desired, for blending shapes, colors and other graphical attributes (e.g., changing shape, changing color, blurring lines, varying line width, etc). In addition, other methods for changing synthesized patterns can be employed, such as local deformations of portions of the generated shapes.

Moreover, representations of the superformula also include any mathematically or geometrically substantially equivalent formulas to that specifically described herein.

As detailed herein-above, in some exemplary embodiments of pattern synthesis, super-formula patterns can be produced (e.g., displayed) and the super-formula pattern can be modified and re-produced in a manner to provide "sequencing" for various purposes as discussed herein-above. As one example, the super-formula can be displayed as a 2-D shape that is modified to transform (i.e., via sequencing) from one super-shape to another. For instance, this transformation could be performed by incrementally increasing one or more of the parameters and redisplaying the new super-shape sequentially. In this regard, in some preferred embodiments, the incrementation in parameter values is preferably such that to an ordinary human observer, the super-shape appears to continually grow or change in real time rather than to grow or change in a step-wise fashion. Of course, in various embodiments step-wise or other changes can be employed if desired.

As detailed herein-above, the super-formula can, thus, be very highly advantageously applied in synthesis, analysis and other applications in two, three and/or more dimensions and in a variety of representations and applications.

What is claimed is:

1. A method of creating an industrial product having an optimal shape, comprising:
   programming a computer with a representation of the following polar coordinate formula $$r = \frac{1}{\sqrt[n_1]{\left|\frac{1}{a} \cdot \cos\frac{m_1 \cdot \Phi}{4}\right|^{n_2} + \left|\frac{1}{b} \cdot \sin\frac{m_2 \cdot \Phi}{4}\right|^{n_3}}}$$

where r is a radius value at an angle Φ, where parameters a, b, $n_1$, $n_2$, $n_3$, $m_1$ and $m_2$ are non-unitary finite real numbers, where $n_1$, a, and b≠0, where $m_1$ and $m_2$ are natural numbers and $n_1 \neq n_2$ or $n_1 \neq n_3$;
   establishing an optimal shape of the industrial product including selecting values for the parameters a, b, $n_1$, $n_2$, $n_3$, $m_1$ and $m_2$;
   generating a pattern via the computer based on the selected values input into said formula;
   transforming said generated pattern into a physical form by controlling a manufacturing of said industrial product;
   wherein said industrial product is made with plastic or metal and said generated pattern is employed to optimize the shape of said industrial product by forming at least a portion of said industrial product so as to have said optimal shape.

2. The method of claim 1, wherein said industrial product is a container or another product having an internal cavity.

3. The method of claim 1, wherein said physical form is configured based on a 2- or 3-dimensional representation of said generated pattern.

4. The method of claim 1, wherein said physical form is adapted based on a 3-dimensional representation of said generated pattern and said industrial product is configured to have an optimal shape in 3-dimensions based on said generated pattern.

5. The method of claim 1, wherein the parameters $n_1$, $n_2$, $n_3$, $m_1$ and $m_2$ are variable, and wherein the values of a and b are non-variable constants, wherein the values of $m_1$ and $m_2$ are the same and are selected together.

6. The method of claim 1, wherein said selection is performed via or by said computer.

7. The method of claim 1, wherein said controlling a manufacturing of said industrial product includes performing computer aided manufacturing, stereolithography or rapid prototyping.

8. The method of claim 1, wherein said controlling a manufacturing of said industrial product includes performing computer aided manufacturing.

9. An industrial product having an optimal shape made by a process comprising:

programming a computer with a representation of the following polar coordinate formula $$r = \frac{1}{\sqrt[n_1]{\left|\frac{1}{a} \cdot \cos\frac{m_1 \cdot \Phi}{4}\right|^{n_2} + \left|\frac{1}{b} \cdot \sin\frac{m_2 \cdot \Phi}{4}\right|^{n_3}}}$$

where r is a radius value at an angle $\Phi$, where parameters a, b, $n_1$, $n_2$, $n_3$, $m_1$, and $m_2$ are non-unitary finite real numbers, where $n_1$, a, and b$\neq$0, where $m_1$ and $m_2$ are natural numbers and $n_1 \neq n_2$ or $n_1 \neq n_3$;

establishing an optimal shape of the industrial product including selecting values for the parameters a, b, $n_1$, $n_2$, $n_3$, $m_1$, and $m_2$;

generating a pattern via the computer based on the selected values input into said formula;

transforming said generated pattern into a physical form by controlling a manufacturing of said industrial product;

wherein said industrial product is made with plastic, metal, ceramic or wood, and said generated pattern is employed to optimize the shape of said industrial product by forming at least a portion of said industrial product so as to have said optimal shape.

10. The industrial product having an optimal shape made by a process of claim 9, wherein said industrial product is a container or another product having an internal cavity.

11. The industrial product having an optimal shape made by a process of claim 9, wherein said physical form is configured based on a 3-dimensional representation of said generated pattern and said industrial product is configured to have an optimal shape in 3-dimensions based on said generated pattern.

12. The industrial product having an optimal shape made by a process of claim 9, wherein the parameters $n_1$, $n_2$, $n_3$, $m_1$, and $m_2$ are variable, and wherein the values of a and b are non-variable constants, wherein the values of $m_1$ and $m_2$ are the same and are selected together.

13. The industrial product having an optimal shape made by a process of claim 9, wherein said controlling a manufacturing of said industrial product includes performing computer aided manufacturing, stereolithography or rapid prototyping.

14. The industrial product having an optimal shape made by a process of claim 9, wherein said controlling a manufacturing of said industrial product includes performing computer aided manufacturing.

15. A method of creating an industrial product having an optimal shape, comprising:

programming a computer with a representation of the following polar coordinate formula $$r = \frac{1}{\sqrt[n_1]{\left|\frac{1}{a} \cdot \cos\frac{m_1 \cdot \Phi}{4}\right|^{n_2} + \left|\frac{1}{b} \cdot \sin\frac{m_2 \cdot \Phi}{4}\right|^{n_3}}}$$

where r is a radius value at an angle $\Phi$, where parameters a, b, $n_1$, $n_2$, $n_3$, $m_1$, and $m_2$ are non-unitary finite real numbers, where $n_1$, a, and b$\neq$0, where $m_1$ and $m_2$ are natural numbers and $n_1 \neq n_2$ or $n_1 \neq n_3$;

establishing an optimal shape of the industrial product including selecting values for the parameters a, b, $n_1$, $n_2$, $n_3$, $m_1$, and $m_2$;

generating a pattern via the computer based on the selected values input into said formula;

transforming said generated pattern into a physical form by controlling a manufacturing of said industrial product;

wherein said industrial product is made with ceramic or wood and said generated pattern is employed to optimize the shape of said industrial product by forming at least a portion of said industrial product so as to have said optimal shape.

16. The method of claim 15, wherein said industrial product is a container or another product having an internal cavity.

17. The method of claim 15, wherein said physical form is configured based on a 3-dimensional representation of said generated pattern and said industrial product is configured to have an optimal shape in 3-dimensions based on said generated pattern.

18. The method of claim 15, wherein the parameters $n_1$, $n_2$, $n_3$, $m_1$, and $m_2$ are variable, and wherein the values of a and b are non-variable constants, wherein the values of $m_1$ and $m_2$ are the same and are selected together.

19. The method of claim 15, wherein said controlling a manufacturing of said industrial product includes performing computer aided manufacturing, stereolithography or rapid prototyping.

20. The method of claim 15, wherein said controlling a manufacturing of said industrial product includes performing computer aided manufacturing.

* * * * *